(12) United States Patent
Usami

(10) Patent No.: US 7,626,913 B2
(45) Date of Patent: Dec. 1, 2009

(54) OPTICAL INFORMATION RECORDING METHOD, OPTICAL INFORMATION RECORDING APPARATUS AND OPTICAL INFORMATION RECORDING MEDIUM

(75) Inventor: Yoshihisa Usami, Shizuoka (JP)

(73) Assignee: Fuji Photo Film Co., Ltd., Minami-Ashigara-shi (JP)

( * ) Notice: Subject to any disclaimer, the term of this patent is extended or adjusted under 35 U.S.C. 154(b) by 809 days.

(21) Appl. No.: 11/390,463

(22) Filed: Mar. 28, 2006

(65) Prior Publication Data
US 2006/0233087 A1 Oct. 19, 2006

(30) Foreign Application Priority Data
Mar. 31, 2005 (JP) .............................. 2005-103864

(51) Int. Cl.
G12B 7/00 (2006.01)
(52) U.S. Cl. ..................................... 369/103
(58) Field of Classification Search ........................ None
See application file for complete search history.

(56) References Cited

U.S. PATENT DOCUMENTS

| | | | | |
|---|---|---|---|---|
| 5,528,390 | A | 6/1996 | Goto et al. | 359/12 |
| 6,023,352 | A | 2/2000 | Haskal | 359/3 |
| 7,551,538 | B2 * | 6/2009 | Hori et al. | 369/103 |
| 2003/0073007 | A1 | 4/2003 | Lahrichi | 430/1 |
| 2005/0174917 | A1 * | 8/2005 | Matsumoto et al. | 369/103 |

FOREIGN PATENT DOCUMENTS

EP 1 065 658 A8 1/2001
JP 05-234855 9/1993
WO WO 2005/059902 A2 6/2005

OTHER PUBLICATIONS

European Search Report dated Feb. 2, 2009.
The article "Holographic media-Ready for launch, achieved 200Gbytes in 2006;" Nikkei Electronics; pp. 105-110, dated Jan. 17, 2005; abstract translation and explanation of figures. (Discussed in the Specification).

* cited by examiner

Primary Examiner—Joseph H Feild
Assistant Examiner—Tawfik Goma
(74) Attorney, Agent, or Firm—Kratz, Quintos & Hanson, LLP

(57) ABSTRACT

To provide an excellent optical information recording method, optical information recording medium and optical information recording apparatus both of which use the method. The method generates no excessively-exposed region, can sufficiently fix recorded information, and never reduce the sensitivity of non-recorded regions. This is achieved because the method applies a fixing beam onto at least a portion of an exposed region of a recording layer of the optical information recording medium, the recording layer recording information by holography, at an exposure level T (mJ/cm$^2$) that satisfies the condition H<(S+T)<2H (where S is an integrated exposure level (mJ/cm$^2$), which is the total of the exposure level in each predetermined region that constitutes the exposed region where an interference image has been recorded by irradiating the recording layer with an information beam and a reference beam, and H is a minimum fixing exposure level (mJ/cm$^2$) required to fix the interference image).

17 Claims, 23 Drawing Sheets

Record holograms while slightly shifting the recording position

OPTICAL INFORMATION RECORDING METHOD, OPTICAL INFORMATION RECORDING APPARATUS AND OPTICAL INFORMATION RECORDING MEDIUM

BACKGROUND OF THE INVENTION

1. Field of the Invention

The present invention relates to an optical information recording method for recording information by holography, an optical information recording apparatus and an optical information recording medium which use the recording method. More specifically, the present invention relates to an optical information recording method which can efficiently record and fix information on recording material at a minimum exposure level over a short amount of time and which can impart excellent life to the recorded information, and to an optical information recording apparatus and optical information recording media which use the optical information recording method.

2. Description of the Related Art

An optical information recording method for recording information on an optical recording medium by holography generally utilizes optical interference inside the optical information recording medium between a reference beam and an information beam (object beam) with image information to thereby produce an interference image (interference fringes) that can be recorded on the optical information recording medium. An example of this kind of optical information recording method is a reflective optical information recording method shown in FIG. 7. With this method, information is recorded in the following procedure: The light from a first light source 61 is split into two beams, one forming an information beam 51 that passed through a half mirror 64, and one forming a reference beam 52 reflected by the half mirror 64. The information beam 51 is expanded through a mirror 66 and a beam expander 68, and is shined on the recording layer of the optical information recording medium 50. The reference beam 52 is expanded through a mirror 65 and a beam expander 67, and is shined on the opposite side of the recording layer. In this way the information beam 51 and reference beam 52 create an interference image, which is recorded on the recording layer as optical information. Even when the reference beam 52 is applied in the same direction as the information beam 51, an interference image is also created for recording, as in a case where the reference beam 52 is applied in a different direction. A technology in which the information beam 51 and reference beam 52 are applied in such a way that the optical axis of the information beam 51 is collinear with that of the reference beam 52 is called the "collinear technology." An interference image is also created in this scheme, too. Reproduction of the recorded optical information is performed by applying another reference beam to the optical information recording medium from the direction for recording. In this way diffracted rays are created from the interference image and the optical information is reproduced by collecting them.

As a method for increasing the storage capacity of optical information recording media, there is proposed a multiplexing recording method for increasing the density of the interference images recorded. More specifically, the shift-multiplexing recording, angle-multiplexing recording, wavelength-multiplexing recording, and phase-multiplexing recording are utilized.

Among these recording methods, the shift-multiplexing recording has high compatibility with conventional CD and DVD recording methods where information is recorded on a spinning disc, and offers high random access performance. This is because in this recording method additional information, or interference image, is placed one after another on the initial recorded information (the initial interference image) while slightly moving either a beam spot or an optical information recording medium along the surface of the recording layer in a relative manner. For this reason, the shift-multiplexing recording is adopted for the collinear technology that uses a single lens for recording (see Nikkei Electronics (p 105-114) issued Jan. 17, 2005).

The shift-multiplexing recording method records new information on the previously recorded information; thus the greater the number of multiplexed interference images, so too does the exposure level for recording of another new interference image (information). For example, when a photopolymer recording material is used, the first interference image can be recorded at low energy. However, subsequent continuous exposure operations leads to a larger reacted (exposed) region to reduce the sensitivity of the recording material, resulting in high-irradiation energy to achieve as excellent recording quality as the first one.

This is because the reacted region inhibits the reaction of non-reacted (non-exposed) with beams, and/or because the amounts of photosensitive compositions (e.g., photopolymers) in the non-reacted region are reduced.

Since the exposed region with less number of recorded interference images requires less exposure level for recording of another new interference image in such a multiplexing recording method, reactions in the photosensitive compositions of such an exposed region have not proceeded fully and thus they need a fixing operation to complete such reactions. For this, for example, the following fixing method is proposed: After all recording operations are completed, the entire surface of an optical information recording medium is irradiated with a fixing beam to fix the recorded information (see Japanese Patent Application Laid-Open JP-A) No. 05-234855).

With this fixing method, however, the entire surface of an optical information recording medium is irradiated with a beam to cause reactions to take place even in a non-exposed region, making it impossible to record additional information on the non-exposed region. In addition, although fully-exposed recording region requires no fixing operations, they may be undesirably irradiated with the beam, leading to inefficient recording due to this excess irradiation.

Accordingly, so far there has not been provided any optical information recording method, optical information recording apparatus and optical information recording medium, which, upon exposure and fixing operations with the shift-multiplexing recording method, generate no excessively-exposed region, can efficiently fix the recording regions, and never adversely affect non-recorded regions.

SUMMARY OF THE INVENTION

It is an object of the present invention to provide an optical information recording method which generates no excessively-exposed regions, can sufficiently fix recorded information, and never reduce the sensitivity of non-recorded regions, by applying a fixing beam at an exposure level corresponding to that of a recording beam in the shift-multiplexing recording, and an optical information recording apparatus and optical information recording medium which use the optical information recording method.

Thus, the optical information recording method of the present invention is a method for recording optical information on an optical information recording medium having a recording layer recording information by holography, the method including: applying a fixing beam onto at least a portion of an exposed region of a recording layer of the optical information recording medium, the recording layer recording information by holography, at an exposure level T (mJ/cm$^2$) that satisfies the condition H<(S+T)<2H (where S is an integrated exposure level (mJ/cm$^2$), which is the total of the exposure level in each predetermined region that constitutes the exposed region where an interference image has been recorded by irradiating the recording layer with an information beam and a reference beam, and H is a minimum fixing exposure level (mJ/cm$^2$) required to fix the interference image).

DESCRIPTION OF THE PREFERRED EMBODIMENTS (Optical Information Recording Method)

The optical information recording method of the present invention is used for an optical information recording medium having a recording layer recording information by holography.

In this method a fixing beam is applied onto an exposed region at a fixing exposure level T (mJ/cm$^2$) that satisfies the condition H<(S+T)<2H (where H is a minimum fixing exposure level (mJ/cm$^2$) required to fix an interference image recorded on a predetermined region of the recording layer, and S is the integrated exposure level (mJ/cm$^2$), which is the total of the exposure level for the exposed region in the predetermined region)

Note in the present invention that the term "optical information recording method" and equivalent expressions means a method which comprises: applying an information beam and reference beam onto the recording layer to thereby record interference images—optical information—on the recording layer; and applying a fixing beam onto at least a portion of an exposed region of the recording layer where information has been recorded, to thereby fix the predetermined region.

As the "part" of the exposed region to be irradiated with a fixing beam, the "first recorded portion" and "last recorded portion" of the exposed region (except for a non-exposed region) of the recording layer having interference images can be cited. Upon shift-multiplexing exposure, the middle portion of the exposed region (i.e., portions other than the "first recorded portion" and "last recorded" of the exposed region) are exposed to beams at high levels and thus monomers in that portion can readily undergo a polymerization reaction. By contrast, monomers in the "first recorded portion" and "last recorded portion" of the exposed region need to be sufficiently irradiated with a fixing beam to cause a polymerization reaction, because the degree of multiplexity in such portions is small compared to that in the middle portion and thus the exposure level is low.

The optical information recording method is not particularly limited as long as it is the shift-multiplexing recording method, and can be appropriately selected depending on the intended purpose; for example, either a transmissive hologram or a reflective hologram may be used. In addition, any holographic recording method can be used; any of an amplitude hologram, phase hologram, blazed hologram, and complex amplitude hologram can be used.

The optical information recording apparatus will be described in the description of the optical information recording method of the present invention provided below. The means for applying a fixing beam to the recording layer in the optical information recording apparatus of the present invention will be described in the description of the method for applying a fixing beam to the recording layer in the optical information recording method of the present invention.

<Shift-Multiplexing Recording>

Figure 1:
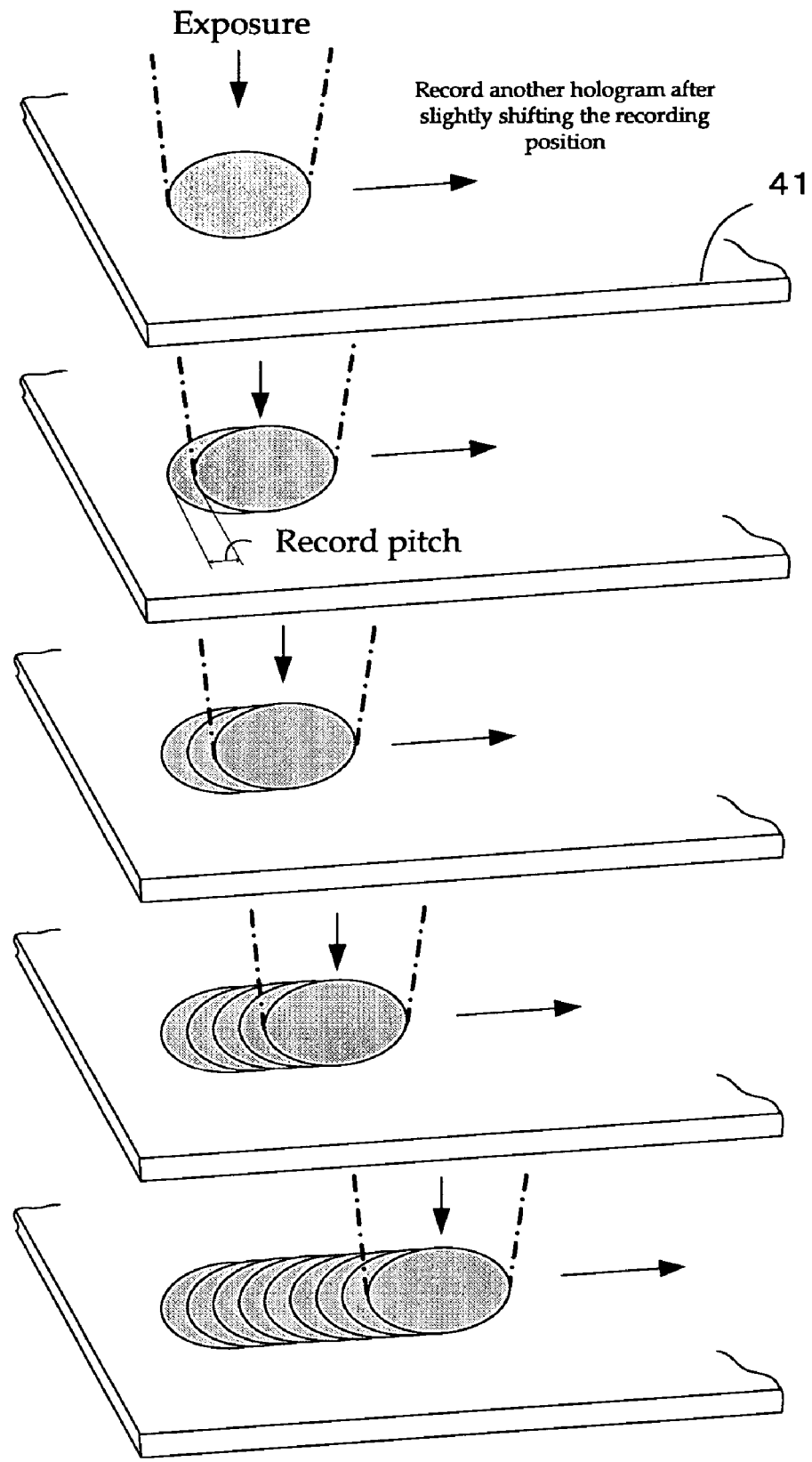
FIG. 1 is a conceptual diagram showing an optical information recording method of the present invention using a shift-multiplexing recording method.

As shown in FIG. 1, the multiplexing recording procedure is as follows: an interference image is created as a result of optical interference between an information beam and reference beam, and the interference image thus created is recorded on the recording layer. Subsequently, either a beam spot or the optical information recording medium is slightly shifted from the initial recording position of the recording layer along the surface thereof. The second interference image is then overlaid on the first interference image, followed by slight shifting of the beam spot or optical information recording medium. Similarly, the third interference image is overlaid both on the first and second interference images. In this way interference images are overlaid (recorded) on top each other while sequentially moving the beam spot or recording layer.

The interference image is a pattern of light and dark fringes. In the light fringes photosensitive monomers are converted to polymers by photopolymerization and thus the refraction index of the recording layer corresponding to the light fringes is reduced, creating a difference in refractive index between the dark fringes, where no photopolymerization reaction has occurred, and the light fringes. The interference images are recorded as the difference in refractive index. Accordingly, the dark fringes correspond to non-recorded regions of the recording layer, where light fringes for the next recording can be recorded.

The shift pitch is preferably a minimal pitch that never allows the second interference image to be reacted with a reproduction beam applied for the reproduction of the initial (first) interference image adjacent to the second interference image.

In the case of the collinear technology in which the information beam and reference beam are applied in such a way that the optical axis of the information beam is collinear with that of the reference beam, the reproduction beam never reacts with adjacent interference images if the interval between adjacent interference images is about 3 μm to 5 μm. Thus, multiplexing recording is achieved with a pitch of about 3 μm to 5 μm (see FIG. 2).

The shift-multiplexing recording for sequential shifting recording (exposing) operations with a pitch of about 3 μm to 5 μm, however, practically requires high accuracy. For this reason, this recording is performed in the following procedure in actual.

Given that n recording (exposing) regions are available at predetermined intervals m in the same track, the first exposure operation is performed for any one of the n regions, followed by recording (exposure) operations for the rest at intervals m (this process is considered as one round). The (n+1)th recording (exposure) operation (i.e., the first recording operation in the second round) is then performed at a position slightly away from the center of the first exposure position in the first round by a small distance of p (p<<m). The small distance p corresponds to the pitch described above.

The (n+2)th recording (exposure) operation (i.e., the second recording operation in the second round is then performed at a position slightly away from the center of the second exposure position in the first round by a small distance of p. By repeating this procedure, (m/n−1) shift-multiplexing recording is performed n times.

More specifically, the nth exposure region in each round is overlaid on the previous one while slightly shifting the recording position in the tracking direction. In this way the shift-multiplexing recording is performed.

Figure 2:
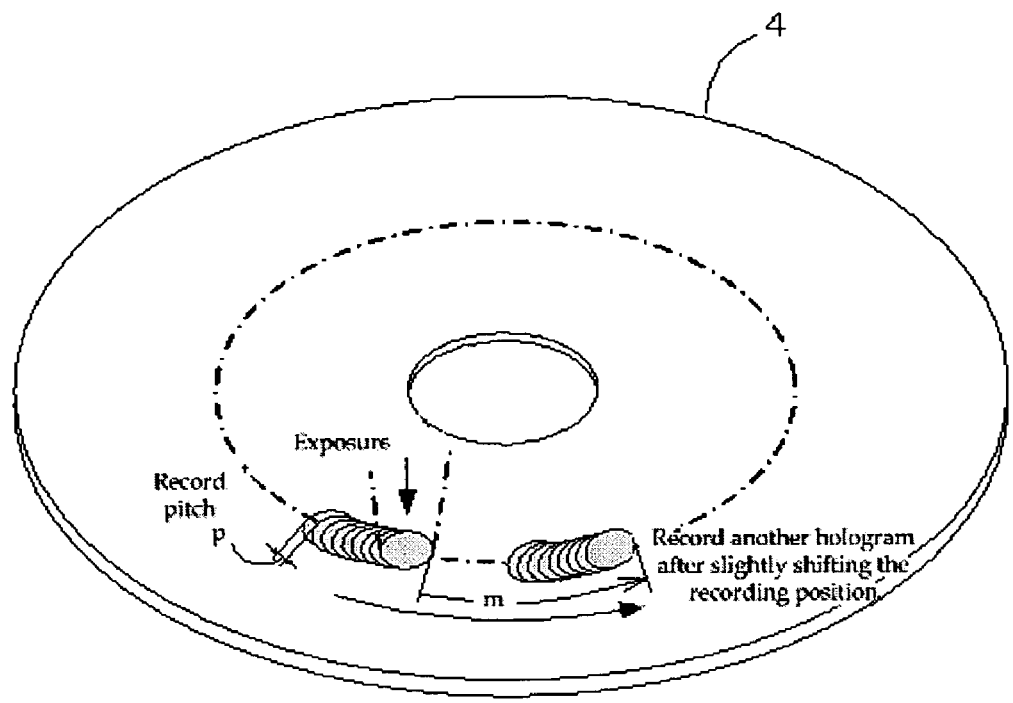
FIG. 2 is a perspective view showing how shift-multiplexing recording is performed for a disc-shaped optical information recording medium with the optical information recording method of the present invention.

Thus, the description of the foregoing shift-multiplexing recording with reference to FIG. 2 is provided for the multiplexed nth exposure region in each round.

The smaller the pitch is, the greater the degree of multiplexity, thus leading to an increase in the storage capacity. However, the diffraction efficiency, which represents the definition of a holographic image to be reconstructed, decreases as the degree of multiplexing increases, imposing a limitation on the number of the multiplexed interference images.

Figure 3:
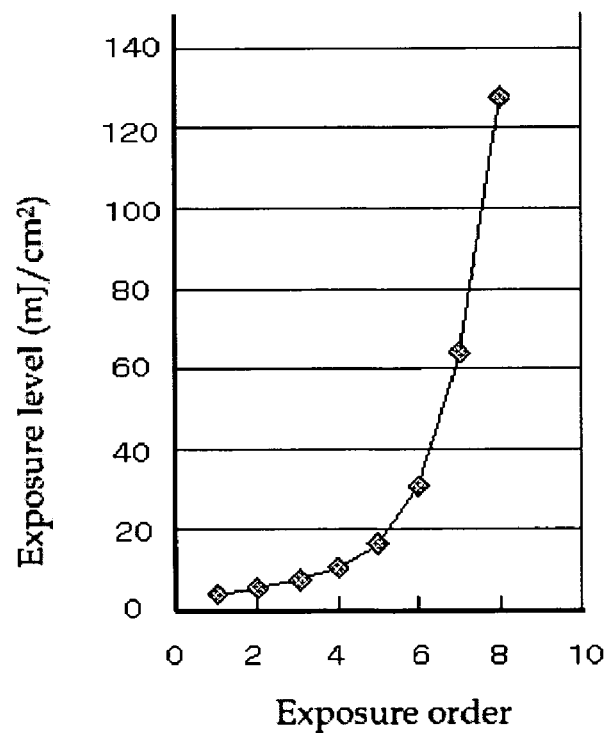
FIG. 3 is a graph showing the relationship between the exposure level and the exposure order in the optical information recording method of the present invention.

In addition, exposure level (mJ/cm$^2$) needs to be increased as the degree of multiplexity increases. For example, as showing in FIG. 3, although the first interference image can be recorded at an exposure level of as small as about 5 mJ/cm$^2$, exposure level needs to be increased for subsequent interference images—about 8 mJ/cm$^2$ for the second interference image, about 10 mJ/cm$^2$ for the third interference image, about 130 mJ/cm$^2$ for the eighth interference image, and so forth.

When a photopolymer recording material is used for the recording layer, the first interference image can be recorded at low energy. However, subsequent continuous exposure operations lead to a larger reacted (exposed) region, and the sensitivity of the recording material is reduced, thus requiring high-irradiation energy to achieve as excellent recording quality as the first one. As described above, the reason why high irradiation energy is required is because the reacted region inhibits the reaction of non-reacted (non-exposed) with beams, and/or because the amounts of photosensitive compositions (e.g., photopolymers) in the non-reacted region are reduced.

Figure 4:
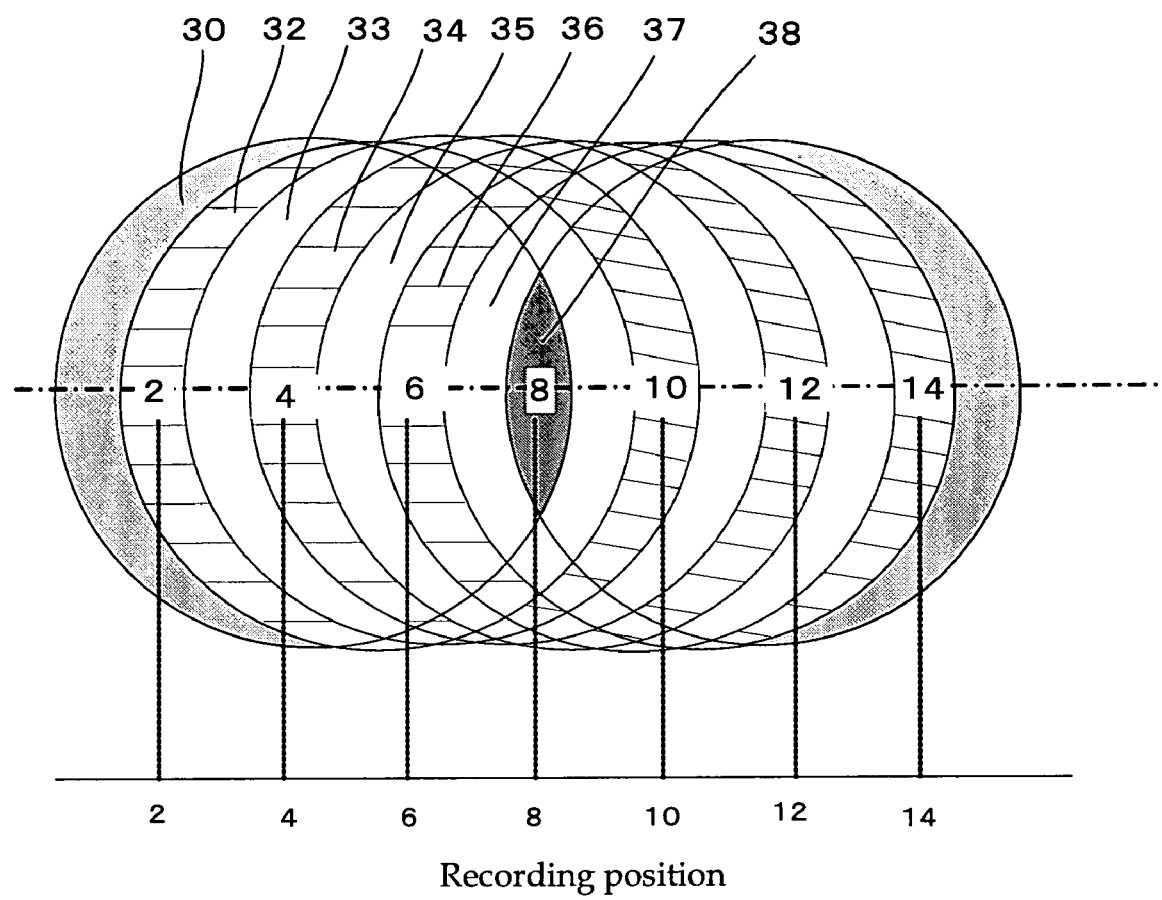
FIG. 4 is a conceptual diagram showing the relationship between the recorded position and the shift-multiplexing recording region in the optical information recording method of the present invention.

As described above, if the number of the multiplexing recording operation is 8 for the recording layer where multiplexed interference images are recorded, the second interference image 33 is recorded at a position away from the center of the first interference image 30 by a predetermined distance (pitch), the third interference image 33 is recorded after shifting the recording position by one pitch, and finally, the eighth interference image 38 is recorded, as shown in FIG. 4.

In FIG. 4 the number 2 represents a two-times exposure region where only the first interference image 30 and second interference image 32 are overlaid. Similarly, the number 8 represents an eight-times exposure region where eight interference images—the first interference image 30 to the eight interference image 38—are overlaid. The number 10 represents a six-times exposure region where six interference images—the third interference image 33 to the eighth interference image 38—are overlaid. The number 12 represents a four-times exposure region where four interference images— the fifth interference image 35 to the eighth interference image 38—are overlaid. The number 14 represents a two-times exposure region where two interference images—the seventh interference image 37 and the eighth interference image 38—are overlaid.

The numbers shown in the bottom of this drawing represent regions corresponding to the foregoing exposure regions. An exposure operation is performed eight times in total, with the center of the interference image shifted by one pitch for each round of exposure. The integrated exposure level in each region is so adjusted that it is within a maximum exposure level M, a saturated exposure level for recording interference images on the recording layer.

Figure 5:
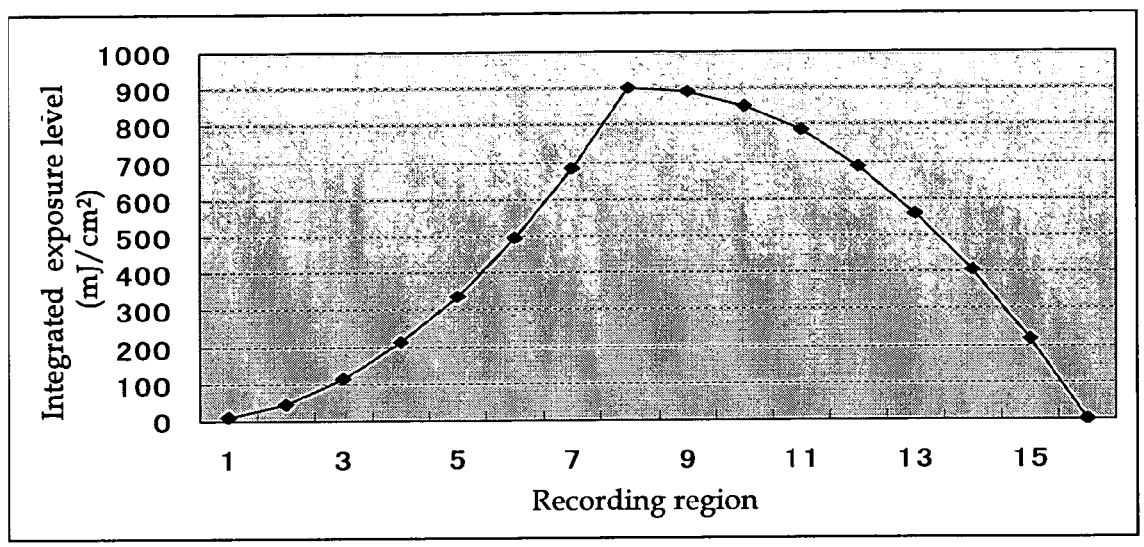
FIG. 5 is a graph showing the relationship between the recording region and the integrated exposure level.

FIG. 5 is a graph showing the relationship between the recording region and the integrated exposure level S from the first to eighth exposure operations, where the longitudinal axis represents an integrated exposure level S (mJ/cm$^2$) and the horizontal axis represents an exposed region.

As shown in FIG. 5, the exposed region 2 has an integrated exposure level S of about 47 mJ/cm$^2$, the exposed region 4 about 211 mJ/cm$^2$, the exposed region 6 about 495 mJ/cm$^2$, the exposed region 8 about 899 mJ/cm$^2$, the exposed region 10 about 852 mJ/cm$^2$, the exposed region 12 about 688 mJ/cm$^2$, and the exposed region 14 about 404 mJ/cm$^2$. Thus, difference regions have a different value of S. Note in the present invention that the integrated exposure level S highest among the recording regions is defined as $S_{max}$, a maximum integrated exposure level. The exposure level T (mJ/cm$^2$) of fixing beam is set on the basis of $S_{max}$.

Figure 6:
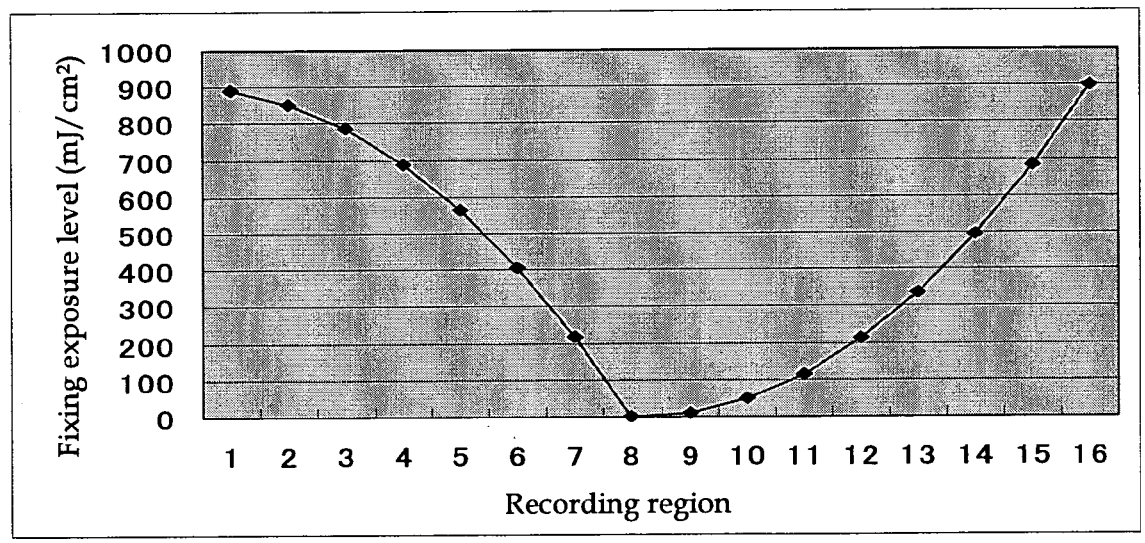
FIG. 6 is a graph showing the relationship between the recording region and the fixing exposure level.
Figure 7:
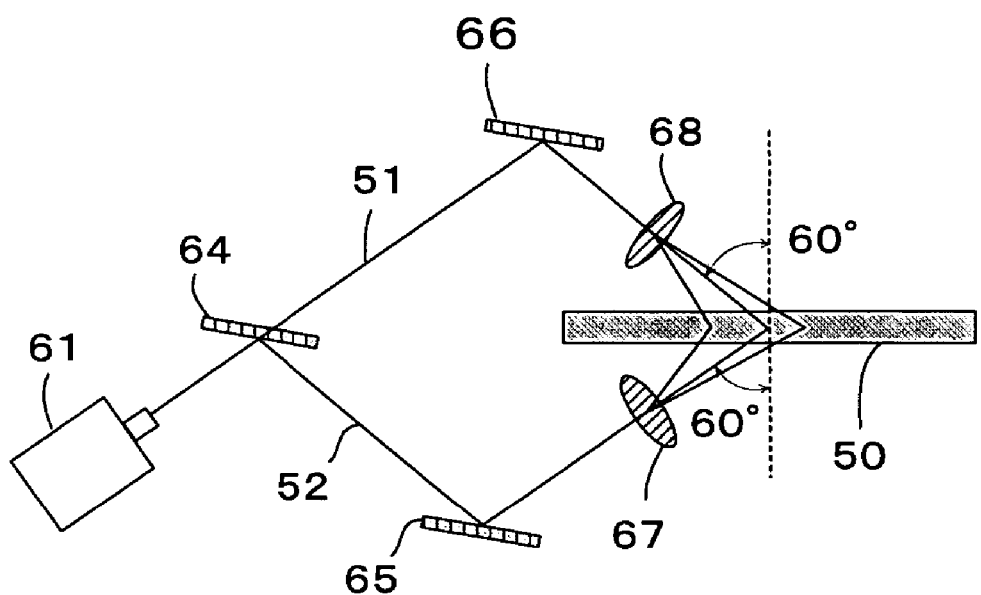
FIG. 7 is a conceptual diagram of an optical information recording method.

In order to fix recorded information to the recording layer, each region may be irradiated with a fixing beam under the condition that the integrated exposure level S in each region is within a maximum exposure level M. FIG. 6 is a graph showing the relationship between the recording region and the fixing exposure level T (mJ/cm$^2$) required for fixing, with a maximum exposure level set to 900 mJ/cm$^2$, where the longitudinal axis represents a fixing exposure level T (mJ/cm$^2$) and the horizontal axis represents a recording region.

As shown in FIG. 6, the exposed region 2 requires a fixing exposure level T of about 853 mJ/cm$^2$, the exposed region 4 about 689 mJ/cm$^2$, the exposed region 6 about 405 mJ/cm$^2$, the exposed region 8 about 1 mJ/cm$^2$, the exposed region 10 about 48 mJ/cm$^2$, the exposed region 12 about 212 mJ/cm$^2$, and the exposed region 14 about 496 mJ/cm$^2$. Thus, difference regions require a different value of T.

For simplicity, the number of the multiplexing recording operation is set to 8 in the above description; the number can be generally set to as high as 500 to 1,000 by adjusting the wavelength and/or phase of light for practical use.

Irradiating the entire surface of the recorded layer that has recording regions with a fixing beam of equal exposure level creates an excessively-exposed region therein and unnecessarily exposes a non-exposed region, leading to an undesirable reduction in the sensitivity of the non-exposed region.

To avoid this problem, the present invention employs a fixing beam that is applied onto each recording region at a varying fixing exposure level T (mJ/cm$^2$), which satisfies the condition H<(S+T)<2H (where H is a minimum exposure level (mJ/cm$^2$) required to fix the information recorded by means of the information beam and reference beam, and S is the integrated exposure level (mJ/cm$^2$)—the total of the exposure level for each recording region (exposed region). Note that the relationship between the minimum exposure level T and the maximum exposure level M is 0<2H≦M.

The range of "(S+T)" is not particularly limited as long as it satisfies H<(S+T)<2H and can be appropriately set depending on the intended purpose; The "(S+T)" value is preferably set while securing room for exposure. More specifically, "(S+T)" is preferably 1.05 T or more, more preferably 1.1T or more, most preferably 1.2T or more. The upper limit is preferably 1.5H.

If the lower limit is 1H or less, it may result in failure to sufficiently fix recorded information, whereas if the upper limit is 2H or more, it results in inefficient excessive exposure that may lead to the reduction in the sensitivity of non-exposed region.

It is thus possible to provide an excellent optical information recording method which, upon exposure and fixing operations in the shift-multiplexing recording, generates no excessively-exposed region, can sufficiently fix recorded information, and never reduce the sensitivity of non-recorded regions, by suitably controlling the exposure level of a fixing beam.

The shifting method in the shift-multiplexing recording is not particularly limited as long as the information and reference beams and the surface of the recording layer are linearly shifted in a relative manner, and can be appropriately determined depending on the intended purpose. For example, a disc may be moved in the rotational (tracking) direction.

The shifting device in the shift-multiplexing recording is not particularly limited and can be appropriately selected depending on the intended purpose. For example, a tracking servo or DLP (Digital Light Processor) can be used.

The shift distance in the shift-multiplexing recording is not particularly limited as long as the reproduction beam applied onto a recording region never reacts with adjacent recording regions, and can be appropriately determined depending on the intended purpose. For example, the shift distance is preferably 1 μm to 100 μm. If the shift distance is less than 1 μm, recording regions other than the one to be reproduced react with the reproduction beam to generate ghost images, whereas if the shift distance exceeds 100 μm, it results in failure to exploit the advantage of the shift-multiplexing recording due to reduced storage capacity as an optical information recording medium.

<Information Beam and Reference Beam>

The information beam and reference beam are not particularly limited and can be appropriately selected depending on the intended purpose. For example, a coherent laser beam emitted from a light source is preferably used.

The laser beam is not particularly limited, and laser beams that have the capability to emit one or more wavelengths of 360 nm to 850 nm are suitable used. The wavelength is preferably 380 nm to 800 nm, more preferably 400 nm to 750 nm, most preferably 500 nm to 600 nm where the center of the visual region is most visible.

If the wavelength is less than 360 nm, it sometimes results in failure to obtain a sharp three-dimensional image, whereas if the wavelength exceeds 850 nm, the interference image has a fine optical fringe pattern, and a photosensitive material that can be adaptable to that interference image may not be obtained.

The light source of the laser beam is not particularly limited and can be appropriately selected depending on the intended purpose. For example, a solid-state laser oscillator, semiconductor laser oscillator, liquid-state laser oscillator, or gas-state laser oscillator can be used. Among these, a gas-state laser oscillator or semiconductor laser oscillator can be suitably used.

The method for applying the information beam and reference beam is not particularly limited and can be appropriately selected depending on the intended purpose. For example, a laser beam from one light source may be split into the information beam and reference beam. Alternatively two laser beams emitted from different light sources may be used as the information beam and reference beam.

The direction in which the information beam and reference beam are applied, or the angle at which they are incident, is not particularly limited and can be appropriately determined depending on the intended purpose. For example, he information beam and reference beam may be applied from different directions, or may be applied from the same direction. Alternatively, they may be applied in such a way that the optical axis of the information beam is collinear with that of the reference beam.

<Fixing Beam>

The region on which the fixing beam is applied is not particularly limited and can be appropriately determined depending on the intended purpose. For example, the fixing beam may be applied on almost the same region where the information beam and reference beam are applied for the recording of information. Alternatively, the fixing beam may be applied on that region, including a region within 1 μm of the periphery thereof. If the fixing beam is applied to regions other than this region (i.e., beyond 1 μm of the periphery of the recording region), adjacent recording regions are also irradiated with the fixing beam, leading to inefficient recording due to this excess irradiation.

The length of time that the fixing beam is applied is not particularly limited and can be appropriately determined depending on the intended purpose; it is preferably 1 ns to 100 ms, more preferably 1 ns to 80 ms at a given position of the recording layer. If this irradiation time is less than 1 ns, it sometimes result in insufficient fixing of recorded information, whereas if it exceeds 100 ms, it results in excessive irradiation.

The direction in which the fixing beam is applied is not particularly limited and can be appropriately determined depending on the intended purpose. For example, the direction in which the fixing beam is applied may be the same as the direction in which the information beam and reference beam are applied, or may be different. In addition, the irradiation angle (measured from the normal of the recording layer) is preferably 0° to 60°, more preferably 0° to 40°. If the irradiation angle is outside of this range, it may result in inefficient fixing operations.

The wavelength of the fixing beam is not particularly limited and can be appropriately determined depending on the intended purpose. For example, the fixing beam preferably has a wavelength of 350 nm to 850 nm, more preferably 400 nm to 600 nm at a given position of the recording layer.

If the wavelength of the fixing beam is less than 350 nm, the material constituting the recording layer may decompose, whereas if the wavelength exceeds 850 nm, the material may be degraded owing to increased temperature.

The light source of the fixing beam is not particularly limited and can be appropriately selected depending on the intended purpose. For example, incoherent beams are preferable; fluorescent lights, high-pressure mercury vapor lamps, xenon lamps, light emitting diodes, and beams obtained by randomly altering the phase of coherent beams by, for example, providing frosted glass on their optical path are used. Among these, light emitting diodes, the beams obtained by randomly altering the phase of coherent beams are preferable.

The method for applying the fixing beam is not particularly limited and can be appropriately selected depending on the intended purpose. For example, a beam from the light source that emits the information beam and reference beam at a given position of the recording layer may be applied as the fixing beam. Alternatively, two beams emitted from different light sources may be used as the fixing beam.

Figure 9:
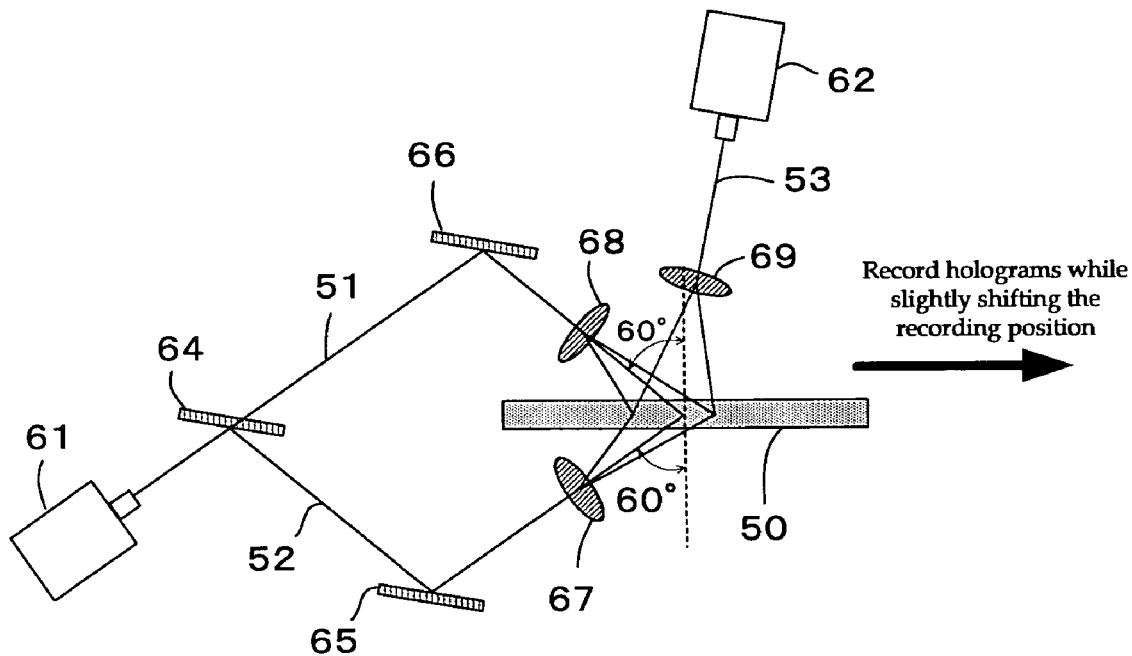
FIG. 9 is a conceptual diagram showing the recording and fixing method in the optical information recording method of the present invention.

For example, a fixing beam is applied onto the recording layer, where information has been recorded with a reflective optical information recording method shown in FIG. 9. First, this optical information recording method records information in the following manner: The light from the first light source 61 is split into two beams, one forming the information beam 51 that passed through the half mirror 64, and one forming the reference beam 52 reflected by the half mirror 64. The information beam 51 is expanded through the mirror 66 and the beam expander 68, and is shined on the recording layer of the optical information recording medium. The reference beam 52 is expanded through the mirror 65 and a beam expander 67, and is shined on the opposite side of the recording layer. In this way the information beam 51 and reference beam 52 create an interference image, which is recorded on the recording layer as optical information.

As shown in FIG. 9, a fixing beam 53 is emitted from a second light source 62, is expanded through a beam expander 69, and is applied onto the recorded interference image.

The fixing beam spot shifts along with the shift of the information beam 51 and reference beam 52, shining the exposed region at an exposure level T that satisfies the condition $H<(S+T)<2H$ (where H is a minimum exposure level (mJ/cm$^2$) required for the recording of information by means of the information beam and reference beam, and S is the integrated exposure level (mJ/cm$^2$)—the total of the exposure level for the exposed region of the recording layer where information has been recorded by holography) within 100,000 seconds after the recording operation. If 100,000 seconds has elapsed before the application of the fixing beam after the recording operation, the quality of signals of the recorded information may be deteriorated. The application of the fixing beam may be performed by use of the first light source 61, which generates both the information beam 51 and reference beam 52.

<Minimum Fixing Exposure Level H>

The minimum fixing exposure level H is set for the purpose of ensuring the archivability of the interference images.

The minimum fixing exposure level H is not particularly limited as long as $H<(S+T)<2H$ is established and can be appropriately set depending on the intended purpose. For example, the minimum fixing exposure level H is preferably 10 mJ/cm$^2$ to 1,000,000 mJ/cm$^2$, more preferably 100 mJ/cm$^2$ to 100,000 mJ/cm$^2$ at a given position of the recording layer. If the minimum fixing exposure level H is less than 10 mJ/cm$^2$, it may result in failure to ensure the archivability of the interference images, whereas if it exceeds 1,000,000 mJ/cm$^2$, it may result in excessive exposure, leading to the possibility that other non-recorded regions react with the fixing beam. Moreover, excessive exposure is inefficient.

<Fixing Exposure Level T>

The fixing exposure level T is not particularly limited as long as H<(S+T)<2H is established and can be appropriately set depending on the intended purpose. For example, the fixing exposure level T is preferably 10 mJ/cm$^2$ to 2,000,000 mJ/cm$^2$, more preferably 100 mJ/cm$^2$ to 200,000 mJ/cm$^2$ at a given position of the recording layer. If the minimum fixing exposure level T is less than 10 mJ/cm$^2$, it may result in failure to ensure the archivability of the interference images, whereas if it exceeds 2,000,000 mJ/cm$^2$, it may result in excessive exposure, leading to the possibility that other non-recorded regions react with the fixing beam. Moreover, excessive exposure is inefficient.

<Integrated Exposure Level S>

The integrated exposure level S is the total of exposure level of the information beam and reference beam in a predetermined region of the recording layer, and represents the total exposure level in the same recording region (predetermined region), from the first to last recording in the multiplexing recording.

Herein the term "predetermined region" means, for single exposure, the exposed region itself; for multiplexing exposure, especially for shift-multiplexing exposure, it means a region in which exposed regions are overlaid on top another stepwise as a result of a series of multiplexing exposure operations. For example, as described above, when the shift-multiplexing recording operation is performed 8 times, each exposed region where total exposure level is different from the other—the once exposed-region, the two times-exposed region, ... and the eight times-exposed region—is defined as a "predetermined region" in the present invention, and the total exposure level in each predetermined region is equivalent to the integrated exposure level S.

The integrated exposure level S affects the sensitivity of a recording layer. The greater the degree of multiplexity in the same recording region, the greater the integrated exposure level S and the lower the sensitivity of the recording layer. For this reason, it is possible to increase the number of the multiplexing recording operations as well as the storage capacity in the recording layer by increasing the maximum exposure level M, a saturated exposure level. Meanwhile, the maximum exposure level is dependent on the characteristics and/or thickness of the recording material of the recording layer, and is therefore determined in light of the number of the multiplexing exposure operations and the characteristics of the recording material.

The integrated exposure level S is not particularly limited as long as H<(S+T)<2H is established and can be appropriately set depending on the intended purpose. For example, the f integrated exposure level S is preferably 10 mJ/cm$^2$ to 2,000, 000 mJ/cm$^2$, more preferably 100 mJ/cm$^2$ to 200,000 mJ/cm$^2$. If the integrated exposure level S is less than 10 mJ/cm$^2$, it may result in failure to achieve a desired storage capacity, whereas if it exceeds 2,000,000 mJ/cm$^2$, recording may be inoperable because of adverse affects on other regions.

<Method for Reproducing Recorded Optical Information>

The method for reproducing recorded optical information is not particularly limited and can be appropriately selected depending on the intended purpose. For example, reproduction of recorded optical information is performed by applying a reference beam to an optical information recording medium, where information has been recorded with the optical information recording method of the present invention, from the same direction as the reference beam for recording is applied. Applying the reference beam to an interference image formed in the recording layer of the optical information recording medium creates diffracted rays that correspond to the interference image, and the optical information is reproduced by collecting them.

<Optical Information Recording Media>

The optical information recording medium of the present invention is an optical information recording medium that has a recording layer for recording information by holography on a support, and further has an additional layer on the support on an as-needed basis.

The optical information recording medium of the present invention may be either a relatively thin, flat hologram for recording two-dimensional information or a volume hologram for recording three-dimensional information such as stereoimages. In either case, the optical information recording medium of the present invention may be either a transmissive hologram or a reflective hologram. In addition, any holographic recording method can be used; any of an amplitude hologram, phase hologram, blazed hologram, and complex amplitude hologram can be used.

For example, the optical information recording medium of the present invention adopts the following two forms: The first includes at least one support on which a recording layer is deposited. This form is used for general holographic recording in which an information beam and reference beam are applied from different directions. The second includes a first substrate, a second substrate, a recording layer provided on the second substrate, and a filter layer provided between the second substrate and the recording layer. This form is used for the collinear technology, where the information beam and reference beam are applied in such a way that the optical axis of the information beam is collinear with that of the reference beam. The first and second forms will be described below.

<<First Form>>

Figure 8:
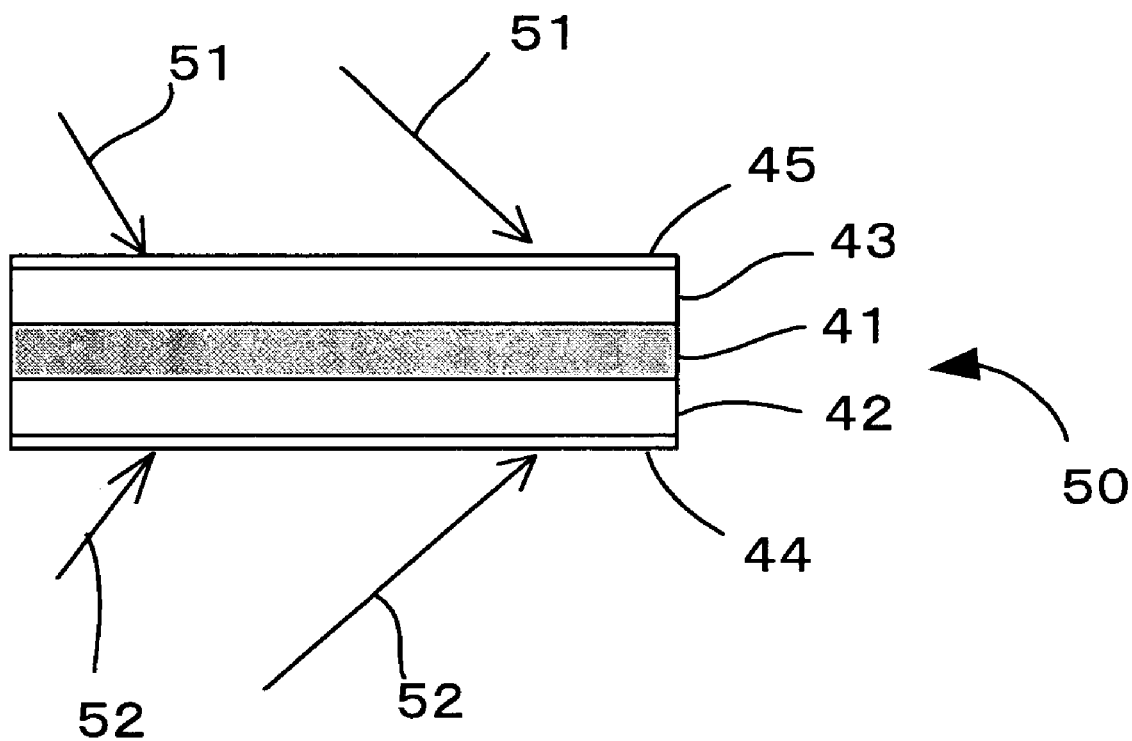
FIG. 8 is a schematic cross-sectional view of the structure of a recording material.

The first form is used for general holographic recording; its layer structure is not particularly limited and can be appropriately determined depending on the intended purpose. For example, the following layer structures can be contemplated: a structure in which single or multiple recording layers are provided on a support; and a structure as shown in FIG. 8, in which a recording layer 41 is interposed between supports 42 and 43, and antireflection layers 44 and 45 are formed on the outermost layers of the support 42 and 43, respectively.

Furthermore, a gas barrier layer or the like may be provided between the recording layer 41 and the support 42 and/or between the recording layer 41 and the support 43. A protection layer may also be provided on the surfaces of the antireflection layers 44 and 45.

<Recording Layer>

For recording layer material, materials that can record information by holography and undergo changes in their optical characteristics (e.g., absorption index and/or refractive index) upon irradiation with electromagnetic rays (e.g., γ-ray, X-ray, ultraviolet ray, visible light ray, infrared ray, and radio waves) with predetermined wavelength are used.

The recording layer material contains photothermal conversion material, a photosensitive resin, and a binder, and further contains an additional component appropriately selected on an as-needed basis.

—Photosensitive Resin—

The photosensitive resin is not particularly limited as long as it is used for holograms and can be appropriately selected depending on the intended purpose. For example, photopolymers are preferable.

—Photopolymer—

The photopolymer is not particularly limited and can be appropriately selected depending on the intended use. For example, the photopolymer contains a monomer and a photoinitiator and further contains additional components such as a sensitizer and/or oligomers on an as-needed basis.

For the photopolymer, for example, those described in the following can be used: "Photopolymer Handbook" (published by Kogyo Chosakai Publishing Inc., 1989), "Photopolymer Technology" (published by THE NIKKAN KOGYO SHIMBUN LTD., 1989), SPIE Journals and Proceedings Vol. 3010 on pp 354-372 (1997), and SPIE Journals and proceedings Vol. 3291 pp 89-103 (1998). In addition, it is also possible to use the photopolymers described in U.S. Pat. Nos. 5,759,721, 4,942,112, 4,959,284, 6,221,536, and 6,743,552; International Publication Nos. WO/97/44714, 97/13183, 99/26112, and 97/13183; Japanese Patent (JP-B) Nos. 2880342, 2873126, 2849021, 3057082, and 3161230; and Japanese Patent Application Laid-Open (JP-A) Nos. 2001-316416 and 2000-275859.

Examples of the method for applying a recording beam to the photopolymer to change the optical properties thereof include a method utilizing diffusion of low-molecular components. In addition, in order to mitigate change in volume of the photopolymer at the time of polymerization, a component that diffuses in the direction opposite to the direction in which polymerized components are diffused may be added, or a compound having a structure that breaks up by treatment with acids may be added in addition to polymers. When the recording layer is formed using a photopolymer containing the low-molecular component, the recording layer may need a structure that can retain liquid therein. Moreover, when the compound having a structure that breaks up by treatment with acids is added, the change in volume of the photopolymer may be constrained by counterbalancing expansion caused by the structure break up and shrinkage caused by polymerization of monomers.

The monomer is not particularly limited can be appropriately selected in depending on the intended use; examples thereof include radical polymerizable monomers having a unsaturated bond such as acrylic group and methacrylic group, and cationic polymerizable monomers having an ether structure such as epoxy ring and oxetane ring. Each of these monomers may be monofunctional or polyfunctional. Photocrosslinking monomers may also be used.

The radical polymerizable monomer is not particularly limited and can be appropriately selected depending on the intended use; examples thereof include acryloylmorpholine, phenoxyethylacrylate, isobonylacrylate, 2-hydroxypropylacrylate, 2-ethylhexylacrylate, 1,6-hexanedioldiacrylate, tripopyleneglycol diacrylate, neopentylglycol PO-modified diacrylate, 1,9-nonanedioldiacrylate, hydroxy pivalic acid neopentylglycol diacrylate, EO-modified bisphenol A diacrylate, polyethyleneglycol diacrylate, pentaerythritol triacrylate, pentaerythritol tetraacrylate, pentaerythritol hexaacrylate, EO-modified glycerol triacrylate, trimethylol propane triacrylate, EO-modified trimethylol propane triacrylate, 2-naphtho-1-oxyethyl acrylate, 2-carbazoil-9-ethylacryate, (trimethylsilyloxy)dimethylsilylpropyl acrylate, vinyl-1-naphthoate, N-vinyl carbazole, 2,4,6-tribromophenylacrylate, pentabromoacrylate, phenyltioethylacrylate, and tetrahydrofurfurylacrylate.

Examples of the cationic polymerizable monomer include bisphenol A epoxy resins, phenol novolac epoxy resins, glycerol triglycidyl ether, 1,6-hexane glycidyl ether, vinyltrimethoxysilane, 4-vinylphenyl trimethoxysilane, γ-methacryroxypropyl triethoxysilane, and compounds represented by the following formulas (M1) to (M6). These monomers may be used singly or in combination.

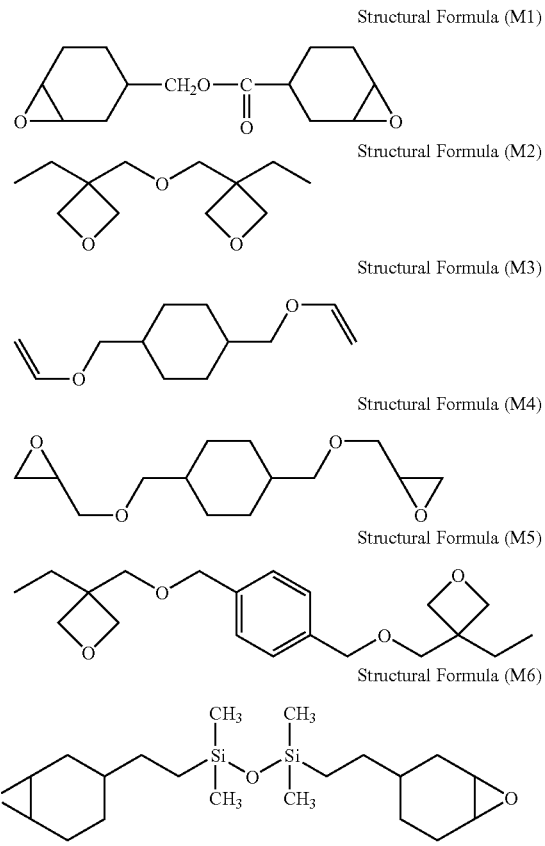

Structural Formula (M1)

Structural Formula (M2)

Structural Formula (M3)

Structural Formula (M4)

Structural Formula (M5)

Structural Formula (M6)

The photoinitiator is not particularly limited as long as it is sensitive to a recording beam, and examples thereof include materials that can trigger radical polymerization, cationic polymerization, and crosslinking reactions.

Examples of the photoinitiator include 2,2'-bis(o-chlorophenyl)-4,4',5,5'-tetraphenyl-1,1'-biimidazole, 2,4,6-tris (trichloromethyl)-1,3,5-triazine, 2,4-bis (trichloromethyl)-6-(p-methoxyphenylvinyl)-1,3,5-triazine, diphenyl iodonium tetrafluoroborate, diphenyl iodonium hexafluorophosphate, 4,4'-di-t-butylphenyl iodonium tetrafluoroborate, 4-diethylaminophenylbenzene diazonium hexafluorophotophate, benzoin, 2-hydroxy-2-methyl-1-phenylpropane-2-one, benzophenon, thioxanthone, 2,4,6-trimethyl benzoyl diphenyl acyl phosphine oxide, triphenyl butylborate tetraethylammonium, bis(η-5-2,4-cyclopentadiene-1-yl), bis[2,6-difluoro-3-(1H-pyrrole-1-yl)phenyltitanium], and diphenyl-4-phenylthiophenylsulfonium hexafluorophosphate these photoinitiators may be used singly or in combination. In addition, sensitizing pigments may be used together with the photoinitiator, depending on the wavelength of beam to be applied.

Polymerization inhibitors and/or antioxidants may be added in order to improve the shelf life of the recording layer. Examples of such Polymerization inhibitors and antioxidants include hydroquinones, p-benzoquinone, hydroquinone monoethylether, 2,6-di-t-butyl-p-cresol, 2,2'-methylenebis (4-methyl-6-t-butylphenol), triphenyl phosphite, tris-nonylphenyl phosphite, phenothiazine, and N-isopropyl-N'-phenyl-p-phenylenediamine. The amount to be added is 3% by mass or less of the total monomers; if it exceeds 3% by mass, the rate of polymerization reactions may be reduced, or polymerization reactions never take place in some cases.

The photopolymer can be obtained by mixing the monomer, the photoinitiator, and other components in accordance with the necessity to allow them to react with one another. When the obtained photopolymer has a substantially low viscosity, it can be formed into a recording layer by casting. If the obtained photopolymer has too high a viscosity to be formed into a recording layer, a recording layer can be formed in the following manner: The photopolymer is deposited on the second substrate using a dispenser, and the first substrate is then pressed against the photopolymer just like putting a lid thereon, whereby the photopolymer is spread over the first substrate to form a recording layer.

Examples of useful photosensitive resins other than the foregoing photopolymers include (1) photorefractive materials that offer a photorefractive effect—an effect that a space-charge distribution is generated as a result of light irradiation, and the refractive index is altered), (2) photochromic materials that undergo changes in refractive index upon irradiation with light, caused by isomerization of their molecules, (3) inorganic materials such as lithium niobate, and barium titanate, and (4) chalcogen materials.

The photorefractive materials (1) are not particularly limited as long as they offer a photorefractive effect, and can be appropriately selected depending on the intended purpose. For example, the photorefractive materials contain charge generating material and charge transporting material, and further contain additional components on an as-needed basis.

The charge generating material is not particularly limited and can be appropriately selected depending on the intended purpose; examples thereof include phthalocyanine dyes or pigments such as metallophthalocyanine, metal-free phthalocyanine and derivatives thereof; naphthalocyanine dyes or pigments; azo dyes or pigments such as monoazo, disazo and trisazo dyes and pigments; pelylene dyes or pigments; indigo dyes or pigments; quinacridone dyes or pigments; polycyclic quinone dyes or pigments such as anthraquinones, and Anthanthron; cyanine dyes or pigments; charge-transfer complexes comprising an electron-accepting substance and an electron-donating substance as typified by TTF-TCNQ; azulenium salts; fullerenes as typified by $C_{60}$ and $C_{70}$ and metanofullerenes, derivatives of fullerenens. These charge generating materials may be used singly or in combination.

The charge transporting material is material carrying holes or electrons, and may be a low-molecular compound or a high-molecular compound.

The charge transporting material is not particularly limited and can be appropriately selected depending on the intended purpose; examples thereof include nitrogen-containing cyclic compounds such as indoles, carbazoles, oxazoles, inoxazoles, thiazoles, imidazoles, pyrazoles, oxadiazoles, pyrazolines, thiadiazoles and triazoles or derivatives thereof; hydrazoline compounds; triphenyl amines; triphenylmethanes; butadienes; stilbenes; quinone compounds such as anthraquinon diphenoquinons or derivatives thereof; fullerenes such as $C_{60}$ and $C_{70}$ and derivatives thereof; π conjugate high polymers or oligomers such as polyacetylenes, polypyrroles, polythiophenes and polyanilines; σ conjugate high polymers or oligomers such as polysilanes and polygermanes; and polycyclic aromatic compounds such as anthracenes, pyrenes, phenanthrenes, and coronenes. These charge transporting materials may be used singly or in combination.

The following is an example of the method for forming a recording layer using the photorefractive material: a coating solution obtained by dissolving and dispersing the photorefractive material in a solvent is used to prepare a coated film, and the solvent is removed from the coated film to thereby form a recording layer. It is also possible to form a recording layer in the following manner: The photorefractive material is fluidized by heating to prepare a coated film, and the coated film is then quenched to form a recording layer.

The photochromic materials (2) are not particularly limited as long as they can induce a photochromic reaction, and can be appropriately selected depending on the intended use; examples thereof include azobenzene compounds, stilbene compounds, indigo compounds, thioindigo compounds, spiropyran compounds, spirooxazine compounds, fulgide compounds, anthracenes compounds, hydrazone compounds, cinnamic acid compounds and diarylethene compounds. Of these compounds, azobenzene derivatives and stilbene derivatives, which undergo structural changes as a result of cis-trans isomerism upon irradiation with light; and spiropyran derivatives and spirooxazine compounds, which undergo structural changes (ring-opening and ring-closure) upon irradiation with light, are most preferable.

Examples of the chalcogen materials (4) include materials containing chalcogen element-containing chalcogenide glass plus metallic particles which are dispersed in the chalcogenide glass and which can upon irradiation with light diffuse in the chalcogenide glass.

The chalcogenide glass is not particularly limited as long as it is composed of a nonoxide amorphous material containing a chalcogen element such as S, Te, or Se and metallic particles can be photo-doped therein.

Preferred examples of amorphous materials containing chalcogen elements include. Ge—S glasses, As—S glasses, As—Se glasses and As—Se—Ce glasses. Of these glasses, Ge—S glasses are preferably used. When Ge—S glass is used for the chalcogenide glass, the atomic ratio between Ge and S in the Ge—S glass can be suitably changed depending on the wavelength of light beam to be applied. However, chalcogenide glasses composed primarily of a composition represented by $GeS_2$ are preferably used.

The metallic particles are not particularly limited as long as they can be doped in the chalcogenide glass upon irradiation with light, and can be appropriately selected depending on the intended use; examples thereof include Al, Au, Cu, Cr, Ni, Pt, Sn, In, Pd, Ti, Fe, Ta, W, Zn and Ag. Among these, Ag, Au, and Cu are more likely to be photo-doped in chalogenide glass, and Ag is most preferable because it has excellent photodoping performance.

The content of the metallic particles dispersed in the chalcogenide glass is preferably 0.1% by volume to 2% by volume, more preferably 0.1% by volume to 1.0% by volume of the total volume of the recording layer. If the content of the metallic particles is less than 0.1% by volume, the change in transmitance as a result of photodoping is insufficient, which may result in the reduction in the recording accuracy. Whereas if the content of the metallic particles is more than 2% by volume, the light transmittance of the recording material decreases, leading to unsatisfactory photodoping in some cases.

—Binder—

The binder is added in order to increase coating capability, strength of the resultant film and holographic recording characteristics, and is appropriately selected in light of its compatibility with hologram material and photothermal conversion material.

The binder is not particularly limited and can be appropriately selected depending on the intended purpose; examples thereon include copolymers of unsaturated acids (e.g., (meth)

acrylic acid and itaconic acid) and alkyl (meth)acrylates, phenyl (meth)acrylate, benzyl (meth)acrylate, styrene or α-methylstyrene; polymers of alkyl methacrylates and alkyl acrylates, such as polymethyl methacrylate; copolymers of alkyl (meth)acrylates and acrylonitrile, vinyl chloride, vinylidene chloride or styrene; copolymers of acrylonitrile and vinyl chloride or vinylidene chloride; modified celluloses bearing carboxylic groups on their side chain; polyethyleneoxides; polyvinylpyrrolidones; novolac resins that result from the condensation reaction of phenol, o-cresol, m-cresol, p-cresol and/or xylenol and aldehydes and acetone; polyethers of epichlorohydrin and bisphenol A; soluble nylons; polyvinylidene chloride; chlorinated polyolefins; copolymers of vinyl chloride and vinyl acetate; copolymers of acrylonitrile and styrene; copolymers of acrylonitrile, butadiene and styrene; polyvinylalkylethers; polyvinylalkylketones; polystyrenes; polyurethanes; polyethylene terephthalate isophthalates; acetyl celluloses; acetylpropyloxy celluloses; acetylbutoxy celluloses; nitro celluloses; Celluloid; polyvinyl butyral; epoxy resins; melamine resins; and formalin resins. Note that the term "(meth)acryl" is used in some cases to denote both or either of "acryl" and/or "methacryl."

The content of the binder is the solid components of the recording layer is not particularly limited and can be appropriately set depending on the intended purpose; it is preferably 10% by mass to 95% by mass, more preferably 35% by mass to 90% by mass. If the content of the binder is less than 10% by mass, interference images may not be obtained stably, whereas if the content exceeds 95% by mass, it may result in poor diffraction efficiency.

The content of the binder in the photosensitive layer is preferably 10% by mass to 95% by mass, more preferably 35% by mass to 90% by mass of the total solid components in the photosensitive layer.

—Additional Component Contained in the Recording Layer—

In the present invention it is preferable to add nitro cellulose to the recording layer in order to improve the photothermal conversion effect. Nitro cellulose decomposes under heat generated from a light absorber that has absorbed the near-infrared laser beam, thereby facilitating the polymerization reaction in photopolymers.

The nitrocellulose can be prepared in the following procedure: Natural cellulose purified with a conventional method is esterified with mix acid, and nitro groups are entirely or partially introduced into three hydroxyl groups on the glucopyranose ring, a building block of cellulose. The nitrification degree in the nitrocellulose is preferably 2 to 13, more preferably 10 to 12, most preferably 11 to 12.5. Here, the term "nitrification degree" represents weight % of nitrogen atoms in nitrocellulose. If the nitrification degree is too high, through the polymerization reaction in the photopolymers is facilitated, it may result in the reduction in room temperature stability. In addition, the resultant nitrocellulose becomes explosive, which is dangerous. If the nitrification degree is too low, the polymerization reaction in the photopolymers is not facilitated well enough.

The degree of polymerization of the nitrocellulose is preferably 20 to 200, more preferably 25 to 150. If the degree of polymerization is too high, it may result in poor recording performance. If the degree of polymerization is too low, coating capability of the recording layer tends to be reduced. The content of the nitrocellulose in the recording layer is preferably 0% by mass to 80% by mass, more preferably 0.5% by mass to 50% by mass, most preferably 1% by mass to 25% by mass of the total solid components in the recording layer.

The recording layer can be formed with a method known in the art. For example, the recording layer can be suitably formed with, for example, the vapor deposition method, wet deposition method, MBE (molecular beam epitaxy) method, cluster ion beam method, molecular lamination method, LB (Langumuir-Blodgett) method, printing method, or transferring method Alternatively, the recording layer may be formed with a two-component urethane matrix formation method described in U.S. Pat. Nos. 6,743,552.

The formation of the recording layer by means of the wet deposition method can be suitably performed by, for example, using a coating solution obtained by dissolving and dispersing the recording layer material in a solvent, (i.e., by applying the coating solution on a support and drying it). The wet deposition method is not particularly limited and can be appropriately selected from those known in the art depending on the intended use; examples thereof include an ink-jet method, spin coating method, kneader coating method, bar coating method, blade coating method, casting method, dipping method, and curtain coating method.

The thickness of the recording layer is not particularly limited and can be appropriately set depending on the intended purpose; the thickness of the recording layer is preferably 1 μm to 1,000 μm, more preferably 100 μm to 700 μm.

If the thickness of the recording layer is within a preferable range, it will result in excellent S/N ratios even when 10- to 300-fold shift-multiplexing recording operation is performed; more excellent S/N ratios can be obtained in a more preferable thickness range.

<<Other Layers>>

The other layers are not particularly limited and can be appropriately selected depending on the intended purpose. For example, antireflection layers and/or protection layers can be used.

—Support—

The shape, structure, size and the like of the support are not particularly limited and can be appropriately set depending on the intended purpose; examples of the shape of the support includes a disc shape, card-like flat shape, and sheet shape; examples of the structure of the support include a single-layer structure and multilayered structure; and the size of the support can be appropriately set according to the size of the optical information recording medium, for example.

The material for the support is not particularly limited, and inorganic and organic materials can be suitably used. However, organic and inorganic materials that can ensure mechanical strength of optical information recording media are required. In addition, when the support is transparent enough to admit recording and reproduction beams, organic and inorganic materials that can admit these beams are required.

Examples of the inorganic materials include glass, quartz and silicon.

Examples of the organic materials include acetate resins such as triacetylcellulose, polyester resins, polyethersulfone resins, polysulfone resins, polycarbonate resins, polyamide resins, polyimide resins, polyolefin resins, acrylic resins, polynorbornene resins, cellulose resins, polyarylate resins, polystyrene resins, polyvinylalcohol resins, polyvinyl chloride resins, polyvinylidene chloride resins, polyacrylic resins, polylactate resins, plastic film laminate paper and synthetic paper. These may be used singly or in combination. Among these, polycarbonate resins and acrylic resins are preferable in light of their formability, optical characteristics, and costs.

The support may be either a freshly prepared one or a commercially available one.

The thickness of the support is not particularly limited and can be appropriately set depending on the intended purpose; the thickness is preferably 0.1 mm to 5 mm, more preferably 0.3 mm to 2 mm. If the thickness of the support is less than 0.1 mm, the optical information disc containing the support may become deformed. If the thickness is greater than 5 mm, the weight of the optical information disc is increased, so too does the load on a drive motor that spins it.

<<Second Form>>

The second form of the optical information recording medium is intended for the collinear technology, where an information beam and reference beam are applied in such a way that the optical axis of the information beam is collinear with that of the reference beam. An example of the second form is an optical information recording medium that includes a first substrate, a second substrate, a recording layer provided on the second substrate, and a filter layer provided between the second substrate and the recording layer.

<The Method for Recording and Reproducing Optical Information in the Second Form>

The method for recording optical information in the second form uses the so-called collinear technology, where an information beam and reference beam are applied in such a way that the optical axis of the information beam is collinear with that of the reference beam, and optical interference between the information beam and reference beam creates an interference image, or information, to be recorded on a recording layer.

As in the case of the foregoing first form, the collinear technology applies an information beam and reference beam onto at least a part of the recording layer where information is to be recorded. In this way an optical information recording medium that offers high definition and high diffraction efficiency can be obtained.

As in the case of he foregoing first form, the second form adopts a fixing beam applied onto at least a portion of an exposed region at an exposure level T (mJ/cm$^2$) that satisfies the condition $H<(S+T)<2H$ (where S is an integrated exposure level (mJ/cm$^2$), which is the total of the exposure level in each predetermined region that constitutes the exposed region where an interference image has been recorded by irradiating the recording layer with an information beam and a reference beam, and H is a minimum fixing exposure level (mJ/cm$^2$) required to fix the interference image).

Figure 17:
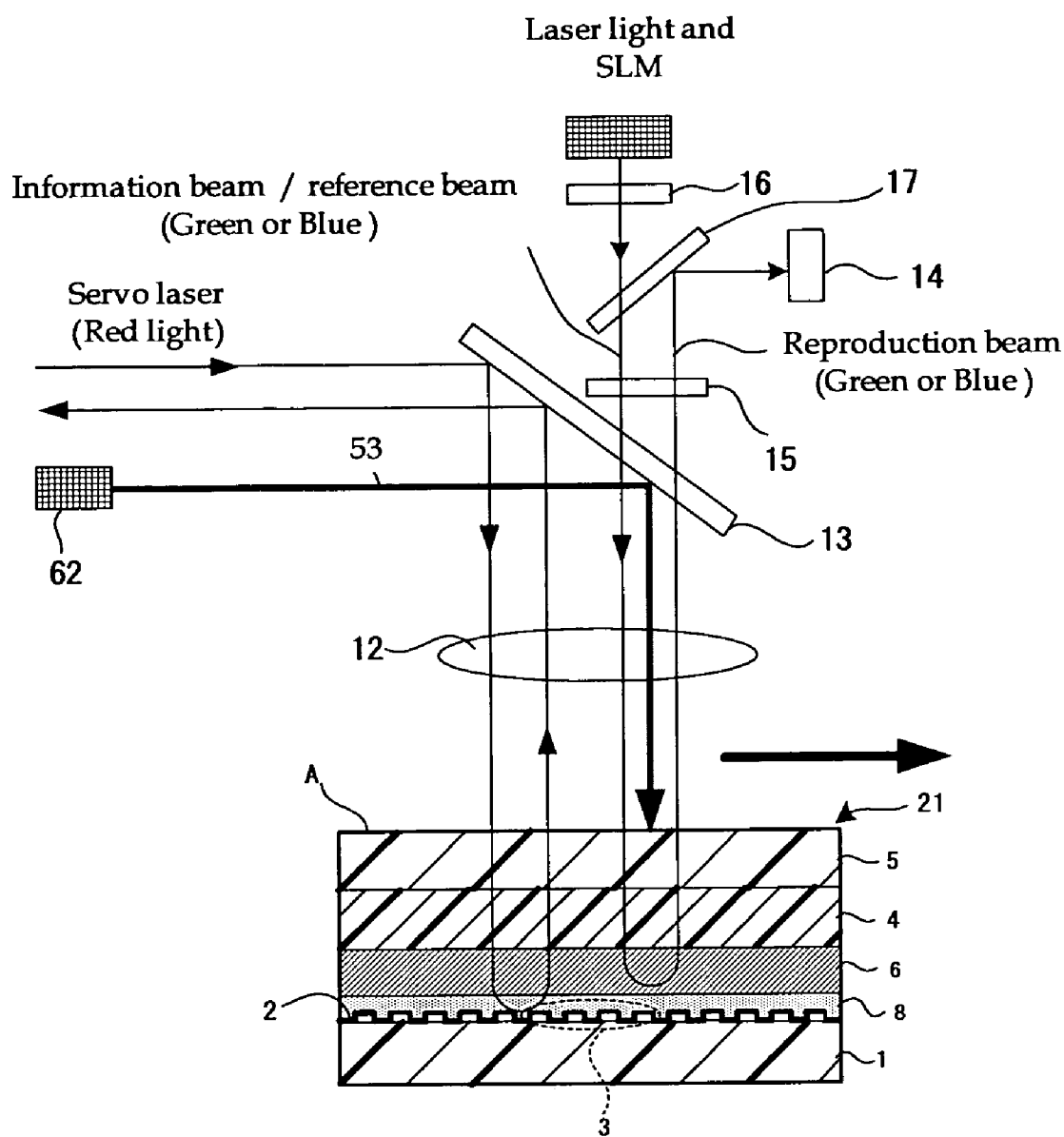
FIG. 17 is a conceptual diagram of an optical information recording apparatus using the collinear technology.

As shown in FIG. 17, also in a recording apparatus using the collinear technology, the second light source 62 is provided, the fixing beam 53 from the second light source 62 is shifted along with the shift of the information beam and reference beam, and the fixing beam is applied onto the recording region. The fixing beam 53 may be applied onto an interference image for each round of the recording operation. Alternatively, the fixing beam 53 may be applied after part or whole recording operations have ended. The irradiation time of the fixing beam is preferably 1 ns to 10 ms at any given position of the recording layer. If the irradiation time exceeds 10 ms, it takes too much time for recording, which may result in poor operability.

The method for reproducing optical information is not particularly limited and can be appropriately selected depending on the intended purpose. For example, the recorded information can be reproduced by applying another reference beam onto the interference images recorded on the recording layer using the optical information recording method.

In the method for recording and reproducing optical information in the second form, an information beam with a two-dimensional intensity distribution and a reference beam with an intensity level equal to that of the information beam are superimposed inside a photosensitive recording layer to form an interference image, and an optical characteristic distribution is created by means of the interference image, whereby information is recorded in the recording layer. Meanwhile, upon reading (reproducing) of the written information, only a reference beam is applied onto the recording layer from the same direction, and thereby a reproduction beam is emitted from the recording layer as a beam that has an intensity distribution corresponding to the optical characteristic distribution formed in the recording layer.

Here, the method for recording and reproducing optical information in the second form is used in an optical information recording apparatus described below.

The optical information recording apparatus used for the method for recording and reproducing optical information will be described with reference to FIG. 18.

Figure 18:
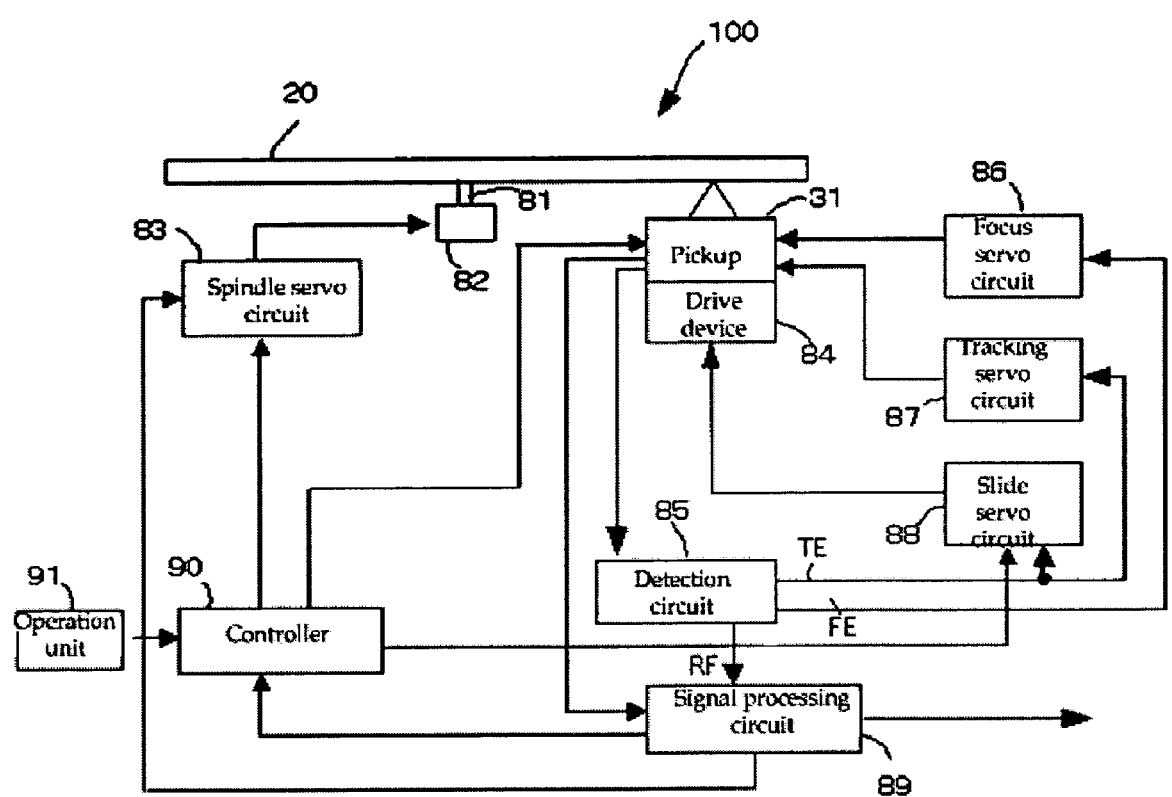
FIG. 18 is a block diagram of an optical information recording apparatus using the collinear technology.

FIG. 18 is a block diagram showing the configuration of an optical information recording apparatus according to the second form. Note that this apparatus includes an optical information recording device and an optical information reproducing device.

The optical information recording apparatus 100 includes a spindle 81 to which an optical information recording medium 20 is attached, a spindle motor 82 for spinning the spindle 81, and a spindle servo circuit 83 for controlling the spindle motor 82 so that the rotation speed of the optical information recording medium 20 is constant at a predetermined level.

In addition, the optical information recording apparatus 100 includes a pickup 31 which applies an information beam and a recording reference beam onto the optical information recording medium 20, fixes the exposed regions, and applies a reproduction reference beam onto the optical information recording medium 20 to detect a reproduction beam for the reproduction of information recorded in the optical information recording medium 20, and a drive device 84 that enables the pickup 31 to move in the radial direction of the optical information recording medium 20.

The optical information recording apparatus 100 includes a detection circuit 85 for detecting a focus error signal FE, a tracking error signal TE and a reproduction signal RF from the output signal of the pickup 31, a focus servo circuit 86 for performing a focus servo operation by driving an actuator inside the pickup 31 on the basis of the focus error signal FE detected by the detection circuit 85 to move an objective lens (not shown) in the thickness direction of the optical information recording medium 20, a tracking servo circuit 87 for performing a tracking servo operation by driving an actuator inside the pickup 31 on the basis of the tracking error signal TE detected by the detection circuit 85 to move the objective lens in the radial direction of the optical information recording medium 20, and a slide servo circuit 88 for performing a slide servo operation by controlling the drive device 84 on the basis of a tracking error signal TE and commands from a controller to be described later to move the pickup 31 in the radial direction of the optical information recording medium 20.

Furthermore, the optical information recording apparatus 100 includes a signal processing circuit 89 which decodes output data from a CMOS or CCD array to be described later in the pickup 31 to reproduce data recorded on the data area of the optical information recording medium 20; which creates a reference clock on the basis of a reproduction signal RF detected by the detection circuit 85; and which distinguishes individual addresses, a controller 90 for controlling overall of the optical information recording apparatus 100, and a operation unit 91 for giving a variety of commands to the controller 90.

The controller 90 receives the reference clock and address information outputted from the signal processing circuit 89 and controls, for example, the pickup 31, spindle servo circuit 83 and slide servo circuit 88. The spindle servo circuit 83 receives the reference clock outputted from the signal processing circuit 89. The controller 90 includes a CPU (central processing unit), ROM (read only memory) and RAM (random access memory), and the CPU realizes the function of the controller 90 by executing programs stored in the ROM on the RAM, a working area.

The apparatus for generating the fixing beam 53 that emits from the second light source 63 in the second form is not particularly limited, and can be appropriately selected depending on the intended purpose. For example, this apparatus may includes a light source-controlling device separated from the optical information recording apparatus 100, and can be so controlled that the fixing beam 53 is emitted while being brought in sync with the optical information recording apparatus 100. Moreover, the second light source 62 may be provided inside the optical information recording apparatus 100, so that the information beam, reference beam and fixing beam can be controlled at the same time.

The optical information recording apparatus using the foregoing method for recording and reproducing optical information in the second form utilizes the method of the present invention for recording optical information, wherein after recording of interference images by means of an information beam and reference beam, fixing exposure is performed at an integrated exposure level of S within 100,000 seconds for a given position of the recording layer. Thus, interference images are well fixed on the recording layer without reducing the sensitivity of non-recorded regions, leading to an optical information recording medium with high storage capacity and high diffraction efficiency.

<Recording Layer>

A recording layer similar to that used for the first form can be used.

<Filter Layer>

The filter layer serves to eliminate the occurrence fluctuations in the wavelengths selected to be reflected in a case where the incident angle is changed, and has a function to prevent irregular reflection of the information beam and reference beam at the reflective film of an optical information recording medium to thereby prevent the occurrence of noise. Providing such a filter layer on the optical information recording medium will lead to high definition and excellent diffraction efficiency.

Note in the present invention that the term "incident angle (angle of incidence)" means the angle, measured from the normal of the surface of an optical information recording medium, at which any one of an information beam, reference beam and fixing beam is incident thereto.

The filter layer is not particularly limited and can be appropriately selected depending on the intended purpose. For example, the filter layer is a laminate of a colored material-containing layer, a dielectric material-deposited layer, a single-layered or multilayered cholesteric liquid crystal layer, and additional layers provided on an as-needed basis.

The filter layer may be directly applied and deposited onto the support together with the recording layer. Alternatively, the filter layer may be previously deposited on a base material such as a film to prepare a filter for optical information recording media, and the filter may be deposited on the support.

—Colored Material-Containing Layer—

The colored material-containing layer is formed of a colored material, a binder resin, a solvent, and additional components provided on an as-needed basis.

Suitable examples of the colored material include pigments and dyes. Among these, red pigments and red dyes are preferable because they absorb light of wavelength 532 nm and admit a servo beam of wavelength 655 nm or 780 nm; red pigments are most preferable.

The red dyes are not particularly limited and can be appropriately selected from those known in the art; examples thereof include acidic dyes such as C. I. Acid Reds 1, 8, 13, 14, 18, 26, 27, 35, 37, 42, 52, 82, 87, 89, 92, 97, 106, 111, 114, 115, 134, 186, 249, 254 and 289; basic dyes such as C. I. Basic Reds 2, 12, 13, 14, 15, 18, 22, 23, 24, 27, 29, 35, 36, 38, 39, 46, 49, 51, 52, 54, 59, 68, 69, 70, 73, 78, 82, 102, 104, 109 and 112; and reactive dyes such as C. I Reactive Reds 1, 14, 17, 25, 26, 32, 37, 44, 46, 55, 60, 66, 74, 79, 96 and 97. These dyes may be used singly or in combination.

The red pigments are not particularly limited and can be appropriately selected from those known in the art; examples thereof include C. I. Pigment Red 9, C. I. Pigment Red 97, C. I. Pigment Red 122, C. I. Pigment Red 123, C. I. Pigment Red 149, C. I. Pigment Red 168, C. I. Pigment Red 177, C. I. Pigment Red 180, C. I. Pigment Red 192, C. I. Pigment Red 209, C. I. Pigment Red 215, C. I. Pigment Red 216, C. I. Pigment Red 217, C. I. Pigment Red 220, C. I. Pigment Red 223, C. I. Pigment Red 224, C. I. Pigment Red 226, C. I. Pigment Red 227, C. I. Pigment Red 228, C. I. Pigment Red 240, C. I. Pigment Red 48:1, Permanent Carmine FBB (C. I. Pigment Red 146), Permanent Ruby FBH (C. I. Pigment Red 11) and Faster Pink B Supra (C. I. Pigment Red 81). These pigments may be used singly or in combination.

Among these red pigments, those with an optical transmittance of 10% or less for light of wavelength 532 nm and 90% or more for light of wavelength 655 nm are most preferably used.

The content of the colored material is preferably 0.05% by mass to 90% by mass, more preferably 0.1% by mass to 70% by mass of the total solid components of the colored material-containing layer. If the content of the colored material is less than 0.05% by mass, the thickness of the colored material-containing layer may need to be set to 500 μm or more. If the content of the colored material is greater than 90% by mass, the colored material-containing layer may collapse during its preparation due to lack of self-supporting properties.

—Binder Resin—

The binder resin is not particularly limited and can be appropriately selected from those known in the art; examples thereof include polyvinylalcohol resins; vinyl chloride/vinyl acetate copolymers; copolymers of vinyl chloride or vinyl alcohol and at least one of malleic acid and acrylic acid; vinyl chloride/vinylidene chloride copolymers; vinyl chloride/acrylonitrile copolymers; ethylene/vinyl acetate copolymers; celluloses derivatives such as nitrocellulose resins; polyacrylic resins; polyvinylacetal resins; polyvinylbutyral resins; epoxy resins; phenoxy resins; polyurethane resins; and polycarbonate resins. These materials can be used singly or in combination.

In addition, polar groups (e.g., epoxy group, $CO_2H$, OH, $NH_2$, $SO_3M$, $OSO_3M$, $PO_3M_2$, and $OPO_3M_2$, where M represents a hydrogen atom, alkali metal, or ammonium and if two or more M's appear, they may be different) are preferably introduced into the molecules of the above-listed binder resins in order to increase their dispersibility and durability. The content of such polar groups is preferably $10^{-6}$ to $10^{-4}$ equivalents per gram of binder resin.

The binder resins are preferably cured by the addition of a known isocyanate crosslinking agent.

The content of the binder resin is preferably 10% by mass to 99.5% by mass, more preferably 30% by mass to 99.9% by mass of the total solid components of the colored material-containing material.

Each of these components described above is dissolved or dispersed in a suitable solvent to prepare a coating solution, and the coating solution is applied over a substrate to be described later using a desired coating method. In this way a colored material-containing layer can formed.

The solvent is not particularly limited and can be appropriately selected from those known in the art; examples thereof include water; alkoxypropionic acid esters such as 3-methoxypropionic acid methylester, 3-methoxypropionic acid ethylester, 3-methoxypropionic acid propylester, 3-ethoxypropionic acid methylester, 3-ethoxypropionic acid ethylester and 3-ethoxypropionic acid propylester; alkoxy alcohol esters such as 2-methoxypropylacetate, 2-ethoxypropylacetate and 3-methoxybutylacetate; lactic acid esters such as methyl lactate and ethyl lactate; ketones such as methyl ethyl ketone, cyclohexanone and methylcyclohexanone; γ-butyrolactone; N-methylpyrrolidone; dimethylsulfoxide; chloroform; and tetrahydrofuran. These solvents may be used singly or in combination.

The coating method is not particularly limited and can be appropriately selected from those known in the art depending on the intended use; examples thereof include an ink-jet method, spin coating method, kneader coating method, bar coating method, blade coating method, casting method, dipping method, and curtain coating method.

The thickness of the colored material-containing layer is preferably 0.5 μm to 200 μm, more preferably 1.0 μm to 100 μm, for example. If the thickness of the colored material-containing layer is less than 0.5 μm, binder resin that encapsulates colored material to form a film cannot be added in sufficient amounts in some cases. If the thickness of the colored material-containing layer is greater than 200 μm, the resultant filter is made too thick, thus requiring a big optical system for an irradiating beam and servo beam in some cases.

—Dielectric Material-Deposited Layer—

The dielectric material-deposited layer is formed on the colored material-containing layer, and is a laminate of multiple dielectric thin layers with different refraction indices. For the dielectric material-deposited layer to serve as a reflective film through which light of desired wavelength passes, it is preferably a laminate of alternating dielectric thin layers with high and low indices of refraction; however, three or more different dielectric thin layers may be laminated.

The number of the dielectric thin layers to be laminated is preferably 2 to 20, more preferably 2 to 12, still further preferably 4 to 10, most preferably 6 to 8. If the number of the dielectric thin layers to be laminated is greater than 20, it results in the reduction in productivity because of multilayer vapor deposition. The object and effect of the present invention cannot be achieved in some cases.

The order in which the dielectric thin layers are laminated is not particularly limited, and can be appropriately determined depending on the intended purpose. A dielectric thin layer with low refractive index is formed deposited in a case where an adjacent dielectric thin layer has high refractive index. On the other hand, a dielectric thin layer with high refractive index is formed deposited in a case where an adjacent dielectric thin layer has low refractive index. The criteria of refractive index for determining whether a dielectric thin layer has high or low refractive index is preferably set to 1.8; note, however, that this determination is made on an arbitrary basis. That is, dielectric thin layers with different refractive indices equal to or greater than 1.8 (i.e., there are dielectric thin layers with high and low refractive indices) may be used to form such a laminate.

The material for the dielectric thin layer with high refractive index is not particularly limited and can be appropriately selected depending on the intended purpose; examples thereof include $Sb_2O_3$, $Sb_2S_3$, $Bi_2O_3$, $CeO_2$, $CeF_3$, $HfO_2$, $La_2O_3$, $Nd_2O3$, $Pr6O_{11}$, $Sc_2O_3$, SiO, $Ta_2O_5$, $TiO_2$, TlCl, $Y_2O_3$, ZnSe, ZnS and $ZrO_2$. Among these, $Bi_2O_3$, $CeO_2$, $CeF_3$, $HfO_2$, SiO, $Ta_2O_5$, $TiO_2$, $Y_2O_3$, ZnSe, ZnS and $ZrO_2$ are preferable, and SiO, $Ta_2O_5$, $TiO_2$, $Y_2O_3$, ZnSe, ZnS and $ZrO_2$ are more preferable.

The material for the dielectric thin layer with low refractive index is not particularly limited and can be appropriately selected depending on the intended purpose; examples thereof include $Al_2O_3$, $BiF_3$, $CaF_2$, $LaF_3$, $PbCl_2$, $PbF_2$, LiF, $MgF_2$, MgO, $NdF_3$, $SiO_2$, $Si_2O_3$, NaF, $ThO_2$ and $ThF_4$. Among these, $Al_2O_3$, $BiF_3$, $CaF_2$, $MgF_2$, MgO, $SiO_2$ and $Si_2O_3$ are preferable, and $Al_2O_3$, $CaF_2$, $MgF_2$, MgO, $SiO_2$ and $Si_2O_3$ are more preferable.

Note that the atomic ratio in the material for the dielectric thin layer is not particularly limited and can be appropriately set depending on the intended purpose. The atomic ratio can be adjusted by changing the concentration of atmosphere's gas upon deposition of dielectric thin layers.

The method for depositing the dielectric thin layer is not particularly limited and can be appropriately selected depending on the intended purpose. For example, a vacuum vapor deposition process such as ion plating and ion beam, a physical vapor deposition (PVD) such as sputtering, and a chemical vapor deposition (CVD) can be used. Among these methods, a vacuum vapor deposition and sputtering are preferable, and sputtering is most preferable.

For the sputtering, DC sputtering is preferable because it offers high deposition rate. Note that highly conductive material is preferably used when DC sputtering is employed.

Examples of the method for depositing multiple dielectric thin layers by sputtering include a single-chamber method, where multiple dielectric thin layers are alternately or sequentially deposited using a single chamber, and a multi-chamber method, where multiple dielectric thin layers are sequentially deposited using multiple chambers. In view of the productivity and to prevent contamination among materials, the multi-chamber method is most preferable.

The thickness of the dielectric thin layer is preferably $\lambda/16$ to $\lambda$, more preferably $\lambda/8$ to $3\lambda/4$, most preferably $\lambda/6$ to $3\lambda/8$ in terms of optical wavelength.

A part of light propagating through the dielectric material-deposited layer is reflected at each dielectric thin layer therein, and optical interference takes place among the reflected beams. Thus, only light that has a wavelength determined on the basis of the product of the thickness of the dielectric thin layer and the refractive index of the layer for the beam can pass through the dielectric material-deposited layer. In addition, the central wavelength of light to be admitted in the dielectric material-deposited layer is dependent on the angle at which light is incident thereto. The wavelength of light to be admitted can be changed by chaining the incident angle.

Since the number of dielectric thin layers deposited in the dielectric material-deposited layer is set to 20 or less, several percent to several tens of percent of selectively reflected light passes through the filter and enters the dielectric thin layer.

However, the reflected light is absorbed by the colored material-containing layer provided immediately under the dielectric material-deposited layer. It should be noted that the colored material-containing layer contains red pigments and/or red dyes, and thus absorbs light of 350 nm to 600 nm wavelength, but admits light of 600 nm to 900 nm wavelength adopted as a servo beam.

The filter for optical information recording medium including the colored material-containing layer and the dielectric material-deposited layer preferably has a function to admit light of first wavelength and reflect light of second wavelength which is different from the first wavelength, wherein first wavelength is preferably 350 nm to 600 nm, and the second wavelength is preferably 600 nm to 900 nm. To achieve this, an optical information recording medium in which a recording layer, dielectric material-deposited layer, colored material-containing layer and servo pit pattern are laminated in this order from the optical system is preferable.

The filter layer preferably has an optical transmittance of 50% or more, more preferably 80% or more for light of wavelength 655 nm, and 30% or more, more preferably 40% or more for light of wavelength 532 nm, both incident at an angle of within ±40°.

Figure 19:
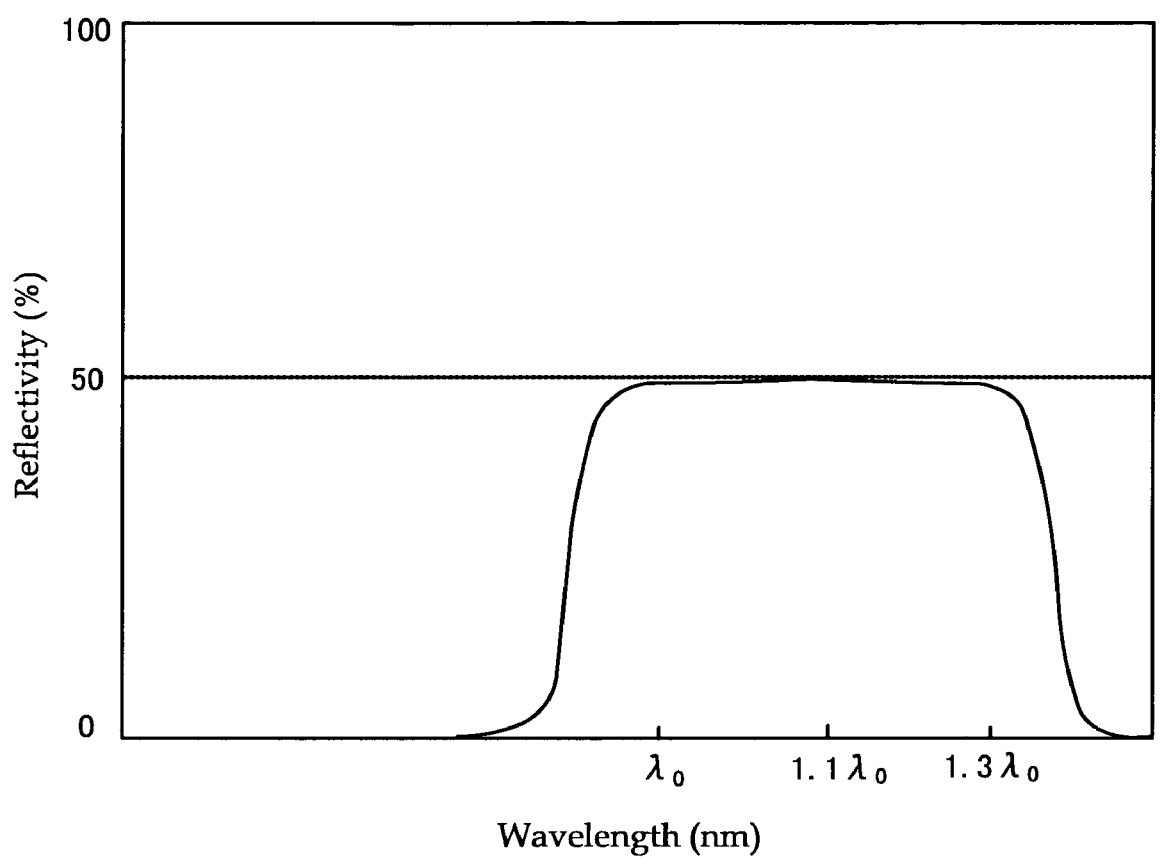
FIG. 19 is a graph showing reflection characteristics of an optical information recording medium filter for incident light from the vertical direction (0°).

More specifically, the filter for optical information recording media including the colored material-containing layer and the dielectric material-deposited layer shows reflection characteristics shown in FIG. 19 for light incident from the vertical direction (0°). In contrast to this, the reflection characteristics peak shifts to shorter wavelengths as light is incident from the oblique directions, and the reflection characteristics is like that shown in FIG. 20 when light is incident at an angle of 40°.

Figure 20:
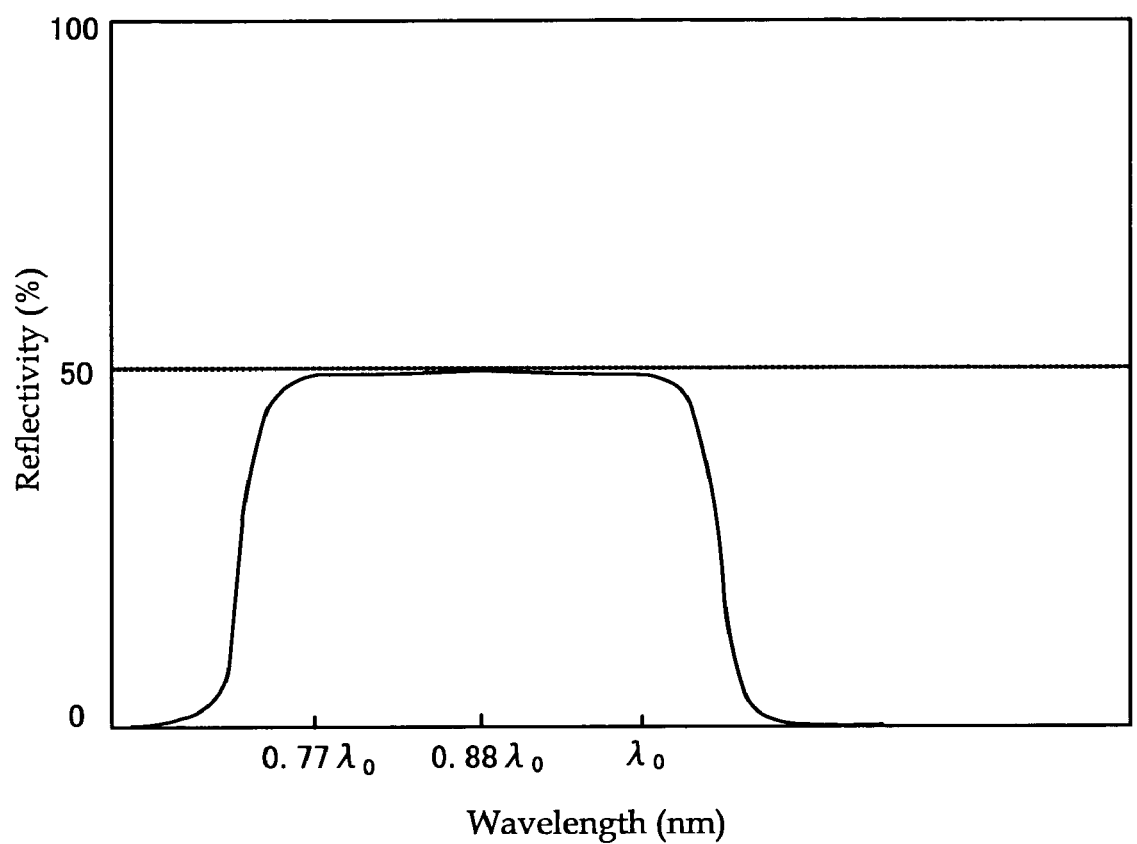
FIG. 20 is a graph showing reflection characteristics of the optical information recording medium filter for incident light from the oblique direction (40°).

The reflection characteristics shown in FIGS. 19 and 20 suggest that reflectivity of 30% or more is ensured for light of wavelength 532 nm even when it is incident to the filter layer at an angle of within ±40°, thereby making it possible to provide a filter layer that causes no problems for the reading of signals.

<Cholesteric Liquid Crystal Layer>

The cholesteric liquid crystal layer contains at least a nematic liquid crystal compound and a chiral compound, and further contains polymerizable mononers, and additional components on as-needed basis.

The cholesteric liquid crystal layer may be either a single-layered cholesteric liquid crystal layer or a multilayered cholesteric liquid crystal layer.

The cholesteric liquid crystal layer preferably has a circularly polarizing function. The cholesteric liquid crystal layer selectively reflects light components which have been circularly polarized in the direction in which the liquid crystal helix rotates (i.e., to the right or left) and which have a wavelength that equals to the pitch of the liquid crystal helix. The cholesteric liquid crystal layer utilizes the selective reflection characteristics to separate a particular circularly polarized component of a particular wavelength from natural light of different wavelengths, and reflects the other light components.

Thus, the cholesteric liquid crystal layer preferably admits light of first wavelength and reflects light of second wavelength which is different from the first wavelength, wherein first wavelength is preferably 350 nm to 600 nm, and the second wavelength is preferably 600 nm to 900 nm.

The cholesteric liquid crystal layer can selectively reflect only light of specific wavelengths; it is difficult to cover wavelengths of visible light. Specifically, the selectively-reflecting wavelength range $\Delta\lambda$ is expressed by the following Equation (1):

$$\Delta\lambda = 2\lambda(ne-no)/(ne+no) \qquad \text{Equation (1)}$$

where "no" represents the refractive index of the nematic liquid crystal molecules for normal light, contained in the cholesteric liquid crystal layer, "ne" represents the refractive index of the nematic liquid crystal molecules for abnormal light, and $\lambda$ represents the central wavelength of light selectively reflected.

As can be seen from Equation (1), $\Delta\lambda$ is dependent on the molecular structure of the nematic liquid crystal itself, and it is possible to increase $\Delta\lambda$ by increasing (ne−no). However, (ne−no) is generally set to 0.3 or less. This is because if (ne−no) is greater than 0.3, it results in poor liquid crystal properties (e.g., alignment characteristics and liquid crystal temperature), making it possible to put the present invention to practical use.

Meanwhile, $\lambda$—the central wavelength of light selectively reflected—in the cholesteric liquid crystal layer is expressed by the following Equation (2):

$$\lambda = (ne+no)P/2 \qquad \text{Equation (2)}$$

where "ne" and "no" are identical to those in Equation (1), and "P" represents a helical pitch length for each turn of the cholesteric liquid crystal helix.

As shown in Equation (2), $\lambda$ is dependent on the mean refractive index and on helical pitch length P of the cholesteric liquid crystal layer if the helical pitch is constant. Thus, to secure a large $\Delta\lambda$ value, the cholesteric liquid crystal layers preferably have different $\lambda$ values and the helices preferably rotate to the same direction (i.e., to the right or left). The ranges of $\lambda$ in the cholesteric liquid crystal layers are preferably continuous with each other. As used herein "continuous" means that there are no distinct intervals between adjacent $\lambda$ ranges—$\lambda_0$ to $\lambda_0/\cos 20°$ (more preferably $\lambda_0$ to $\lambda_0/\cos 40°$), inside of which reflectivity of 40% or more is substantially ensured.

Accordingly, each interval between $\lambda$ ranges of the cholesteric liquid crystal layers is preferably within a range which is continuous with at least another $\lambda$ range.

The filter for optical information recording media preferably has an optical transmittance of 40% or more for light of a wavelength range of $\lambda_0$ to $\lambda_0/\cos 20°$ (where $\lambda_0$ represents the wavelength of irradiation light) incident at an angle of ±20° (measured from the normal of the surface of the recording layer). Most preferably, the filter for optical information recording media has an optical transmittance of 40% or more for light of a wavelength range of $\lambda_0$ to $\lambda_0/\cos 40°$ (where $\lambda_0$ represents the wavelength of irradiation light) incident at an angle of ±40° (measured from the normal of the surface of the recording layer). If the optical reflectivity is 40% or more for light of a wavelength range of $\lambda_0$ to $\lambda_0/\cos 20°$, especially $\lambda$ to $\lambda/\cos 40°$ (where $\lambda_0$ represents the wavelength of irradiation light), it is made possible to eliminate the dependency of reflectivity on incident angle and to adopt optical lens system that is used for general optical information recording media.

Figure 28:
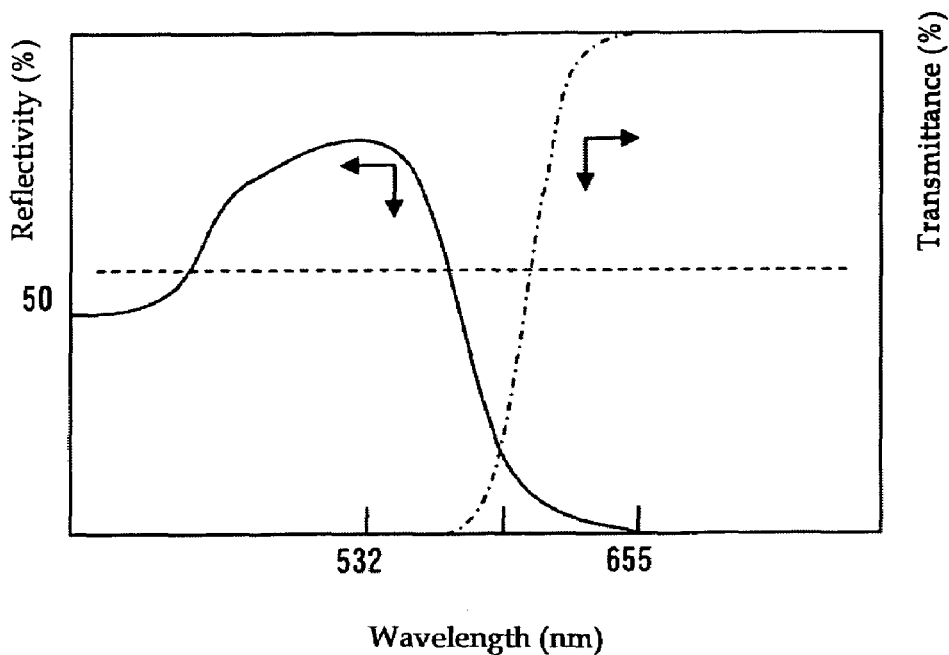
FIG. 28 is a graph showing reflection characteristics of an optical information recording filter for incident light from the vertical direction (0°).
Figure 29:
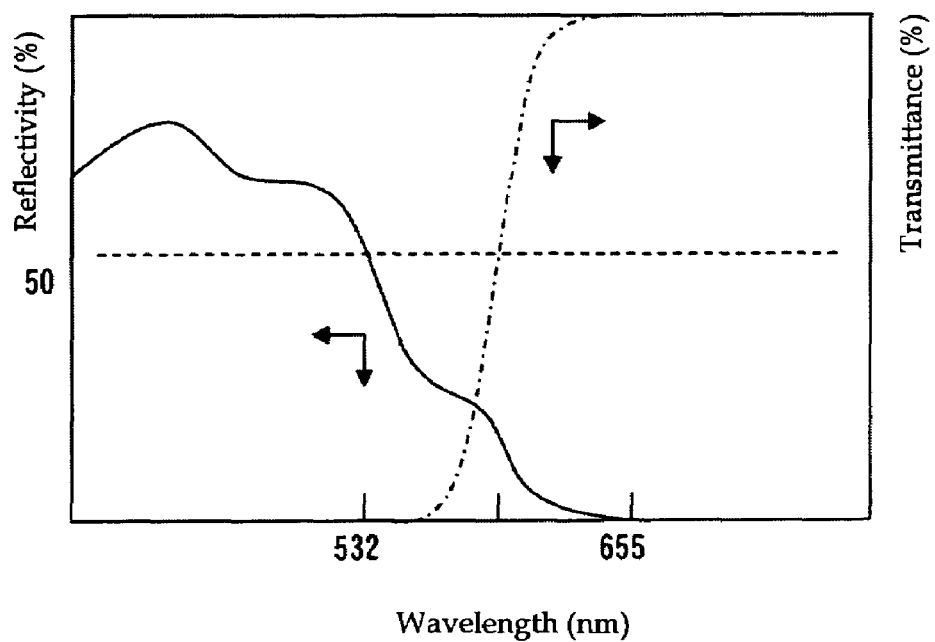
FIG. 29 is a graph showing reflection characteristics of the optical information recording filter for incident light from the oblique direction (40°).

More specifically, when a single-layer cholesteric liquid crystal layer is used, photoreactive chiral compounds whose helical pitch can be largely altered by irradiation with light are used. By adjusting the content of the photoreactive chiral compound and UV irradiation time, it is possible to provide a filter for optical information recording media, in which helical pitch is continuously changed in the thickness direction of the liquid crystal layer. FIG. 28 indicates that the reflectivity is 40% or more for light incident from the vertical direction at an angle of 0°. In contrast to this, the reflection characteristics peak gradually shifts to shorter wavelengths as light is incident from the oblique directions, and the reflection characteristics is like that shown in FIG. 29 when light is incident to the liquid crystal layer at an angle of 40°.

Figure 21:
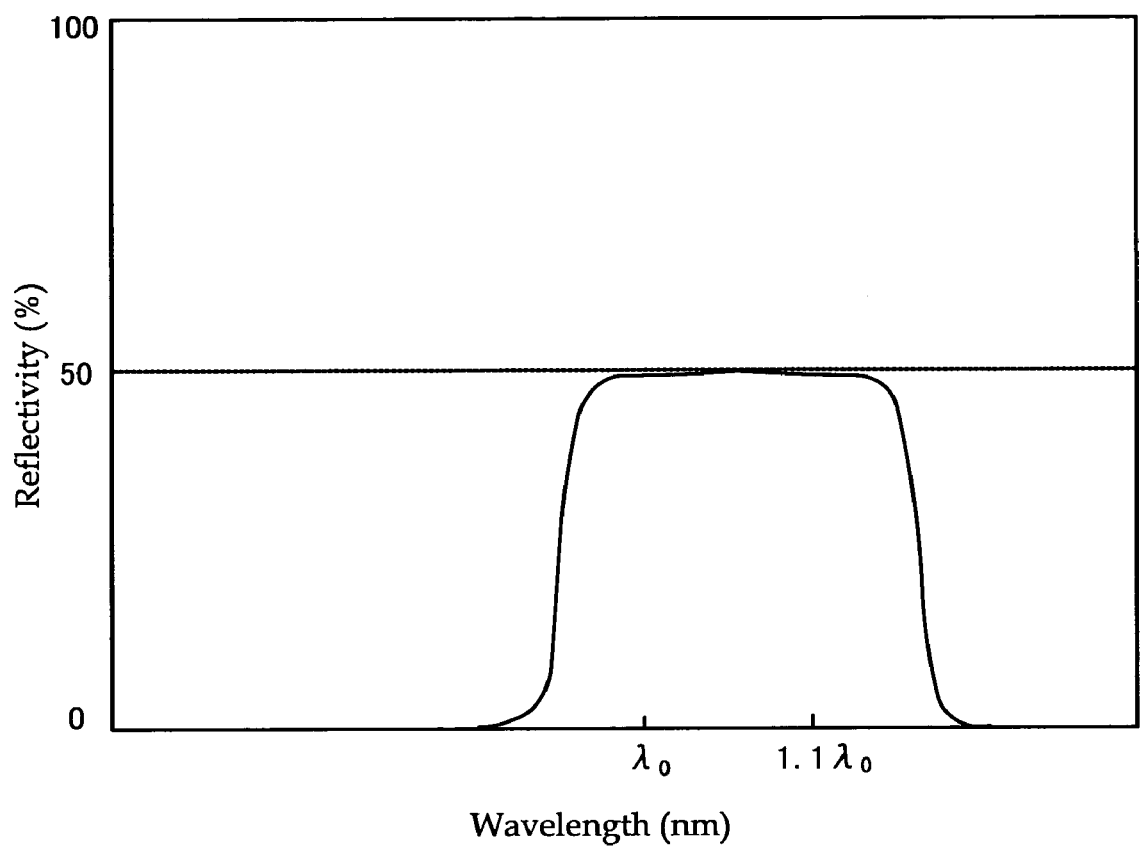
FIG. 21 is a graph showing reflection characteristics of another optical information recording medium filter for incident light from the vertical direction (0°).
Figure 22:
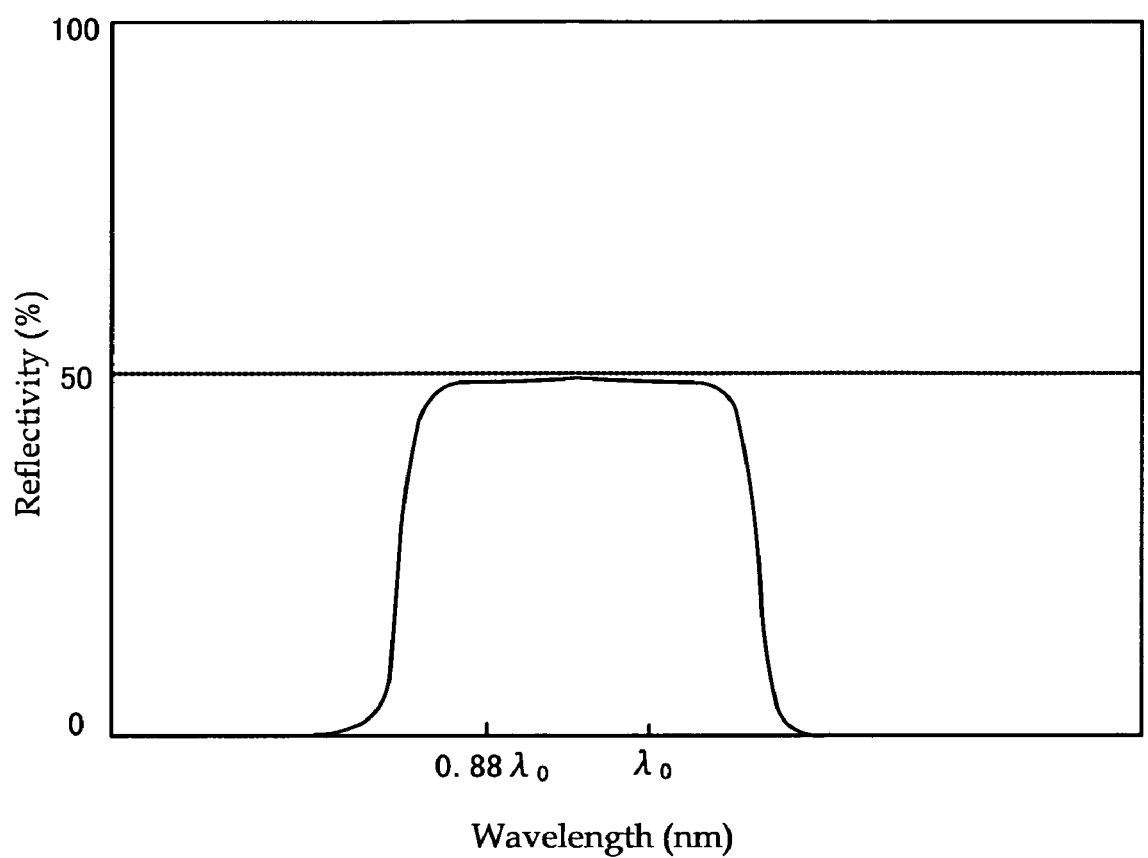
FIG. 22 is a graph showing reflection characteristics of the optical information recording medium filter of FIG. 21 for incident light from the oblique direction (20°).

Similarly, by adjusting the content of the photoreactive chiral compound and UV irradiation time to continuously change helical pitch in the thickness direction of the liquid crystal layer, a filter for optical information recording media with reflectivity characteristics shown in FIG. 21 can be obtained. FIG. 21 indicates that the reflectivity is 40% or more for light incident from the vertical direction at an angle of 0°. In contrast to this, the reflection characteristics peak gradually shifts to shorter wavelengths as light is incident from the oblique directions, and the reflection characteristics is like that shown in FIG. 22 when light is incident to the liquid crystal layer at an angle of 20°.

Note that with respect to the reflection range of $\lambda_0$ to $1.3\lambda_0$, $1.3\lambda_0$ shown in FIG. 19, $1.3\lambda_0$ equals to 692 nm when $\lambda_0$ is 532 nm, and thus a servo beam of wavelength 655 nm is undesirably reflected. This reflection range is set in view of light incident at an angle of ±40°. However, when such light that is incident at larger angles is intended to be used, a servo operation can be performed without causing any problems by using a servo beam incident at an angle of within ±20° that has been masked. In addition, by securing larger helical pitch in the cholesteric liquid crystal layer in the filter layer used, it is also possible to readily cover a servo beam incident to the filter layer at an angle of within ±20°. In that case, it is only necessary to prepare a cholesteric liquid crystal layer with a reflection range of $\lambda_0$ to $1.1\lambda_0$ as shown in FIG. 21. Thus, transmittance of the servo beam entails no difficulty.

The reflection characteristics shown in FIGS. 19 to 22 suggest that in the filter for the optical information recording medium of the present invention, reflectivity of 40% or more is ensured even when light is incident to a single-layer cholesteric liquid crystal layer at an angle of 0° to 20° (more preferably 0° to 40°), thereby making it possible to provide a filter for optical information recording media which causes no problems upon reading of signals.

The selectively-reflecting wavelength range of the cholesteric liquid crystal layer is preferably 100 nm or more, more preferably 150 nm to 300 nm. If selectively-reflecting wavelength range of the cholesteric liquid crystal layer is less than 100 nm, it may result in poor reflecting properties for light incident at an angle of within ±20°.

Figure 23:
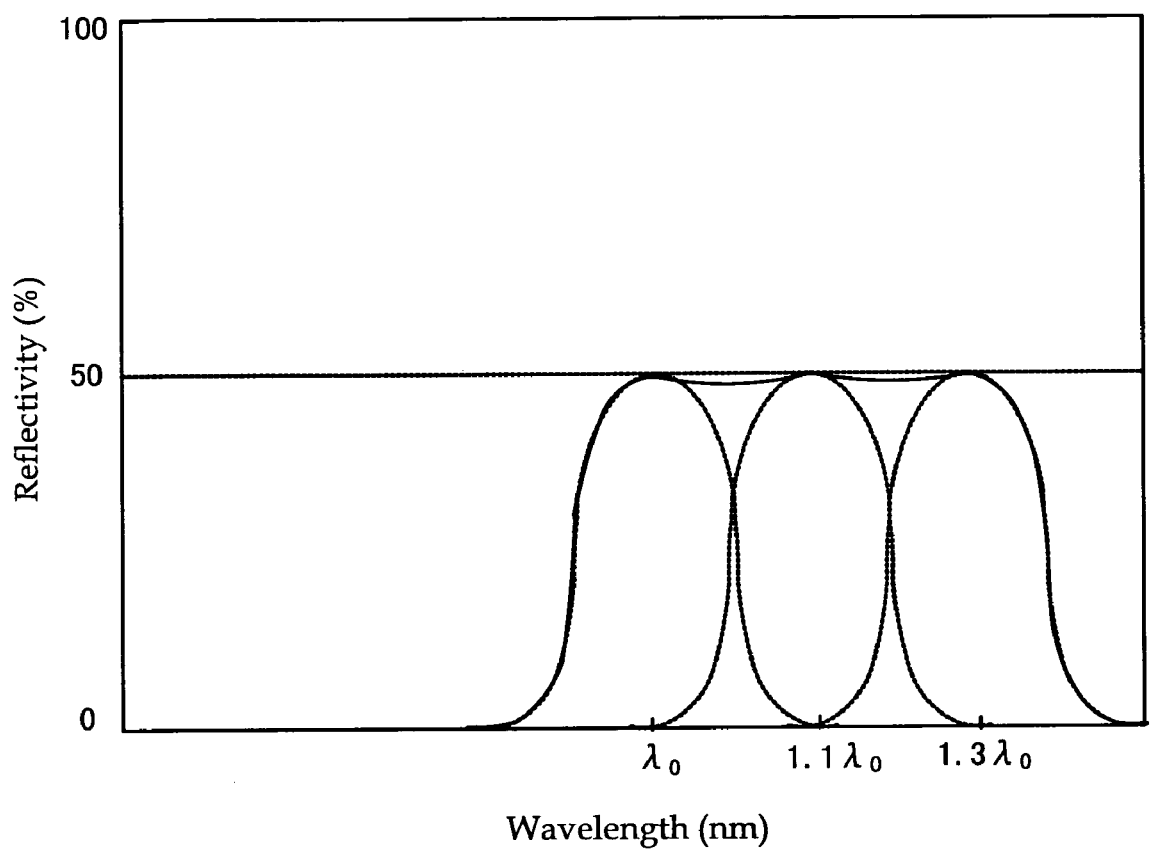
FIG. 23 is a graph showing reflection characteristics of an optical information recording medium filter, which is a laminate of three cholesteric liquid crystal layers, for incident light from the vertical direction (0°).
Figure 24:
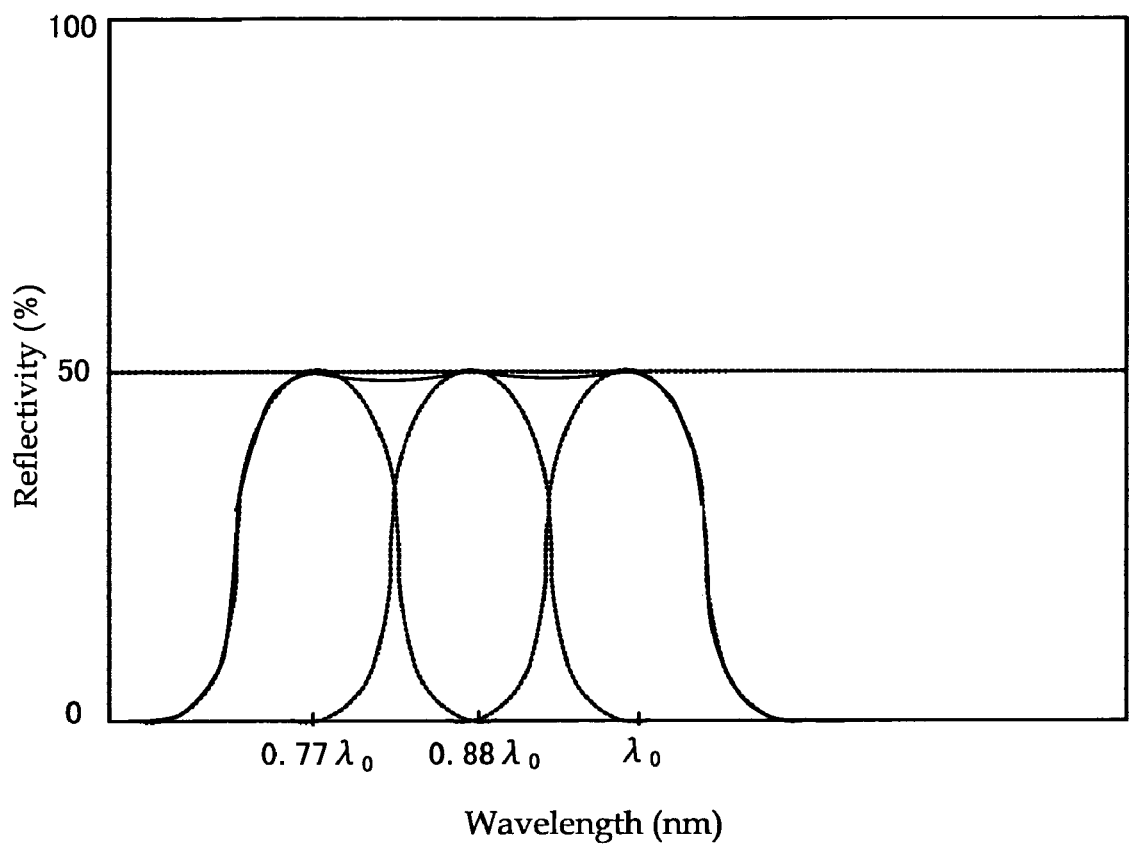
FIG. 24 is a graph showing reflection characteristics of the optical information recording medium filter, which is a laminate of three cholesteric liquid crystal layers, for incident light from the oblique direction (40°).

When a multilayered cholesteric liquid crystal layer in which three cholesteric liquid crystal layers with different $\lambda$ values, where the helices rotate to the same direction, are laminated is used, a filter for optical information recording media with reflection characteristics as shown in FIG. 23 can be obtained. FIG. 23 indicates that the reflectivity is 40% or more for light incident from the vertical direction at an angle of 0°. In contrast to this, the reflection characteristics peak gradually shifts to shorter wavelengths as light is incident from the oblique directions, and the reflection characteristics is like that shown in FIG. 24 when light is incident to the liquid crystal layer at an angle of 40°.

Figure 25:
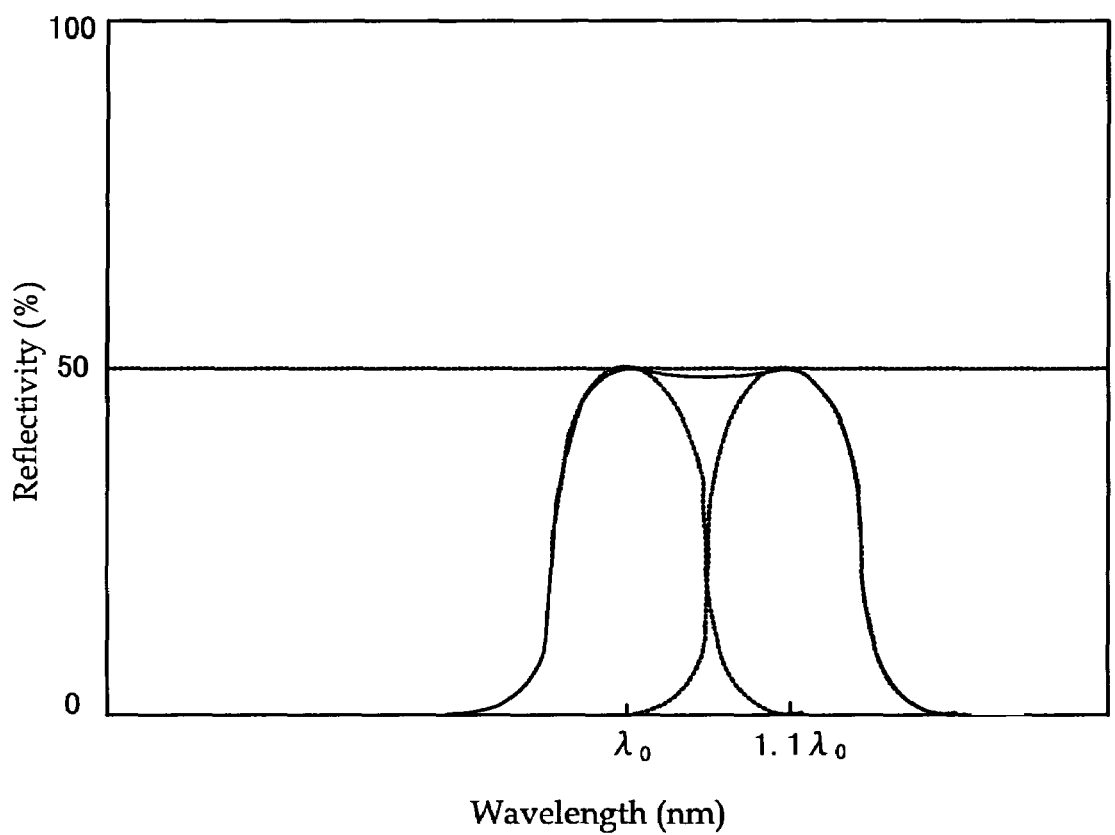
FIG. 25 is a graph showing reflection characteristics of an optical information recording medium filter, which is a laminate of two cholesteric liquid crystal layers, for incident light from the vertical direction (0°).

Similarly, when a multilayered cholesteric liquid crystal layer in which two cholesteric liquid crystal layers with different $\lambda$ values, where the helices rotate to the same direction, are laminated is used, a filter for optical information recording media with reflection characteristics as shown in FIG. 25 can be obtained. FIG. 23 indicates that the reflectivity is 40% or more for light incident from the vertical direction at an angle of 0°. In contrast to this, the reflection characteristics peak gradually shifts to shorter wavelengths as light is incident from the oblique directions, and the reflection characteristics is like that shown in FIG. 26 when light is incident to the liquid crystal layer at an angle of 20°.

Note that with respect to the reflection range of $\lambda_0$ to $1.3\lambda_0$, $1.3\lambda_0$ shown in FIG. 23, $1.3\lambda_0$ equals to 692 nm when $\lambda_0$ is 532 nm, and thus a servo beam of wavelength 655 nm is undesirably reflected. This reflection range is set in view of light incident at an angle of ±40°. However, when such light that is incident at larger angles is intended to be used, a servo operation can be performed without causing any problems by using a servo beam incident at an angle of within ±20° that has been masked. In addition, by securing larger mean refractive index in cholesteric liquid crystal layers in the filter layer used, it is also possible to readily cover a servo beam incident to the filter layer at an angle of within ±20°. In that case, it is only necessary to prepare two-layered cholesteric liquid crystal layer with a reflection range of $\lambda_0$ to $1.1\lambda_0$ as shown in FIG. 25. Thus, transmittance of the servo beam entails no difficulty.

The reflection characteristics shown in FIGS. 23 to 26 suggest that in the filter for the optical information recording medium of the present invention, reflectivity of 40% or more is ensured even when light is incident to a multilayered cholesteric liquid crystal layer at an angle of 0° to 20° (more preferably 0° to 40°), thereby making it possible to provide a filter for optical information recording media which causes no problems upon reading of signals.

The cholesteric liquid crystal layer is not particularly limited as long as it has the foregoing characteristics, and can be appropriately selected depending on the intended purpose. As described above, the cholesteric liquid crystal layer contains a nematic liquid crystal compound and a chiral compound, and further contains polymerizable monomers, and additional components on as-needed basis.

—Nematic Liquid Crystal Compounds—

The nematic liquid crystal compounds features that their liquid crystal phase solidifies under the liquid crystal transition temperature, and can be appropriately selected from liquid crystal compounds, high-molecular liquid crystal compounds and polymerizable liquid crystal compounds, all of which have refractive index anisotropy $\Delta n$ of 0.10 to 0.40. For example, such nematic liquid crystal compound molecules that are in the liquid crystal state by treatment with heat can be aligned by use of a surface-rubbed alignment substrate, followed by a cooling treatment or the like to allow them to be immobilized to the substrate to serve as a solid phase.

The nematic liquid crystal compounds are not particularly limited and can be appropriately selected depending on the intended purpose; examples thereof include the compounds listed below.

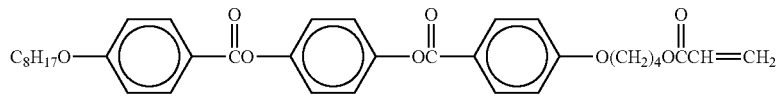

-continued
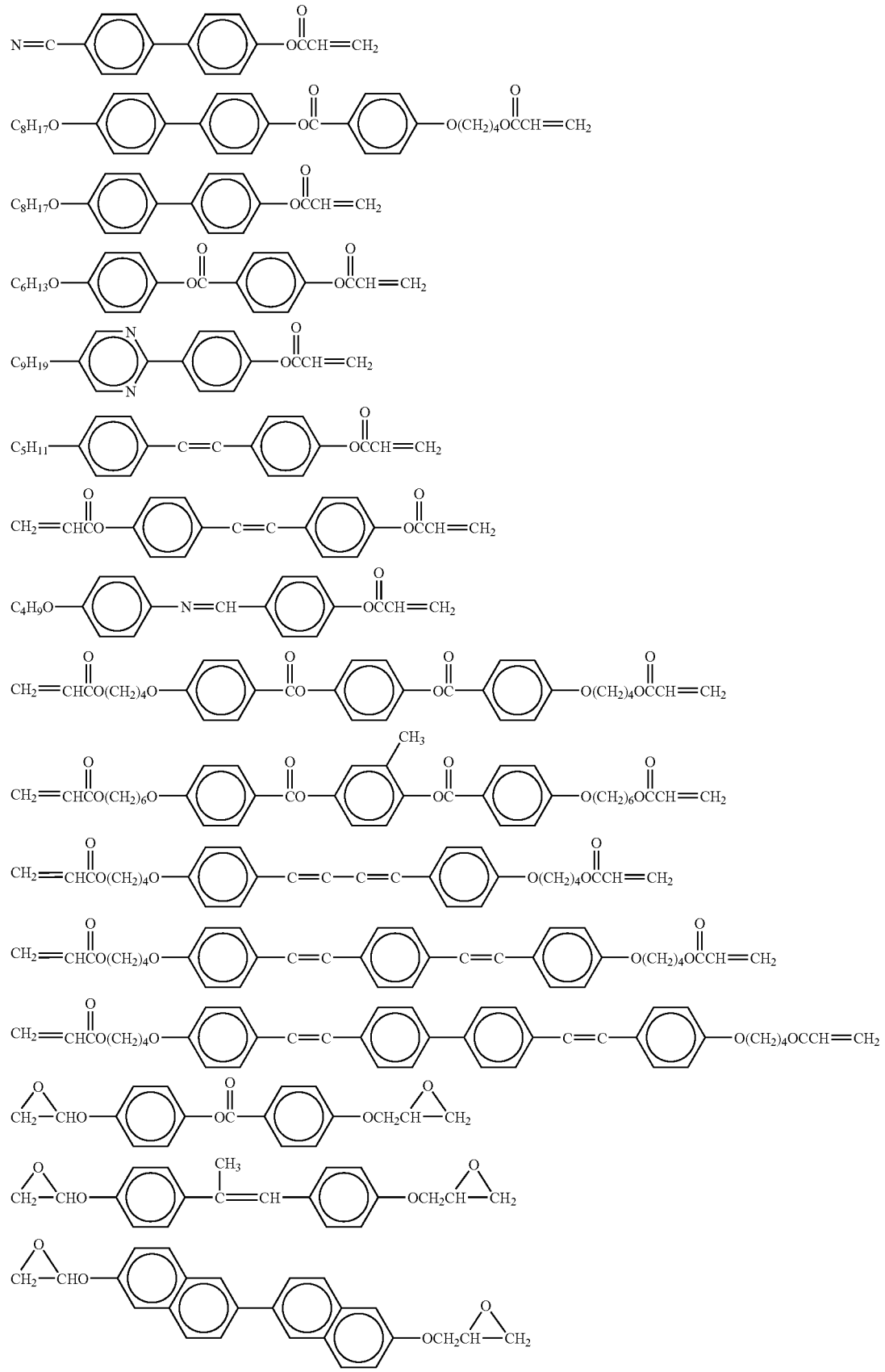

-continued

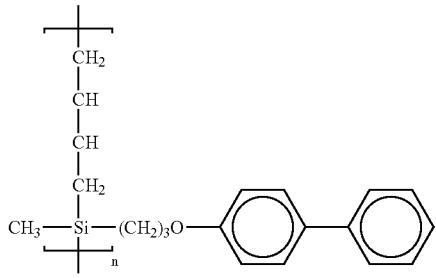

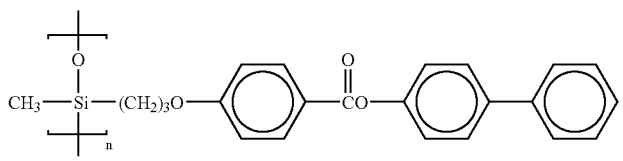

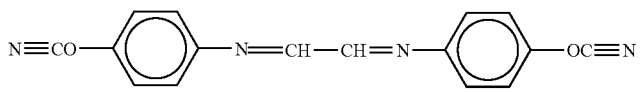

(30)

where n represents an integer of 1 to 1,000. Note in each of the listed compounds that spacers connecting between adjacent moieties may be changed those listed below, and such altered compounds are also suitably used.

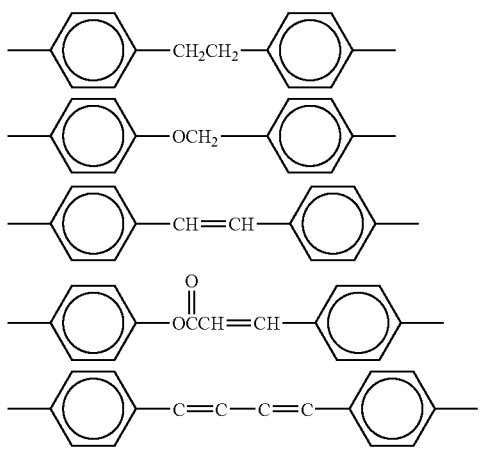

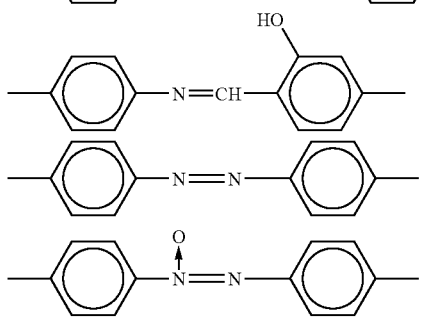

Among the compounds listed above, nematic liquid crystal compounds that have polymerizable groups in their molecule are preferable for the purpose of ensuring sufficient curing capability, and ultraviolet (UV) polymerizable liquid crystal compounds are suitably used. Examples of such ultraviolet (UV) polymerizable liquid crystal compounds include the following commercially available products: PALIOCOLOR LC242 (bland name, produced by BASF Corp.); E7 (bland name, produced by Merck Ltd.); LC-Silicon-CC3767 (bland name, produced by Wacker-Chem); and L35, L42, L55, L59, L63, L79 and L83 (bland name, produced by Takasago International Corp.).

The content of the nematic liquid crystal compound is preferably 30% by mass to 99% by mass, more preferably 50% by mass to 99% by mass of the total solid components in each of the cholesteric liquid crystal layer. If the content of the nematic liquid crystal compound is less than 30% by mass, it may result in poor alignment of nematic liquid crystal molecules.

—Chiral Compounds—

In the case of a multilayered cholesteric liquid crystal layer, the chiral compound is not particularly limited and can be appropriately selected from those known in the art; in view of the hues of the liquid crystal compounds and for enhanced color purity, for example, isomannide compounds, catechine compounds, isosorbide compounds, fenchone compounds and carvone compounds can be used. In addition to these compounds, the compounds listed below can be used. These chiral compounds may be used singly or in combination.

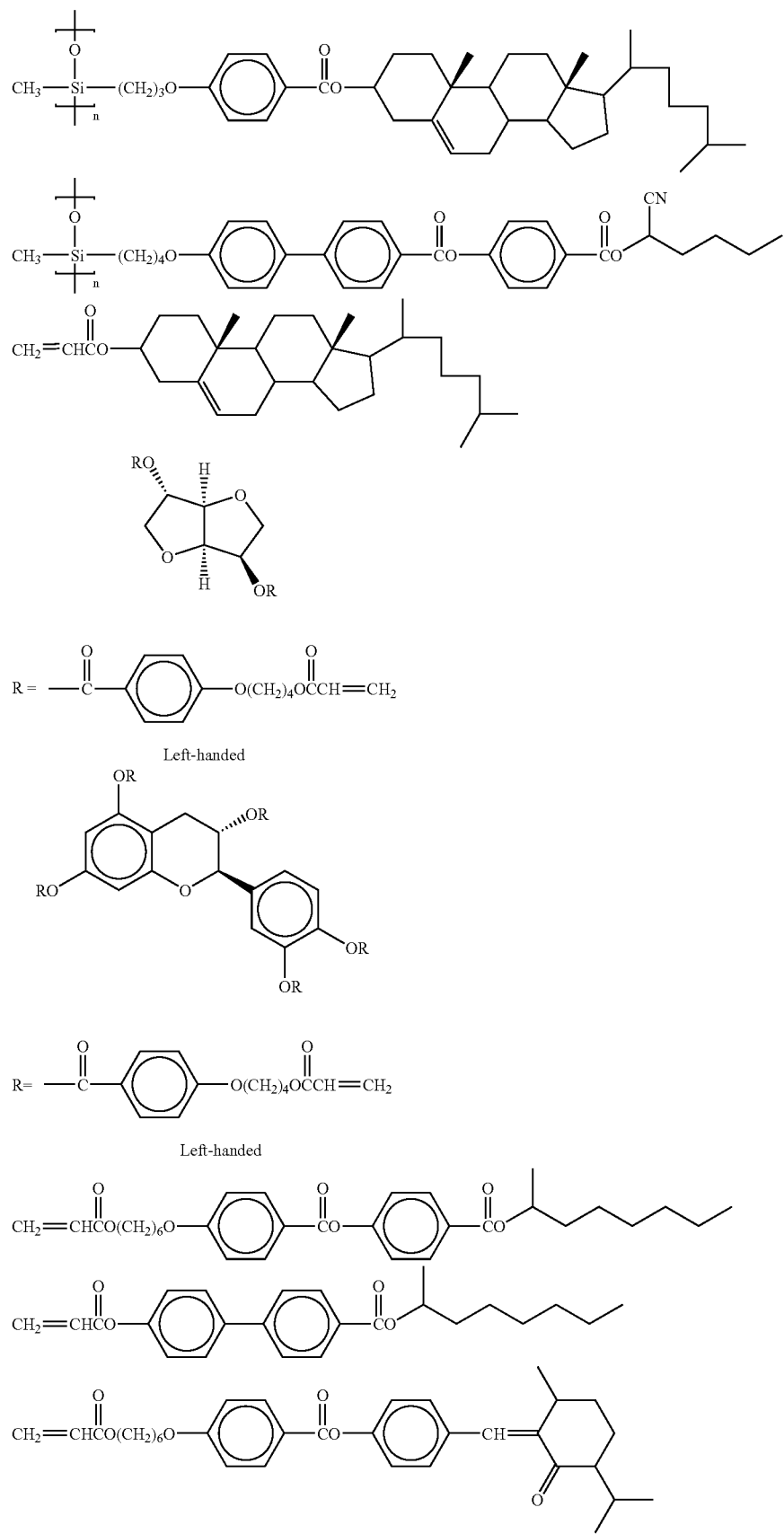

-continued

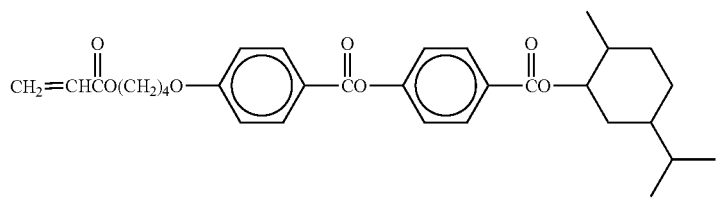

In addition, commercially available chiral compounds can also be used; examples thereof include S101, R811 and CB15 (bland name, produced by Merck Ltd.); and PALIOCOLOR LC756 (bland name, produced by BASF Corp.).

The content of the chiral compound in each liquid crystal layer of the multilayered cholesteric liquid crystal layer is preferably 0% by mass to 30% by mass, more preferably 0% by mass to 20% by mass of the total solid components in each liquid crystal layer. If the content of the chiral compound is greater than 30% by mass, it may result in poor alignment of cholesteric liquid crystal molecules.

In the case of a single-layered cholesteric liquid crystal layer, photoreactive chiral compounds whose helical pitch can be largely altered by irradiation with light are suitably used.

The photoreactive chiral compound means a chiral compound that has a photosensitivity, whose helical pitch can be largely altered by irradiation with light.

The photoreactive chiral compound has a chiral site and a photoreactive group, wherein the chiral site is preferably at least one species selected from isosorbide compounds, isomannide compounds and binaphthol compounds.

The photoreactive group is preferably a group that undergoes trans-cis isomerization about a carbon-carbon double bond upon irradiation with light.

The isosorbide compound is not particularly limited and can be appropriately selected depending on the intended purpose; examples thereof include those disclosed in Japanese Patent Application Laid-Open (JP-A) Nos. 2002-80851, 2002-179681, 2002-179682, 2002-338575, 2002-338668, 2003-306490, 2003-306491, 2003-313187, 2003-313292 and 2003-313189.

The isomannide compound is not particularly limited and can be appropriately selected depending on the intended purpose; examples thereof include those disclosed in Japanese Patent Application Laid-Open (JP-A) Nos. 2002-80478 and 2003-313188.

The binaphthol compound is not particularly limited and can be appropriately selected depending on the intended purpose; examples thereof include those disclosed in Japanese Patent Application Laid-Open (JP-A) Nos. 2002-302487, 2002-179670 and 2002-179669.

Specific examples the photoreactive chiral compounds include compounds shown below.

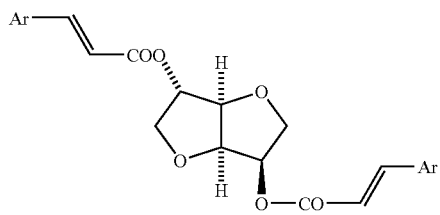

where Ar represents any of the following moieties (1) to (6)

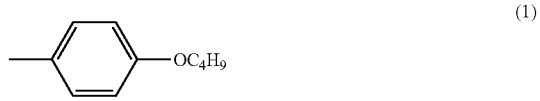

(1)

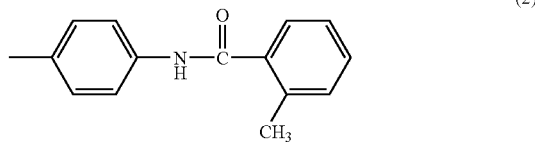

(2)

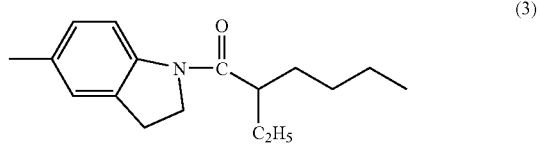

(3)

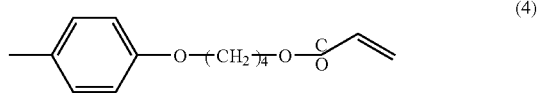

(4)

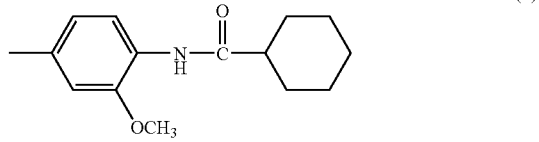

(5)

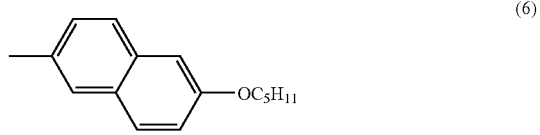

(6)

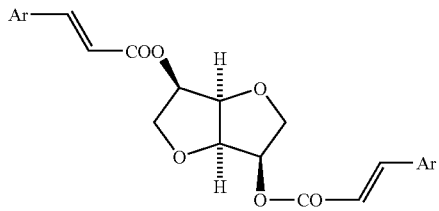

where Ar represents any of the following moieties (7) to (12)

(7)
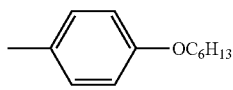

(8)
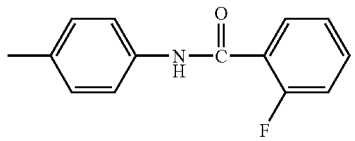

(9)
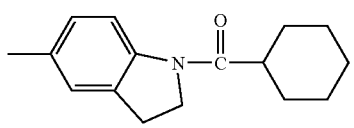

(10)
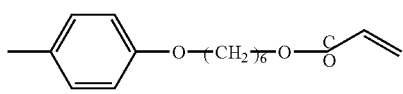

(11)
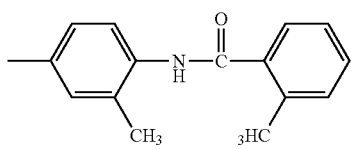

(12)
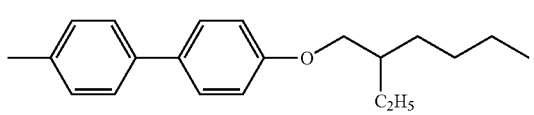

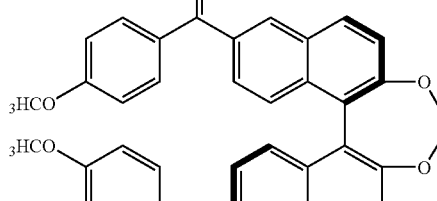

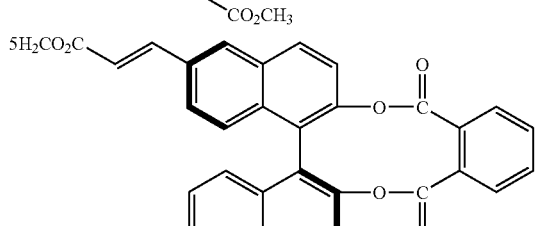

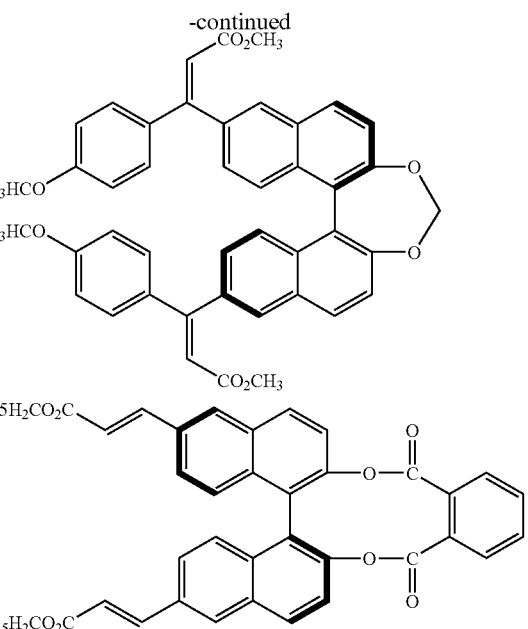

The content of the photoreactive chiral compound in the single-layered cholesteric liquid crystal layer is 1% by mass to 30% by mass, more preferably 1% by mass to 20% by mass of the total solid components in the liquid crystal layer. If the content of the photoreactive chiral compound is less than 1% by mass, it may result in too long helical pitch, which is outside the wavelength range that can be adopted for the intended system. If the content of the photoreactive chiral compound is greater than 30% by mass, it may result in poor alignment of cholesteric liquid crystal molecules.

—Polymerizable Monomers—

It is also possible to add polymerizable monomers to the cholesteric liquid crystal layer in order to, for example, increase the degree of cure in the layer (e.g., layer strength). Combined use of polymerizable monomers can increase the strength the cholesteric liquid crystal layer, where different twisting degrees have been set for liquid crystals through which light propagates (e.g., the distribution of wavelengths of light to be reflected has been created) and where the helical structure (i.e., selective reflection capability) has been fixed. Note, however, that such polymerizable monomers need not necessarily be added if the liquid crystal compound bears polymerizable groups in a molecule.

The polymerizable monomers are not particularly limited and can be appropriately selected from those known in the art; examples thereof include monomers bearing ethylenically unsaturated bonds, and specific examples such monomers include multifunctional monomers such as pentaerythritoltetraacrylate and dipentaerythritolhexaacrylate.

In addition, the compounds listed below can also be cited as specific examples of monomers bearing ethylenically unsaturated bonds. These monomers can be used singly or in combination.

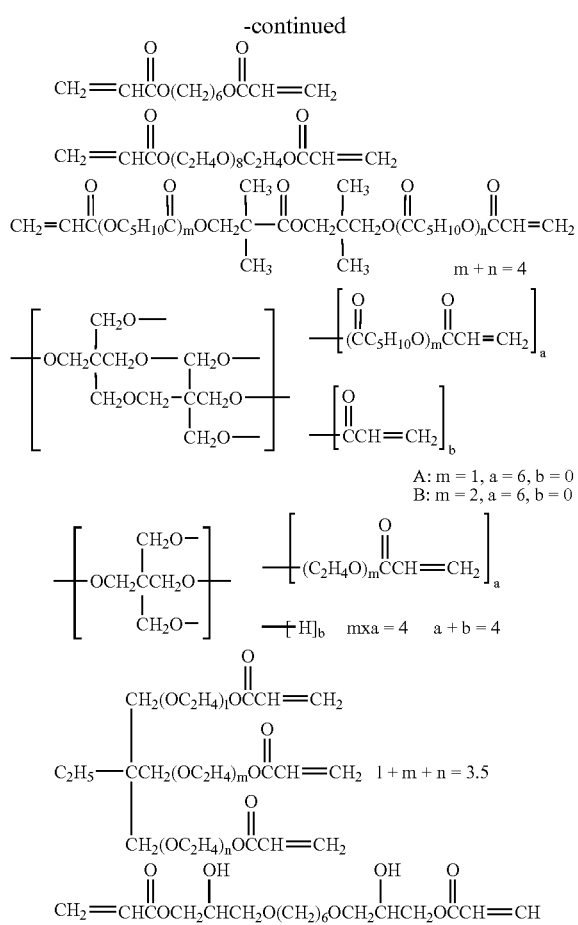

The content of the polymerizable monomers is preferably 50% by mass or less, more preferably 1% by mass to 20% by mass of the total solid components in the cholesteric liquid crystal layer. If the content the polymerizable monomers is greater than 50% by mass, it may inhibit the alignment of cholesteric liquid crystal molecules.

—Additional Components—

The additional components are not particularly limited and can be appropriately selected depending on the intended purpose; examples thereof include photoinitiators, sensitizers, binder resins, polymerization inhibitors, solvents, surfactants, thickeners, dyes, pigments, ultraviolet absorbers and gelling agents.

The photoinitiators are particularly limited and can be appropriately selected from those known in the art; examples thereof include p-methoxyphenyl-2,4-bis(trichloromethyl)-s-triazine, 2-(p-buthoxystyryl)-5-trichloromethyl-1,3,4-oxadiazole, 9-phenylacridine, 9,10-dimethylbenzphenazine, benzophenone/Michler's ketone, hexaarylbiimidazole/mercaptobenzoimidazole and benzyldimethylketal, thioxanthone/amine. These photoinitiators may be used singly or in combination.

In addition, commercially available photoinitiators can also be used; examples thereof include IRGA CURE 907, IRGA CURE 369, IRGA CURE 784 and IRGA CURE 814 (bland name, produced by Chiba Specialty Chemicals KK); and Lucirin TPO (bland name, produced by BASF Corp.).

The content of the photoinitiator is preferably 0.1% by mass to 20% by mass, more preferably 0.5% by mass to 5% by mass of the total solid components in the cholesteric liquid crystal layer. If the content of the photoinitiator is less than 0.1% by mass, it may take long time for the polymerization because of reduced curing efficiency upon irradiation with light. If the content of the photoinitiator is greater than 20% by mass, it may result in poor optical transmittance over the spectrum from ultraviolet to visible light.

The sensitizer is added on an as-needed basis in order to increase the degree of cure in the cholesteric liquid crystal layer.

The sensitizer is not particularly limited and can be appropriately selected from those known in the art; examples thereof include diethylthioxanthone and isopropylthioxanthone.

The content of the sensitizer is preferably 0.001% by mass to 1% by mass of the total solid components in the cholesteric liquid crystal layer.

The binder resin is not particularly limited and can be appropriately selected from those known in the art; examples thereof include polyvinyl alcohols; polystyrene compounds such as polystyrene and poly-α-methylstyrene; cellulose resins such as methylcellulose, ethylcellulose and acetylcellulose; acid cellulose derivatives bearing carboxylic groups on their side chains; acetal resins such as polyvinyl formal and polyvinyl butyral; methacrylic acid copolymers; acrylic acid copolymers; itaconic acid copolymers; crotonic acid copolymers; malleic acid copolymers; partially-esterified malleic acid copolymers; homopolymers of acrylic acid alkylesters or homopolymers of methacrylic acid alkyl esters; and polymers with additional hydroxyl groups. These binder resins may be used singly or in combination.

Examples of alkyl groups in the homopolymers of acrylic acid alkylesters or homopolymers of methacrylic acid alkyl esters include methyl group, ethyl group, n-propyl group, n-butyl group, iso-butyl group, n-hexyl group, cyclohexyl group and 2-ethylhexyl group.

Examples of the polymers with additional hydroxyl groups include benzyl(meth)acrylate/(homopolymers of methacrylic acid) acrylic acid copolymers, and multicomponent copolymers of benzyl(meth)acrylate/(meth)acrylic acid/other monomers.

The content of the binder resin is preferably 0% by mass to 80% by mass, more preferably 0% by mass to 50% by mass of the total solid components in the cholesteric liquid crystal layer. If the content the polymerizable monomers is greater than 80% by mass, it may result in poor alignment of cholesteric liquid crystal molecules.

The polymerization inhibitor is not particularly limited and can be appropriately selected depending on the intended purpose; examples thereof include hydroquinones, hydroquinone monoethylethers, phenothiazines, benzoquinones and derivatives thereof.

The content of the polymerization inhibitor is preferably 10% by mass or less, more preferably 0.01% by mass to 1% by mass of the total solid components in the polymerizable monomers.

The solvent is not particularly limited and can be appropriately selected from those known in the art; examples thereof include alkoxypropionic acid esters such as 3-methoxypropionic acid methylester, 3-methoxypropionic acid ethylester, 3-methoxypropionic acid propylester, 3-ethoxypropionic acid methylester, 3-ethoxypropionic acid ethylester and 3-ethoxypropionic acid propylester; alkoxy alcohol esters such as 2-methoxypropylacetate, 2-ethoxypropylacetate and 3-methoxybutylacetate; lactic acid esters such as methyl lactate and ethyl lactate; ketones such as methyl ethyl ketone, cyclohexanone and methylcyclohexanone; γ-butyrolactone; N-methylpyrrolidone; dimethylsulfoxide; chloroform; and tetrahydrofuran. These solvents may be used singly or in combination.

The cholesteric liquid crystal layer can be formed in the following procedure: For example, a coating solution for cholesteric liquid crystal layer prepared by use of the solvent is applied on the base material (note that this coating solution is prepared for each liquid crystal layer in the case of a multilayered cholesteric liquid crystal layer). Thereafter, the coating solution is dried, and cured by irradiating it with ultraviolet light.

For mass production, the cholesteric liquid crystal layer can be formed in the following procedure: The base material is previously wound in a roll shape, and the coating solution is then applied on the base material using a long, continuous coater such as a bar coater, die coater, blade coater, or curtain coater.

Examples of the coating method include a spin coating method, casting method, roll coating method, flow coating method, printing method, dip coating method, casting deposition method, bar coating method and gravure printing method.

The UV irradiation condition is not particularly limited and can be appropriately determined depending on the intended purpose; the wavelength of UV light to be applied is preferably 160 nm to 380 nm, more preferably 250 nm to 380 nm; irradiation time is preferably 0.1 second to 600 seconds, more preferably 0.3 second to 300 seconds. By adjusting the UV irradiation condition, it is possible change the helical pitch of the cholesteric liquid crystals continuously in the thickness direction of the liquid crystal layer.

It is also possible to add an ultraviolet absorber to the cholesteric liquid crystal layer in order to adjust the UV irradiation condition. The ultraviolet absorber is not particularly limited and can be appropriately selected depending on the intended purpose; suitable examples thereof include benzophenone ultraviolet absorbers, benzotriazole ultraviolet absorbers, salicylic acid ultraviolet absorbers, cyanoacrylate ultraviolet absorbers and oxalic acid anilide ultraviolet absorbers. Specific examples of these ultraviolet absorbers are disclosed in Japanese Patent Application Laid-Open (JP-A) Nos. 47-10537, 58-111942, 58-212844, 59-19945, 5946646, 59-109055 and 63-53544; Japanese Patent Application Publication (JP-B) Nos. 36-10466, 42-26187, 48-30492, 48-31255, 48-41572 and 48-54965, 50-10726; and U.S. Pat. Nos. 2,719,086, 3,707,375, 3,754,919 and 4,220,711.

In the case of a multilayered colesteric liquid crystal layer, the thickness of each cholesteric liquid crystal layer is preferably 1 μm to 10 μm, more preferably 2 μm to 7 μm. If the thickness of the cholesteric liquid crystal layer is less than 1 μm, it results in poor selective reflectivity. If the thickness of the cholesteric liquid crystal layer is greater than 10 μm, uniformly aligned liquid crystal molecules in the cholesteric liquid crystal layer may orient in random directions.

The total thickness of the cholesteric liquid crystal layer in a multilayered cholesteric liquid crystal layer (or the thickness of a single-layered liquid crystal layer) is preferably 1 μm to 30 μm, more preferably 3 μm to 10 μm.

<The Production Process for a Filter for Optical Information Recording Medium which has a Colesteric Liquid Crystal Layer>

The process for producing the filter is not particularly limited and can be appropriately selected depending on the intended purpose. For example, as described above, the filter can be produced by forming a colored material-containing layer on the base material with a coating method and forming a colesteric liquid crystal on the colored material-containing layer with a coating method.

The filter for optical information recording media is not particularly limited and can be appropriately selected depending on the intended purpose. The filter is preferably processed into a disc-shape for each base material through, for example, a stamping process, and is preferably disposed on the second substrate of an optical information recording medium. Alternatively, the filter can be directly disposed on the second substrate without interposing a base material between them in a case where the filter is intended to be used for the filter layer of the optical information recording medium.

The filter for optical information recording media, in which a colored material-containing layer and a cholesteric liquid crystal layer are combined, preferably has an optical transmittance of 80% or more for light 655 nm wavelength and 40% or more for light 532 nm wavelength, both incident to the filter layer at an angle within ±20°.

More specifically, the filter for optical information recording media having a dielectric material-deposited layer on a colored material-containing layer shows reflection characteristics shown in FIG. 25 for light incident from the vertical direction (0°). In contrast to this, the reflection characteristics peak shifts to shorter wavelengths as light is incident from the oblique directions, and the reflection characteristics is like that shown in FIG. 26 when light is incident at an angle of 20°.

Figure 26:
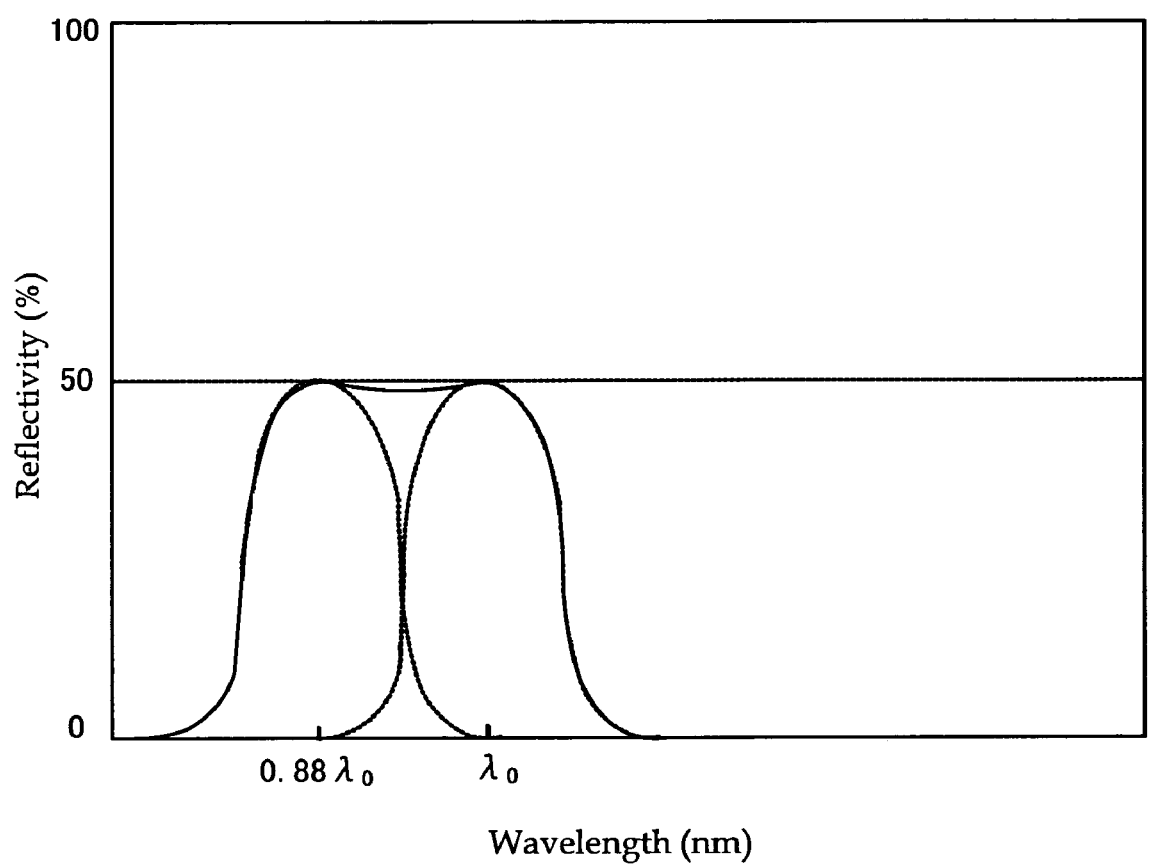
FIG. 26 is a graph showing reflection characteristics of an optical information recording medium filter, which is a laminate of two cholesteric liquid crystal layers, for incident light from the oblique direction (20°).
Figure 27:
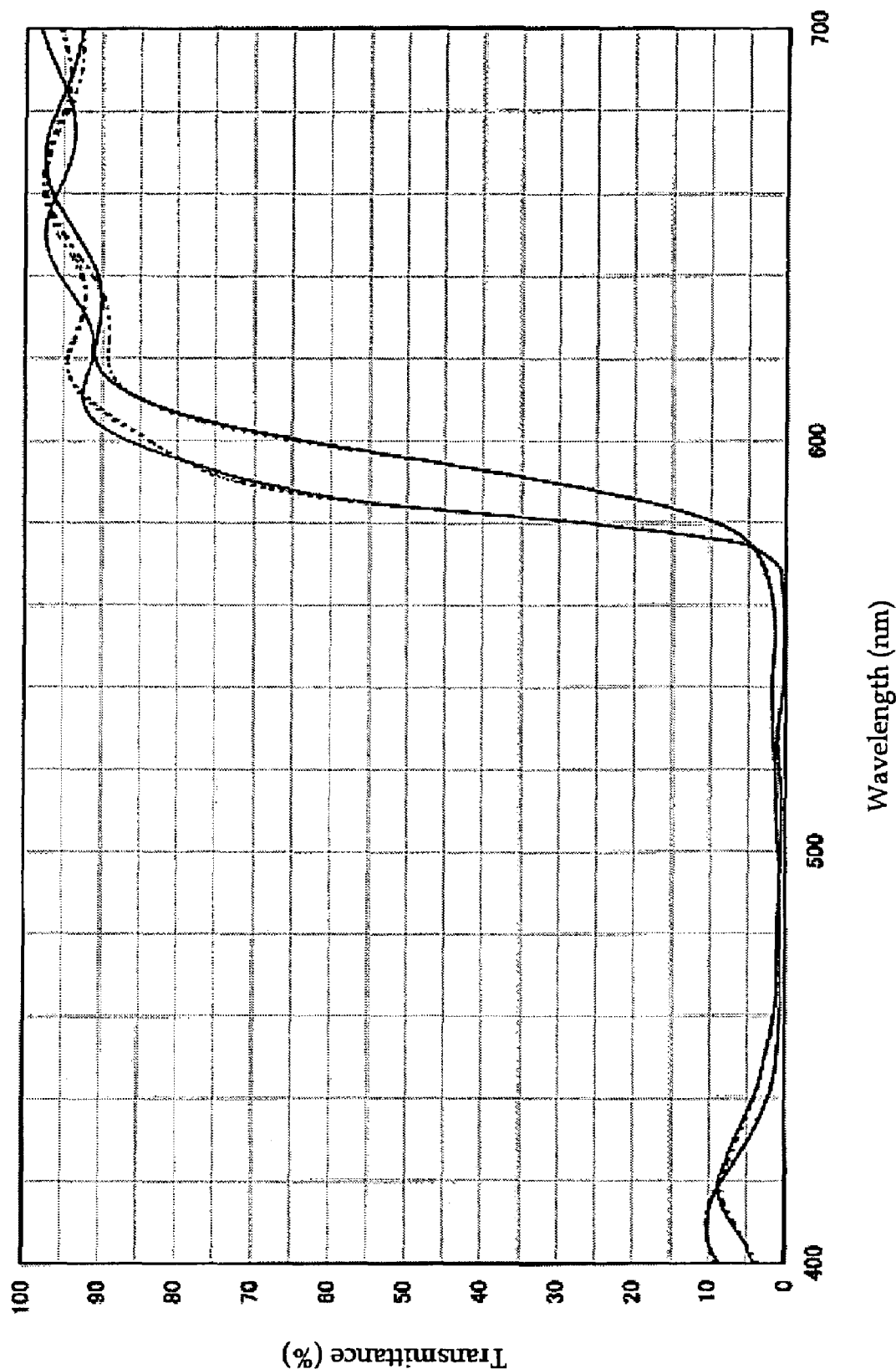
FIG. 27 is a graph showing the transmission spectrum of a red pigment.

The reflection characteristics shown in FIGS. 25 and 26 suggest that in the filter for the optical information recording medium of the present invention, reflectivity of 40% or more is ensured for light of 532 wavelength even when the light is incident at an angle of 0° to 20 and thus no problems occur upon reading of signals, and that leaked light (wavelength=532 nm) that has passed through the filter is absorbed while admitting a servo beam (wavelength=655 nm), whereby the occurrence of noise can be prevented.

<Base Material>

The base material is not particularly limited and can be appropriately selected depending on the intended purpose. For example, materials used for the foregoing support for the first form may be used.

The base material may be either a freshly prepared one or a commercially available one.

The thickness of the base material is not particularly limited and can be appropriately set depending on the intended purpose; the thickness is preferably 10 μm to 500 μm, more preferably 50 μm to 300 μm. If the thickness of the base material is less than 10 μm, the substrate bends and thus its adhesion properties with other components are reduced. If the thickness of the base material is greater than 500 μm, the focus of an information beam needs to be shifted by a large amount from the focus of a reference beam, leading to the necessity of preparing a big optical system.

The filter for optical information recording media can be used in various fields, can be suitably used for the manufacturing or formation of the holographic optical information recording medium of the present invention, and can be most suitably used for the holographic optical information recording medium of the present invention and for the method of the present invention for recording and reproducing optical information.

—Optical Information Recording Medium Having a Reflective Film, and First and Second Gap Layers—

The optical information recording medium includes a first substrate, a second substrate, a recording layer provided on the second substrate, and a filter layer provided between the second substrate and the recording layer. The optical information recording medium may further include a reflective film, a first gap layer and a second gap layer, and additional layers on an as-needed basis.

The foregoing filter for optical information recording medium can be used for the recording layer and filter layer.

—Substrate—

The shape, structure, size and the like of the substrate are not particularly limited and can be appropriately set depending on the intended purpose; examples of the shape of the substrate includes a disc shape and card-like shape, and material that can ensure the mechanical strength of the resultant optical information recording medium needs to be selected. In addition, when light for recording and reproduction is incident through the substrate, the substrate needs to be transparent enough to admit such light of desired wavelengths.

For the material of the substrate, glass, ceramics, resins and the like are generally used; however, resin is most preferable in view of the formability and cost.

Examples of the resins include polycarbonate resins, acrylic resins, epoxy resins, polystyrene resins, acrylonitrile-styrene copolymers, polyethylene resins, polypropylene resins, silicone resins, fluorine resins, ABS resins and urethane resins. Among these, polycarbonate resins and acrylic resins are most preferable in view of their formability, optical characteristics, and costs.

The substrate may be either a freshly prepared one or a commercially available one.

Multiple numbers of—address-servo areas—addressing areas linearly extending in the radial direction of the substrate—are provided on the substrate at given angles to one another, and each fan-shaped area between adjacent address-servo areas serves as a data area. In the address-servo areas, information for performing a focus servo operation and a tracking servo operation by means of a sampled servo system and address information are previously recorded (or pre-formatted) in the form of emboss pits (servo pits). The focus servo operation can be performed using a reflective surface of the reflective film. For example, wobble pits are used as the information for tracking servo. Note that there is no need to provide the servo pit pattern in a case where the optical information recording medium is card-like shape.

The thickness of the substrate is not particularly limited and can be appropriately set depending on the intended purpose; the thickness is preferably 0.1 mm to 5 mm, more preferably 0.3 mm to 2 mm. If the thickness of the substrate is less than 0.1 mm, the optical disc may become deformed during storage. If the thickness is greater than 5 mm, the weight of the optical disc is increased, so too does the load on a drive motor that spins it.

—Reflective Film—

The reflective film is formed on the surface of the servo pit pattern of the substrate.

For the material of the reflective film, materials that offer high reflectivity to a recording beam and reference beam are preferable. When the wavelength of light to be adopted is 400 nm to 780 nm, Al, Al alloys, Ag, Ag alloys and the like are preferably used. When the wavelength of light to be adopted is 650 nm or more, Al, Al alloys, Ag. Ag alloys, Au, Cu alloys, TiN and the like are preferably used.

By using an optical information recording medium which reflects light by a reflective film and can record or erase information—for example, DVD (Digital Versatile (Video) Disc), directory information indicative of the locations where information has been recorded, the time when information has been recorded, and the locations where errors have occurred and how information has been re-recorded on spare areas can also be recorded on, and erased from the optical information recording medium without adversely affecting holograms.

The method for forming the reflective film is not particularly limited and can be appropriately selected depending on the intended purpose; examples thereof include various types of vapor deposition, such as a vacuum vapor deposition, sputtering, plasma CVD, photo CVD, ion plating, and electron beam vapor deposition. Among these, sputtering is most preferable in view of mass productivity, film quality, and the like.

The thickness of the reflective film is preferably 50 nm or more, more preferably 100 nm or more, in order to secure sufficient reflectivity.

—First Gap Layer—

The first gap layer is provided between the filter layer and the reflective film on an as-needed basis for smoothing the surface of the second substrate. Moreover, the first gap layer is effective to adjust the size of holograms formed in the recording layer. Specifically, since somewhat large regions where optical interference between an information beam and recording reference beam takes place need to be secured in the recording layer, it is effective to provide the first gap layer between the recording layer and the servo pit pattern.

The first gap layer can be formed by, for example, applying UV curable resin or the like on the servo pit pattern by spin coating or the like and by curing the resin. In addition, when a filter layer is formed on a transparent base material, the transparent base material also serves as the first gap layer.

The thickness of the first gap layer is not particularly limited and can be appropriately set depending on the intended purpose; the thickness is preferably 1 μm to 200 μm.

—Second Gap Layer—

The second gap layer is provided between the recording layer and the filter layer on an as-needed basis.

The material for the second gap layer is not particularly limited and can be appropriately selected depending on the intended purpose; examples thereof include transparent resin films such as triacetylcellulose (TAC), polycarbonate (PC), polyethylene terephthalate (PET), polystyrene (PS), polysulfone (PSF), polyvinylalcohol (PVA) and methyl polymethacrylate (PMMA); norbornene resin films such as ARTON (bland name, produced by JSR Corp.), ZEONOA (bland name, produced by Nippon Zeon). Among these, those with high isotropy are preferable, and TAC, PC, ARTON and ZEONOA are most preferable.

The thickness of the second gap layer is not particularly limited and can be appropriately set depending on the intended purpose; the thickness is preferably 1 μm to 200 μm.

Hereinafter, specific examples 1 to 6 of the optical information recording medium of the present invention, which includes the reflective film and the first and second gap layers, will be described in detail with reference to the drawings.

<Specific Example 1 of the Optical Information Recording Medium>

Figure 10:
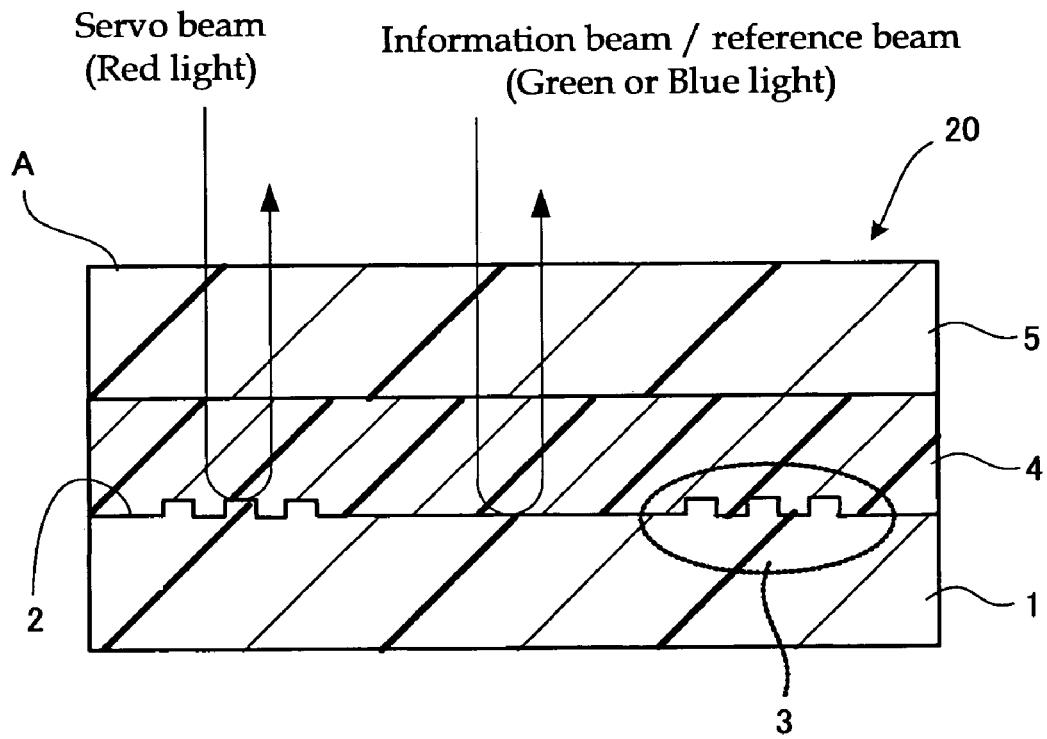
FIG. 10 is a schematic cross-sectional view showing the structure of a optical information recording medium.
Figure 11:
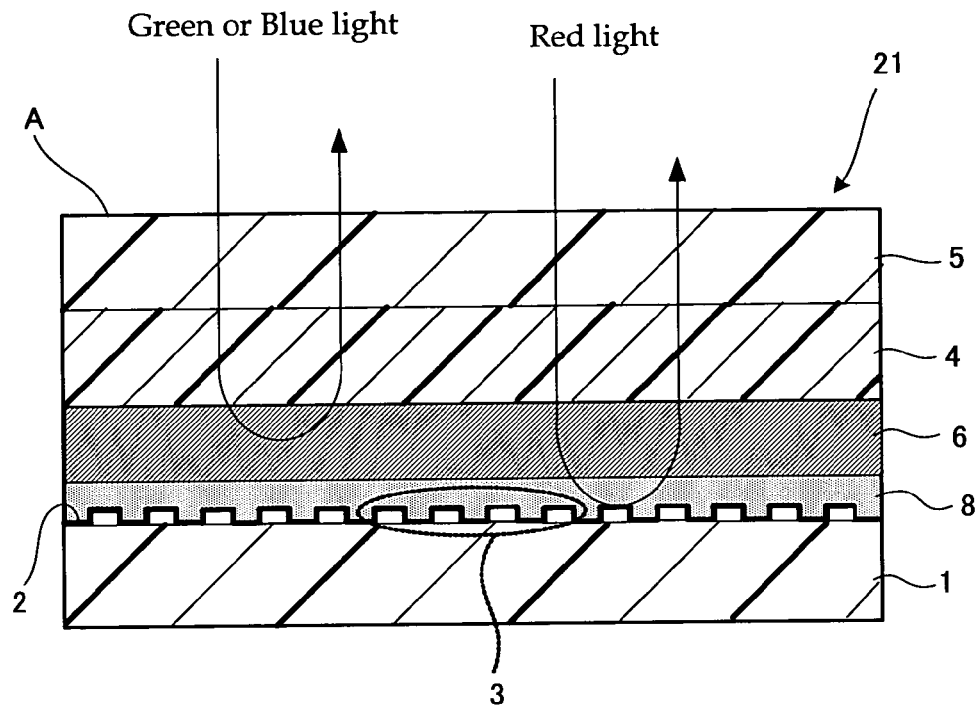
FIG. 11 is a schematic cross-sectional view showing the structure of the optical information recording medium of specific example 1.

FIG. 11 is a schematic cross-sectional view showing the structure of the optical information recording medium of specific example 1 in the present invention. In an optical recording medium 21 according to this specific example 1 a servo pit pattern 3 is formed on a second substrate 1 made of polycarbonate resin or glass, and the serve pit pattern 3 is coated with Al, Au, Pt or the like to form a reflective film 2. Although the servo pit pattern 3 is formed on the entire surface of the second substrate 1 in FIG. 11, it may be formed on the second substrate 1 periodically as shown in FIG. 10. In addition, the height of the servo pit pattern 3 is generally 1,750 angstrom (175 nm), far smaller than those of the other layers, including substrates.

A first gap layer 8 is formed by applying UV curable resin or the like on the reflective film 2 of the second substrate 1 by spin coating or the like. The first gap layer 8 is effective for protecting the reflective film 2 and for adjusting the size of holograms created in a recording layer 4. Specifically, since somewhat large regions where optical interference between an information beam and recording reference beam takes place need to be secured in the recording layer 4, it is effective to provide clearance between the recording layer 4 and the servo pit pattern 3.

A filter layer 6 is provided on the first gap layer 8, and the recording layer 4 is sandwiched between the filter layer 6 and a first substrate (a polycarbonate resin substrate or glass substrate) to constitute the optical recording medium 21.

In FIG. 11 the filter layer 6 admits only red light and reflects light of the other colors. Therefore, the information beam and recording and reproduction beams do not pass through the filter layer 6 because they are light of green or blue, and never reach the reflective film 2, becoming returning beams emitting from the light entrance/exit surface A.

The filter layer 6 is constituted of a single-layered cholesteric liquid crystal layer whose helical pitch is continuously changed in the thickness direction thereof. The filter layer 6 may be directly provided on the first gap layer 8 with a coating method, or may be provided by stamping a film in which a cholesteric liquid crystal layer is formed on a base material into the optical disc shape. By using such a single-layered cholesteric liquid crystal layer, optical transmittance of 40% or more can be realized for light of a wavelength range of $\lambda_0$ to $\lambda_0/\cos 20°$, especially $\lambda_0$ to $\lambda_0/\cos 40°$ (where $\lambda_0$ represents the wavelength of irradiation light), thereby eliminating the fluctuations in the selectively-reflecting wavelength range even when the incident angle has changed.

The optical recording medium 21 of specific example 1 may be a disc shape or card-like shape. There is no need to provide a servo pit pattern in a case where the optical recording medium 21 is a card-like shape. In the optical recording medium 21 the second substrate 1 is 0.6 mm in thickness, the first gap layer 8 is 100 μm in thickness, the filter layer 6 is 2 μm to 3 μm in thickness, the recording layer 4 is 0.6 mm in thickness, and the first substrate 5 is 0.6 mm in thickness, bringing to the total to about 1.9 mm.

Next, optical operations around the optical recording medium 21 will be described with reference to FIG. 17.

First, a red light beam emitted from the servo laser source is reflected by a dichroic mirror 13 by almost 100%, and passes through an objective lens 12. By this, the servo beam is applied onto the optical recording medium 21 in such a way that it focuses on the reflective film 2. More specifically, the dichroic mirror 13 is so configured that it admits only green or blue light but reflects almost 100% of red light. The servo beam incident from the light entrance/exit surface A of the optical recording medium 21 passes through the first substrate 5, recording layer 4, filter layer 6 and first gap layer 8, is reflected by the reflective film 2, and passes again through the first gap layer 8, filter layer 6, recording layer 4 and first substrate 5 to emit from the light entrance/exit surface A. The returning servo beam passes through the objective lens 12 and is reflected by the dichroic mirror by almost 100%, and then a servo information detector (not shown) detects servo information in the returning servo beam. The detected servo information is used for the focus servo operation, tracking servo operation, slide servo operation, and the like. The holographic material constituting the recording layer 4 is designed so as not to be sensitive to red light. For this reason, even when the servo beam has passed through the recording layer 4 or has been reflected diffusively by the reflective film 2, the recording layer 4 is not adversely affected. In addition, the returning servo beam that has been reflected by the reflective film 2 is reflected by the dichroic mirror 13. Accordingly, the servo beam is not detected by a CMOS sensor or CCD 14 used for the detection of reconstructed images, and thus does not interfere with the operation of a reproduction beam.

Figure 16:
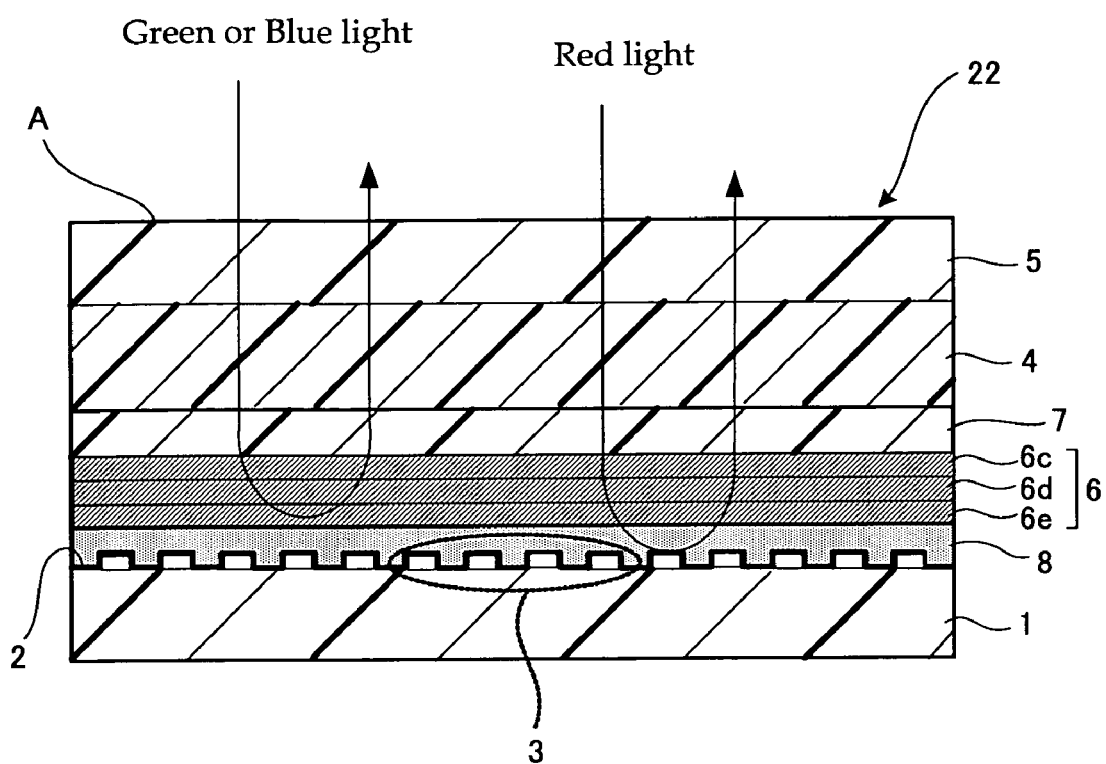
FIG. 16 is a schematic cross-sectional view showing the structure of the optical information recording medium of specific example 6.

Note that with respect to the reflection range of $\lambda_0$ to $1.3\lambda_0$, $1.3\lambda_0$ shown in FIG. 19, $1.3\lambda_0$ equals to 692 nm when $\lambda_0$ is 532 nm, and thus a servo beam of wavelength 655 nm is undesirably reflected. This reflection range is set in view of light incident at an angle of ±40°. However, when such light that is incident at larger angles is intended to be used, a servo operation can be performed without causing any problems by using a servo beam incident at an angle of within ±20° that has been masked. In addition, by securing larger helical pitch in the cholesteric liquid crystal layer in the filter layer used, it is also possible to readily cover a servo beam incident to the filter layer at an angle of within ±20°. In that case, it is only necessary to prepare a cholesteric liquid crystal layer with a reflection range of $\lambda_0$ to $1.1\lambda_0$ as shown in FIG. 16. Thus, transmittance of the servo beam entails no difficulty.

Both the information beam and recording reference beam generated in the recording/reproduction laser source pass through a polarizing plate 16 and are linearly polarized. The linearly polarized beams then pass through a half mirror 17 and are circularly polarized after passing through a quarter wave plate 15. The circularly polarized beams then pass through the dichroic mirror 13 and the objective lens 12, and are applied onto the optical recording media 21 in such a way that optical interference takes place between the information beam and recording reference beam to create interference images in the recording layer 4. The information beam and recording reference beam are incident from the light entrance/exit surface A and interact with each other in the recording layer 4 to form an interference image to be recorded there. Thereafter, the information beam and recording reference beam pass through the recording layer 4, launching into the filter layer 6. There, before reaching the bottom of the filter layer 6, the beams are reflected and become returning beams. More specifically, the information beam and recording reference beam do not reach the reflective film 2. This is because the filter layer 6 is formed of a single-layered cholesteric liquid crystal layer whose helical pitch is continuously changed in the thickness direction thereof and thus admits only red light. Moreover, if the intensity of light that has undesirably passed through the filter layer 6 is suppressed to 20% or less of that of the incident light, there will be no practical problems even when such light reaches the bottom of the filter layer 6 and is reflected back as a returning beam, because this returning beams is again reflected by the filter layer 6 and its intensity in a reproduction beam is as small as 4% (20%×20%) or less of that of the reproduction beam.

The fixing beam 53 emitted from the second light source 62 is then applied onto the recorded interference image within 100,000 seconds after end of this recording process, the fixing beam 53 being applied at an level that satisfies the condition H<(S+T)<2H (where H is a minimum fixing exposure level required to fix the interference image that has been recorded by means of the information beam and reference beam, S is the integrated exposure level (mJ/cm$^2$), which is the total of the exposure level for the exposed region in the recording layer where information has been recoded by holography, and T is the fixing exposure level required to fix the exposed region).

<Specific Example 2 of the Optical Information Recording Medium>

Figure 12:
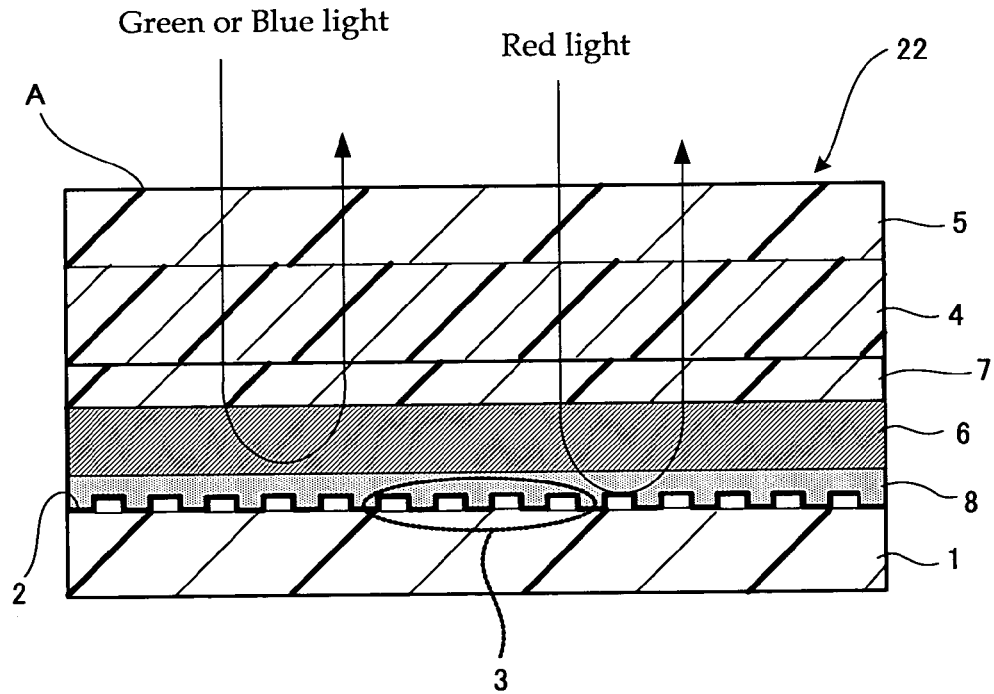
FIG. 12 is a schematic cross-sectional view showing the structure of the optical information recording medium of specific example 2.

FIG. 12 is a schematic cross-sectional view showing the structure of the optical information recording medium of specific example 2 in the present invention. In an optical recording medium 22 according to this specific example 1 a servo pit pattern 3 is formed on a second substrate 1 made of polycarbonate resin or glass, and the serve pit pattern 3 is coated with Al, Au, Pt or the like to form a reflective film 2. The height of the servo pit pattern 3 is generally 1750 angstrom (175 nm), as in the case of the first embodiment. The specific example 2 differs from specific example 1 in that the optical recording medium 22 has a second gap layer 7 provided between the filter layer 6 and the recording layer 4.

The filter layer 6 constituted of a single-layered cholesteric liquid crystal layer whose helical pitch is continuously changed in the thickness direction thereof is formed on a first gap layer 8 that has been previously formed. A filter layer similar to that described of specific example 1 can be used.

In the second gap layer 7 there is a point at which both an information beam and reference beam focus; if this area is embedded in photopolymers, excessive exposure takes places and thus an excess amount of monomers are consumed, leading to poor multiplexing recording performance. To avoid this, it is effective to provide a transparent, inert second gap layer.

In the optical recording medium 22 the second substrate 1 is 1.0 mm in thickness, the first gap layer 8 is 100 μm in thickness, the filter layer 6 is 3 μm to 5 μm in thickness, the second gap layer 7 is 70 μm in thickness, the recording layer 4 is 0.6 mm in thickness, and the first substrate 5 is 0.4 mm in thickness, bringing to the total to about 2.2 mm.

Upon recording and reproduction of information, the optical recording medium 22 having the structure described above is irradiated with a red servo beam and a green information beam and green recording and reproduction reference beams. The servo beam is incident from the light entrance/exit surface A, passes through the recording layer 4, second gap layer 7, filter layer 6 and first gap layer 8, and is reflected by the reflective film 2 to become a returning servo beam. This returning servo beam sequentially passes through the first gap layer 8, filter layer 6, second gap layer 7, recording layer 4 and first substrate 5 again, and emits from the light entrance/exit surface A. The emitted returning servo beam is used for the focus servo operation, tracking servo operation, and the like. The holographic material constituting the recording layer 4 is designed so as not to be sensitive to red light. For this reason, even when the servo beam has passed through the recording layer 4 or has been reflected diffusively by the reflective film 2, the recording layer 4 is not adversely affected. The green information beam and reference beams are incident from the light entrance/exit surface A and pass through the recording layer 4 and second gap layer 7, and reflected by the filter layer 6 to become returning beams. The returning beams sequentially pass through the second gap layer 7, recording layer 4 and first substrate 5, and emit from the light entrance/exit surface A. Upon reproduction of information, both a reproduction reference beam and a reproduction beam generated by irradiating the recording layer 4 with the reproduction reference beam do not reach the reflective film 2 and emit from the light entrance/exit surface A. Note that the optical operations around the optical recording medium 22 (i.e., the objective lens 12, filter layer 6, CMOS sensor or CCD 14 in FIG. 17) are similar to those in specific example 1 (FIG. 17), and the description thereof is omitted.

<Specific Example 3 of the Optical Information Recording Medium>

Figure 13:
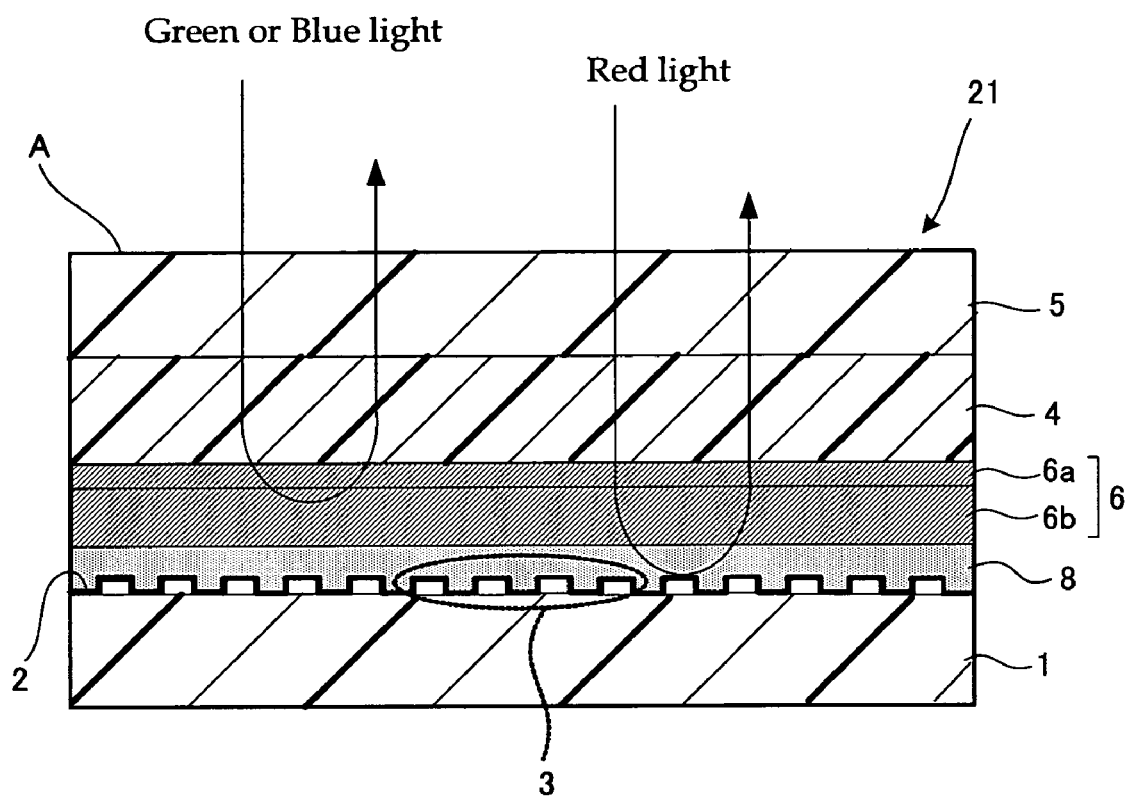
FIG. 13 is a schematic cross-sectional view showing the structure of the optical information recording medium of specific example 3.

FIG. 13 is a schematic cross-sectional view showing the structure of the optical information recording medium of specific example 3 in the present invention. This optical recording medium 21 according to specific example 3 is similar to that of specific example 1 except for the configuration of the filter layer 6.

In FIG. 13 the filter layer 6 admits only red light and reflects light of the other colors. Therefore, the information beam and recording and reproduction beams do not pass through the filter layer 6 because they are light of green or blue, and never reach the reflective film 2, becoming returning beams emitting from the light entrance/exit surface A.

The filter layer 6 is a laminate of seven dielectric thin layers with different indices of refractivity formed on a colored material-containing layer 6b. The filter layer 6, where the dielectric thin layers and a colored material-containing layer are combined, may be directly formed on the first gap layer 8 with a coating or deposition method, or may be formed by stamping a film, in which dielectric thin layers and a colored material-containing layer is formed on a base material, into the optical disc shape. Using such a filter layer leads to optical transmittance of 50% or more for light of wavelength 655 nm and 30% or more for light of wavelength 532 nm, both incident at an angle of within ±40°, thereby eliminating the fluctuations in the selectively-reflecting wavelength range even when the incident angle has changed.

The optical recording medium 21 of specific example 3 may be a disc shape or card-like shape. There is no need to provide a servo pit pattern in a case where the optical recording medium 21 is a card-like shape.

Next, optical operations around the optical recording medium 21 will be described with reference to FIG. 17.

First, a red light beam emitted from the servo laser source is reflected by the dichroic mirror 13 by almost 100%, and passes through the objective lens 12. By this, the servo beam is applied onto the optical recording medium 21 in such a way that it focuses on the reflective film 2. More specifically, the dichroic mirror 13 is so configured that it admits only green or blue light but reflects almost 100% of red light. The servo beam incident from the light entrance/exit surface A of the optical recording medium 21 passes through the first substrate 5, recording layer 4, filter layer 6 and first gap layer 8, is reflected by the reflective film 2, and passes again through the first gap layer 8, filter layer 6, recording layer 4 and first substrate 5 to emit from the light entrance/exit surface A. The returning servo beam passes through the objective lens 12 and is reflected by the dichroic mirror by almost 100%, and then the servo information detector (not shown) detects servo information in the returning servo beam. The detected servo information is used for the focus servo operation, tracking servo operation, slide servo operation, and the like. The holographic material constituting the recording layer 4 is designed so as not to be sensitive to red light. For this reason, even when the servo beam has passed through the recording layer 4 or has been reflected diffusively by the reflective film 2, the recording layer 4 is not adversely affected. In addition, the returning servo beam that has been reflected by the reflective film 2 is reflected by the dichroic mirror 13. Accordingly, the servo beam is not detected by a CMOS sensor or CCD 14 used for the detection of reconstructed images, and thus does not interfere with the operation of a reproduction beam.

Both the information beam and recording reference beam generated in the recording/reproduction laser source pass through the polarizing plate 16 and are linearly polarized. The linearly polarized beams then pass through the half mirror 17 and are circularly polarized after passing through the quarter wave plate 15. The circularly polarized beams then pass through the dichroic mirror 13 and the objective lens 12, and are applied onto the optical recording media 21 in such a way that optical interference takes place between the information beam and recording reference beam to create interference images in the recording layer 4. The information beam and recording reference beam are incident from the light entrance/exit surface A and interact with each other in the recording layer 4 to form an interference image to be recorded there. Thereafter, the information beam and recording reference beam pass through the recording layer 4, launching into the filter layer 6. There, before reaching the bottom of the filter layer 6, the beams are reflected and become returning beams. More specifically, the information beam and recording reference beam do not reach the reflective film 2. This is because the filter layer 6 is a laminate in which a colored material-containing layer and dielectric thin films are combined, and thus admits only red light. Moreover, if the intensity of light that has undesirably passed through the filter layer 6 is suppressed to 20% or less of that of the incident light, there will be no practical problems even when such light reaches the bottom of the filter layer 6 and is reflected back as a returning beam, because this returning beam is again reflected by the filter layer 6 and its intensity in a reproduction beam is as small as 4% (20%×20%) or less of that of the reproduction beam.

The fixing beam 53 emitted from the second light source 62 is then applied onto the recorded interference image within 100,000 seconds after end of this recording process, the fixing beam 53 being applied at an level that satisfies the condition H<(S+T)<2H (where H is a minimum fixing exposure level required to fix the interference image that has been recorded by means of the information beam and reference beam, S is the integrated exposure level (mJ/cm$^2$), which is the total of the exposure level for the exposed region in the recording layer where information is recoded by holography, and T is the fixing exposure level required to fix the exposed region).

<Specific Example 4 of the Optical Information Recording Medium>

Figure 14:
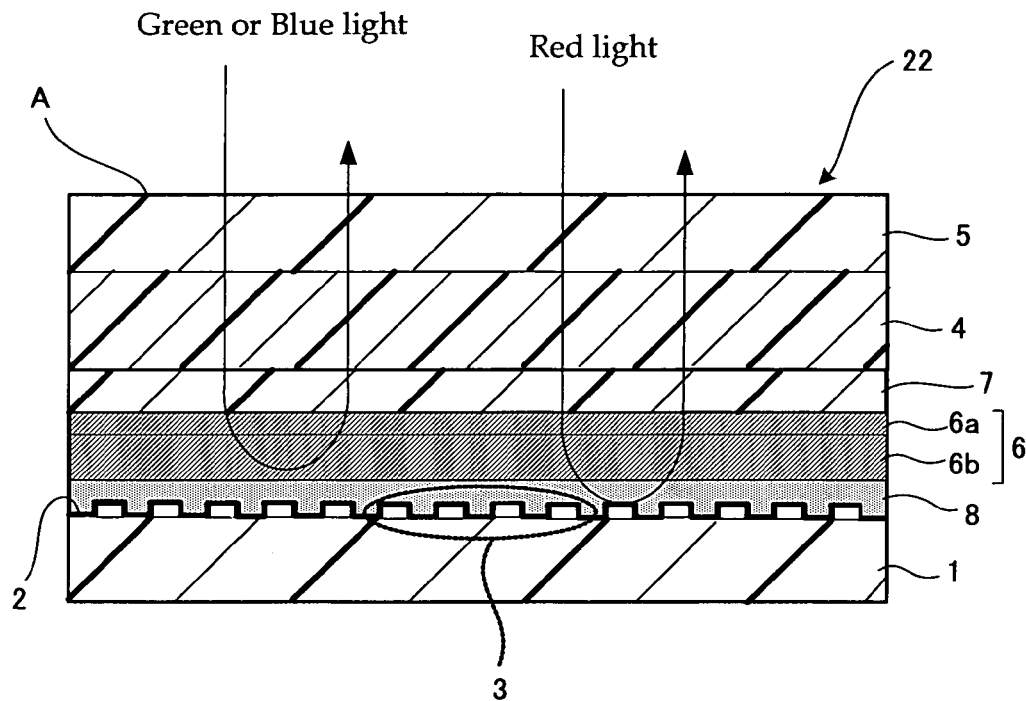
FIG. 14 is a schematic cross-sectional view showing the structure of the optical information recording medium of specific example 4.

FIG. 14 is a schematic cross-sectional view showing the structure of the optical information recording medium of specific example 4 in the present invention. This optical recording medium 22 according to the second embodiment is similar to that of specific example 1 except for the configuration of the filter layer 6.

The specific example 4 differs from specific example 3 in that the optical recording medium 22 according to specific example 4 has a second gap layer 7 provided between the filter layer 6 and the recording layer 4.

The filter layer 6, in which a colored material-containing layer and a dielectric material-deposited layer are combined, is formed on a first gap layer 8 that has been previously formed. A filter layer similar to that of the first embodiment can be used.

In the second gap layer 7 there is a point at which both an information beam and reference beam focus; if this area is embedded in photopolymers, excessive exposure takes places and thus an excess amount of monomers are consumed, leading to poor multiplexing recording performance. To avoid this, it is effective to provide a transparent, inert second gap layer.

In the optical recording medium 22 the first and second substrates 1 and 5 are produced in a similar way as those of specific example 2.

Upon recording and reproduction of information, the optical recording medium 22 having the structure described above is irradiated with a red servo beam and a green information beam and green recording and reproduction reference beams. The servo beam is incident from the light entrance/exit surface A, passes through the recording layer 4, second gap layer 7, filter layer 6 and first gap layer 8, and is reflected by the reflective film 2 to become a returning servo beam. This returning servo beam sequentially passes through the first gap layer 8, filter layer 6, second gap layer 7, recording layer 4 and first substrate 5 again, and emits from the light entrance/exit surface A. The emitted returning servo beam is used for the focus servo operation, tracking servo operation, and the like. The holographic material constituting the recording layer 4 is designed so as not to be sensitive to red light. For this reason, even when the servo beam has passed through the recording layer 4 or has been reflected diffusively by the reflective film 2, the recording layer 4 is not adversely affected. The green information beam and reference beams are incident from the light entrance/exit surface A and pass through the recording layer 4 and second gap layer 7, and reflected by the filter layer 6 to become returning beams. The returning beams sequentially pass through the second gap layer 7, recording layer 4 and first substrate 5, and emit from the light entrance/exit surface A. Upon reproduction of information, both a reproduction reference beam and a reproduction beam generated by irradiating the recording layer 4 with the reproduction reference beam do not reach the reflective film 2 and emit from the light entrance/exit surface A. Note that the optical operations around the optical recording medium 22 (i.e., the objective lens 12, filter layer 6, CMOS sensor or CCD 14 in FIG. 17) are similar to those in specific example 3 (FIG. 17), and the description thereof is omitted.

<Specific Example 5 of the Optical Information Recording Medium>

Hereinafter, specific example 5 of the optical information recording medium will be described in detail with reference to the drawing.

Figure 15:
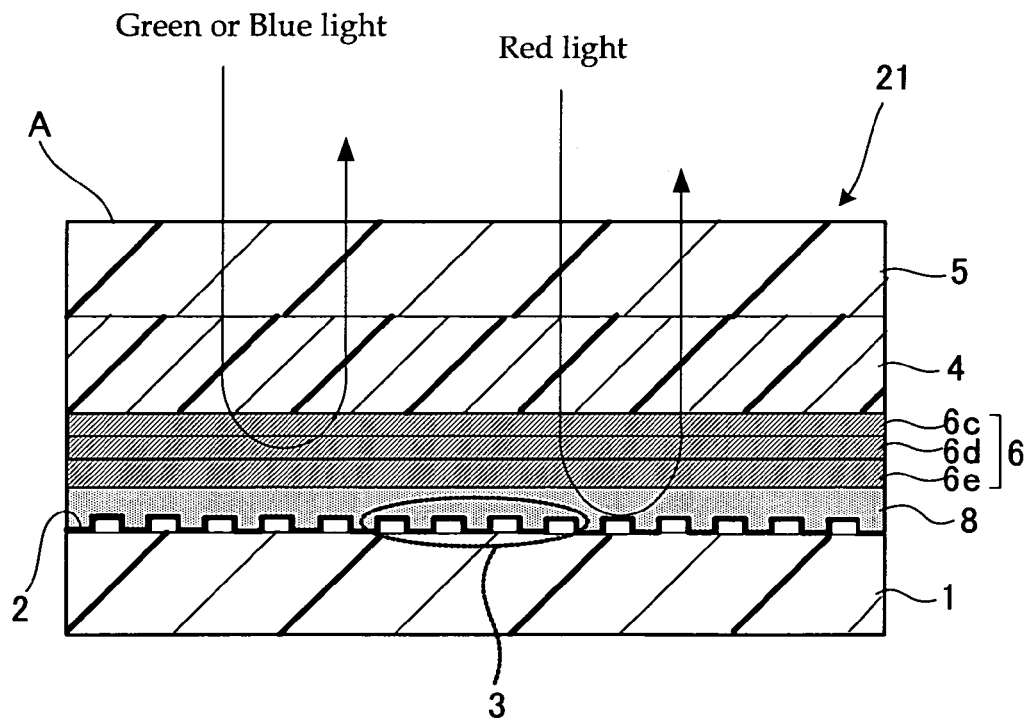
FIG. 15 is a schematic cross-sectional view showing the structure of the optical information recording medium of specific example 5.

FIG. 15 is a schematic cross-sectional view showing the structure of the optical information recording medium of specific example 5 in the present invention. This optical recording medium 21 according to specific example 5 is similar to that of specific example 1 except for the configuration of the filter layer 6.

The first gap layer 8 is formed by applying UV curable resin or the like on the reflective film 2 of the second substrate 1 by spin coating or the like. The first gap layer 8 is effective for protecting the reflective film 2 and for adjusting the size of holograms created in the recording layer 4. Specifically, since somewhat large regions where optical interference between an information beam and recording reference beam takes place need to be secured in the recording layer 4, it is effective to provide clearance between the recording layer 4 and the servo pit pattern 3.

The filter layer 6 is provided on the first gap layer 8, and the recording layer 4 is sandwiched between the filter layer 6 and a first substrate (a polycarbonate resin substrate or glass substrate) to constitute the optical recording medium 21.

In FIG. 15 the filter layer 6 admits only red light and reflects light of the other colors. Therefore, the information beam and recording and reproduction beams do not pass through the filter layer 6 because they are light of green or blue, and never reach the reflective film 2, becoming returning beams emitting from the light entrance/exit surface A.

The filter layer 6 is a laminate of three cholesteric liquid crystal layers 6c, 6d and 6e. The filter layer 6 may be directly provided on the first gap layer 8 with a coating method, or may be provided by stamping a film in which three cholesteric liquid crystal layers are formed on a base material into the optical disc shape. By using such a filter layer, optical transmittance of 40% or more can be realized for light of a wavelength range of $\lambda_0$ to $\lambda_0/\cos 20°$, especially $\lambda_0$ to $\lambda_0/\cos 40°$ (where $\lambda_0$ represents the wavelength of irradiation light), thereby eliminating the fluctuations in the selectively-reflecting wavelength range even when the incident angle has changed.

The optical recording medium 21 of specific example 5 may be a disc shape or card-like shape, and is formed in a similar manner as that of specific example 1.

Optical operations around the optical recording medium 21 are similar to those in specific examples 1 and 2. Note that with respect to the reflection range of $\lambda_0$ to $1.3\lambda_0$, $1.3\lambda_0$ shown in FIG. 23, $1.3\lambda_0$ equals to 692 nm when $\lambda_0$ is 532 nm, and thus a servo beam of wavelength 655 nm is undesirably reflected. This reflection range is set in view of light incident at an angle of ±40°. However, when such light that is incident at larger angles is intended to be used, a servo operation can be performed without causing any problems by using a servo beam incident at an angle of within ±20° that has been masked. In addition, by securing larger helical pitch in the cholesteric liquid crystal layer in the filter layer used, it is also possible to readily cover a servo beam incident to the filter layer an angle of within ±20°. In that case, it is only necessary to prepare a laminate of two cholesteric liquid crystal layer with a reflection range of $\lambda_0$ to $1.1\lambda_0$ as shown in FIG. 20. Thus, transmittance of the servo beam entails no difficulty.

Both the information beam and recording reference beam generated in the recording/reproduction laser source pass through the polarizing plate 16 and are linearly polarized. The linearly polarized beams then pass through the half mirror 17 and are circularly polarized after passing through the quarter wave plate 15. The circularly polarized beams then pass through the dichroic mirror 13 and the objective lens 12, and are applied onto the optical recording media 21 in such a way that optical interference takes place between the information beam and recording reference beam to create interference images in the recording layer 4. The information beam and recording reference beam are incident from the light entrance/exit surface A and interact with each other in the recording layer 4 to form an interference image to be recorded there. Thereafter, the information beam and recording reference beam pass through the recording layer 4, launching into the filter layer 6. There, before reaching the bottom of the filter layer 6, the beams are reflected and become returning beams. More specifically, the information beam and recording reference beam do not reach the reflective film 2. This is because the filter layer 6 is a laminate of three cholesteric liquid crystal layers and thus admits only red light. Moreover, if the intensity of light that has undesirably passed through the filter layer 6 is suppressed to 20% or less of that of the incident light, there will be no practical problems even when such light reaches the bottom of the filter layer 6 and is reflected back as a returning beam, because this returning beam is again reflected by the filter layer 6 and its intensity in a reproduction beam is as small as 4% (20%×20%) or less of that of the reproduction beam.

The fixing beam 53 emitted from the second light source 62 is then applied onto the recorded interference image within 100,000 seconds after end of this recording process, the fixing beam 53 being applied at an level that satisfies the condition H<(S+T)<2H (where H is a minimum fixing exposure level required to fix the interference image that has been recorded by means of the information beam and reference beam, S is the integrated exposure level (mJ/cm$^2$), which is the total of the exposure level for the exposed region in the recording layer where information is recoded by holography, and T is the fixing exposure level required to fix the exposed region).

<Specific Example 6 of the Optical Information Recording Medium>

FIG. 16 is a schematic cross-sectional view showing the structure of the optical information recording medium of specific example 6 in the present invention. This optical recording medium 22 according to specific example 6 is similar to that of specific example 1 except for the configuration of the filter layer 6.

The specific example 6 differs from specific example 5 in that the optical recording medium 22 according to specific example 6 has a second gap layer 7 provided between the filter layer 6 and the recording layer 4.

The filter layer 6 in which three cholesteric liquid crystal layers are laminated is formed on a first gap layer 8 that has been previously formed. A filter layer similar to that of first embodiment can be used.

In the second gap layer 7 there is a point at which both an information beam and reference beam focus; if this area is embedded in photopolymers, excessive exposure takes places and thus an excess amount of monomers are consumed, leading to poor multiplexing recording performance. To avoid this, it is effective to provide a transparent, inert second gap layer.

In the optical recording medium 22 the first and second substrates 1 and 5 are produced in a similar way as those of specific example 2.

Upon recording and reproduction of information, the optical recording medium 22 having the structure described above is irradiated with a red servo beam and a green information beam and green recording and reproduction reference beams. The servo beam is incident from the light entrance/exit surface A, passes through the recording layer 4, second gap layer 7, filter layer 6 and first gap layer 8, and is reflected by the reflective film 2 to become a returning servo beam. This returning servo beam sequentially passes through the first gap layer 8, filter layer 6, second gap layer 7, recording layer 4 and first substrate 5 again, and emits from the light entrance/exit surface A. The emitted returning servo beam is used for the focus servo operation, tracking servo operation, and the like. The holographic material constituting the recording layer 4 is designed so as not to be sensitive to red light. For this reason, even when the servo beam has passed through the recording layer 4 or has been reflected diffusively by the reflective film 2, the recording layer 4 is not adversely affected. The green information beam and reference beams are incident from the light entrance/exit surface A and pass through the recording layer 4 and second gap layer 7, and reflected by the filter layer 6 to become returning beams. The returning beams sequentially pass through the second gap layer 7, recording layer 4 and first substrate 5, and emit from the light entrance/exit surface A. Upon reproduction of information, both a reproduction reference beam and a reproduction beam generated by irradiating the recording layer 4 with the reproduction reference beam do not reach the reflective film 2 and emit from the light entrance/exit surface A. Note that the optical operations around the optical recording medium 22 (i.e., the objective lens 12, filter layer 6, CMOS sensor or CCD 14 in FIG. 17) are similar to those in specific example 5 (FIG. 17), and the description thereof is omitted.

(Method for Manufacturing Optical Information Recording Media)

The method for manufacturing the optical information recording medium of the present invention comprises a filter layer formation step, a reflective film formation step and a recording layer formation step, and further comprises additional steps on an as-needed basis.

—Filter Layer Formation Step—

The filter layer formation step is a step in which the filter for optical information recording medium of the present invention is processed into the optical recording medium shape, and the processed filter is bonded to the second substrate to form a filter layer.

The process for producing the filter for the optical information recording medium of the present invention is as described above.

The shape of the optical information recording medium is, for example, disc shape or card-like shape.

The method for processing the filter into the optical information recording medium shape is not particularly limited, and can be appropriately selected depending on the intended purpose. For example, a cutting process with a press cutter, or a stamping process with a stamping cutter can be used.

The filter is bonded to the second substrate by use of, for example, an adhesive or agglutinant while avoiding entry of air bubbles.

The adhesive is not particularly limited and can be appropriately selected depending on the intended purpose; examples thereof include UV curable adhesives, emulsion adhesives, one-component curable adhesives and two-component curable adhesives. These known adhesives can be used in any combination.

The agglutinant is not particularly limited and can be appropriately selected depending on the intended purpose; examples thereof include rubber agglutinants, acrylic agglutinants, silicone agglutinants, urethane agglutinants, vinylalkyl ether agglutinants, polyvinylalcohol agglutinants, polyvinylpyrrolidone agglutinants, polyacrylamide agglutinants and cellulose agglutinants.

The thickness of the adhesive or agglutinant applied is not particularly limited and can be appropriately set depending on the intended purpose. In the case of adhesive, the thickness is preferably 0.1 μm to 10 μm, more preferably 0.1 μm to 5 μm in light of the optical characteristics and slimness. In the case of agglutinant, the thickness is preferably 1 μm to 50 μm, more preferably 2 μm to 30 μm.

Note, however, that it is possible to directly form the filter layer on the substrate depending on the circumstances. For example, a coating solution for colored material-containing layer is applied onto the substrate to form a colored material-containing layer, and a dielectric thin film is formed on the colored material-containing layer by sputtering or the like.

EXAMPLES

Hereinafter, Examples of the present invention will be described, which however shall not be construed as limiting the invention thereto.

Example 1

<Preparation of a Filter for Optical Information Recording Media>

With a vacuum vapor deposition process, $SiO_2$ and $TiO_2$ layers are alternately stacked in 15 layers on a polycarbonate film of 80 μm thickness (produced by Teijin Chemicals, Ltd.). More specifically, a $SiO_2$ layer is deposited on the polycarbonate film to the thickness of 90 nm, and a $TiO_2$ layer is deposited on the $SiO_2$ layer to the thickness of 50 nm. By repeating this step, a fifteen-layered dielectric material-deposited film was prepared, with the outermost layer being a $SiO_2$ layer. Here, since the thickness of each layer is preferably $\lambda/4n$ (where $\lambda$ is the recording wavelength, and n is the refractive index of material), in this Example, $\lambda$ was set to 532 nm, the refractive index of the $SiO_2$ layer was set to 1.5, and the refractive index of the $TiO_2$ layer was set to 2.5.

Optical characteristics measurements were made for each of the filters for optical information recording media using a spectral reflectometer equipped with L-5662, a light source manufactured by Hamamatsu Photonics KK and with PMA-11, a photomultichannel analyzer manufactured by Hamamatsu Photonics KK.

The measurement results indicated that the filter in Example 1 could reflect 40% of light of wavelength 532 nm—light of wavelength selected as being reflected—incident at an angle of within ±20°, as shown in FIGS. 4 and 5. In addition, the selectively-reflecting wavelength range was as wide as 180 nm.

<Preparation of Optical Recording Media>

For the second substrate, a polycarbonate resin substrate of 1.2 mm thickness was used that is generally used for CD and DVD. A servo pit pattern is formed all over the surface of the substrate, with the track pitch being 1.6 μm, the groove depth 90 nm, and groove width 300 nm.

At first, a reflective film made of aluminum (Al) was deposited on the surface of the servo pit pattern of the second substrate to the thickness of 80 nm with a DC magnetron sputtering method.

Next, the resultant filter was stamped into a disc shape of predetermined size, so that the filter could be arranged on the substrate. The disc-shaped filter was bonded to the substrate, with its base film side being in contact with the servo pit pattern side. Note that the filter was bonded to the substrate by use of UV curable resin and an agglutinant while avoiding entry of air bubbles. In this way a filter layer was formed.

Preparation of Photopolymer Coating Solution

For recording layer material, a photopolymer coating solution containing the following compositions was prepared. Note that "Part(s)" means "Part(s) by mass" unless otherwise indicated.

| | |
|---|---|
| 1. Di(urethaneacrylate) oligomer (ALU-351, produced by Echo Resins Corp.) | 59 Parts |
| 2. Isobornylacrylate | 30 Parts |
| 3. Vinylbenzoate | 10 Parts |
| 4. Polymerization initiator (IRGA CURE 784, produced by Chiba Specialty Chemicals KK) | 1 Part |

Using a dispenser, the prepared photopolymer coating solution was applied on the filter layer to form a photopolymer layer, and a polycarbonate resin first substrate of 12 cm diameter and 0.6 mm thickness was pressed against the photopolymer, with the edge of the disc and the first substrate bonded together with an adhesive. Note that the edge of the disc is provided with a flange so that the photopolymer layer has a thickness of 500 μm, and bonding the first substrate to the flange determines the thickness of the photopolymer layer, whereby redundant photopolymers brim over the disc edge and are removed. In this way an optical recording medium of Example 1 was prepared. Here, FIG. 14 is a schematic cross-sectional view showing an embodiment of the optical recording medium similar to that of this example.

—Recording of Optical Information—

Figure 30:
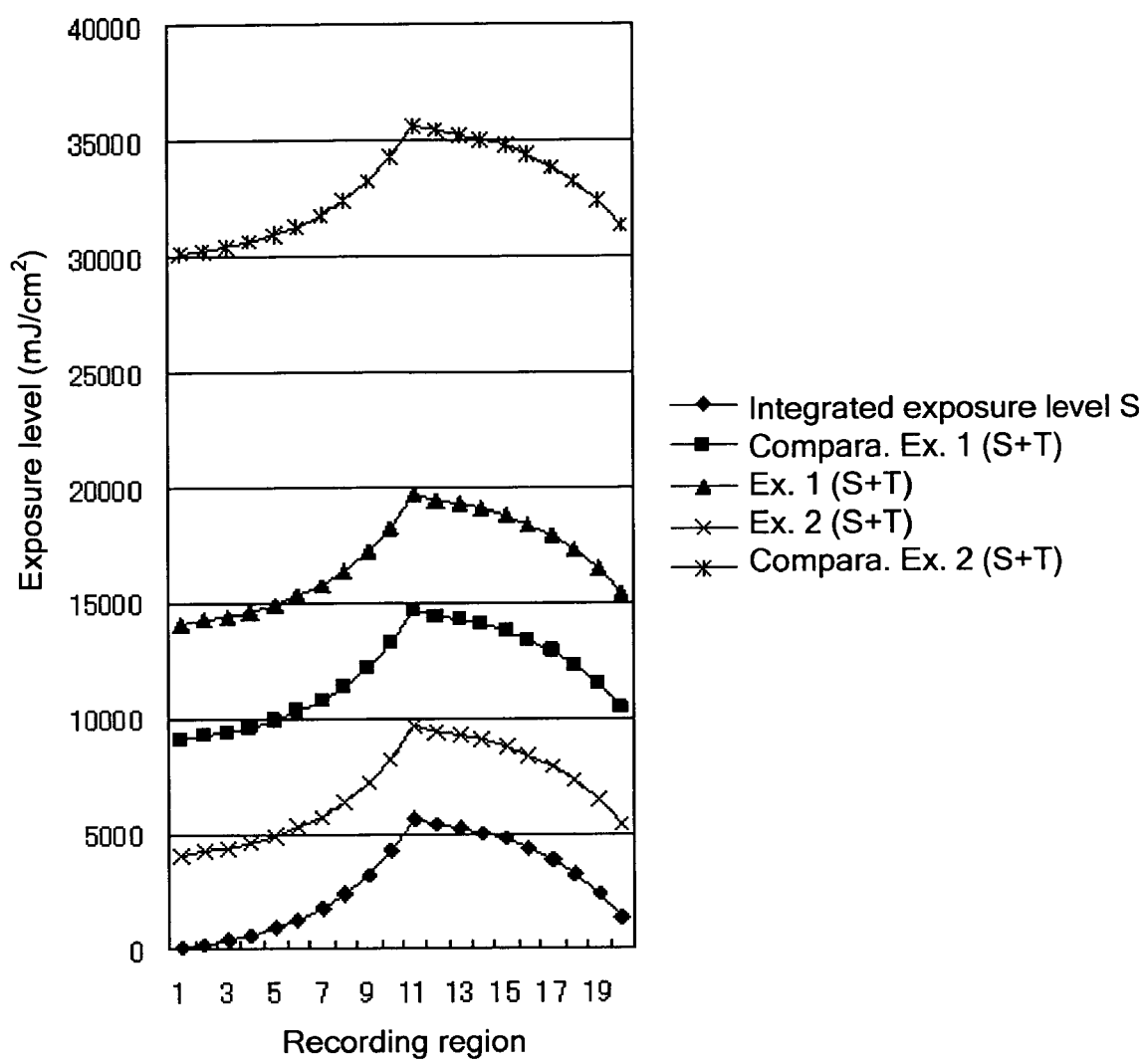
FIG. 30 is a graph showing the relationship between the recording region and exposure level in Examples 1 and 2 and Comparative Examples 1 and 2.

Using an optical information recording apparatus that employs the collinear technology as shown in FIGS. 17 and 18, the shift-multiplexing recording operation (10-fold multiplexing recording) was performed for the obtained optical information recording medium, with the maximum exposure level M being 13,800 mJ/cm² and the minimum fixing exposure level 10,000 mJ/cm². The results are shown in Table 1 and FIG. 30. As shown in FIG. 30, since the number of multiplexing recording operations is as small as 10, the "first recorded portion" (i.e., recording regions 1 to 10) and last recorded portion (i.e., recording regions 11 to 20)—the part of the exposed region—are adjacent to each other. However, irradiating only the first recorded portion (recording regions 1 to 10) with a fixing beam on the basis of $S_{max}$ would be effective.

Information beam and reference beam: Ar laser (wavelength=532 nm)

Shift pitch in the shift-multiplexing recording operation: 20 μm

Maximum integrated exposure level $S_{max}$: 5,650 mJ/cm²

| | |
|---|---|
| Initial recording (recording regions 1 to 10): | 100 mJ/cm² |
| Second recording (first multiplexing recording; recording regions 2 to 11): | 130 mJ/cm² |
| Third recording (second multiplexing recording; recording regions 3 to 12): | 170 mJ/cm² |
| Fourth recording (third multiplexing recording; recording regions 4 to 13): | 220 mJ/cm² |
| Fifth recording (fourth multiplexing recording; recording regions 5 to 14): | 290 mJ/cm² |
| Sixth recording (fifth multiplexing recording; recording regions 6 to 15): | 370 mJ/cm² |
| Seventh recording (sixth multiplexing recording; recording regions 7 to 16): | 480 mJ/cm² |
| Eighth recording (seventh multiplexing recording; recording regions 8 to 17): | 630 mJ/cm² |
| Ninth recording (eighth multiplexing recording; recording regions 9 to 18): | 820 mJ/cm² |
| Tenth recording (ninth multiplexing recording; recording regions 10 to 19): | 1,060 mJ/cm² |
| Eleventh recording (tenth multiplexing recording; recording regions 11 to 20, last) | 1,380 mJ/cm² |

Fixation of Recorded Optical Information

Using an optical information recording apparatus that employs the collinear technology as shown in FIGS. 17 and 18, a fixing beam was applied onto the recording regions under the following conditions. The results are shown in Table 1.

After placing glass in the optical path, a fixing beam was applied using the same laser (wavelength=532 nm) at an exposure level satisfying the condition H<(S+T)<2H. The irradiation angle of the fixing beam was 0° (i.e., applied from the normal of the surface of the recording layer). The fixing beam was applied on the irradiation region for the information beam and reference beam, including a region within 1 μm of the periphery of that region. The fixing beam was applied within 10,000 seconds after end of the recording operations by means of the information beam and reference beam.

Example 2

Recording and fixing operations were performed in a similar manner described in Example 1 except that the exposure level T was changed from 9,000 mJ/cm² to 14,000 mJ/cm². The results are shown in Table 1 and FIG. 30.

Example 3

Recording and fixing operations were performed in a similar manner described in Example 1 except that the fixing beam was applied on the irradiation region for information beam and reference beam, including a region within 1 μm of the periphery thereof.

As a result, the light intensity of the fixing beam was reduced, increasing the irradiation time by 10%.

Example 4

Recording and fixing operations were performed in a similar manner described in Example 1 except that application of a fixing beam was conducted 170,000 seconds after the application of an information beam and reference beam.

As a result, the recording layer material deteriorated while the recording regions were left unfixed, reducing the signal intensity by about 10%.

Comparative Example 1

Recording and fixing operations were performed in a similar manner described in Example 1 except that the exposure level T was changed from 9,000 mJ/cm² to 4,000 mJ/cm². The results are shown in Table 1 and FIG. 30.

It resulted in poor fixing exposure operation, reducing the storage stability of the recorded information. The signal intensity was stable in Examples even at this exposure level by performing the exposure operation at 60° C. for 1 hour. In this Comparative Example 1, however, the signal intensity was reduced by 10% or more even when the exposure operation was performed under the same condition.

Comparative Example 2

Recording and fixing operations were performed in a similar manner described in Example 1 except that the exposure level T was changed from 9,000 mJ/cm² to 30,000 mJ/cm². The results are shown in Table 1 and FIG. 30.

It resulted in too high fixing exposure level, reducing the signal intensity by 10% compared with Example 1.

TABLE 1

| | Integrated exposure level S + Fixing exposure level T (mJ/cm$^2$) | Minimum exposure level (mJ/cm$^2$) | Shift pitch (μm) | Number of recording operation performed | Information beam and reference beam | | Fixing beam | |
|---|---|---|---|---|---|---|---|---|
| | | | | | Oscillation wavelength of beam (nm) | S (mJ/cm$^2$) | Oscillation wavelength of beam (nm) | T (mJ/cm$^2$) |
| Ex. 1 | 14,650 | 10,000 | 20 | 11 | 532 | 4,390 | 532 | 9,000 |
| Ex. 2 | 19,390 | 10,000 | 20 | 11 | 532 | 4,390 | 532 | 14,000 |
| Compara. Ex. 1 | 9,390 | 10,000 | 20 | 11 | 532 | 4,390 | 532 | 5,000 |
| Compara. Ex. 2 | 34,390 | 10,000 | 20 | 11 | 532 | 4,390 | 532 | 30,000 |

The optical information recording method, optical information recording apparatus and optical information recording medium of the present invention are excellent optical information recording method, optical information recording apparatus and optical information recording medium, which generate no excessively-exposed region, can sufficiently fix recorded information, and never reduce the sensitivity of non-recorded regions, by applying a fixing beam at an exposure level corresponding to that of a recording beam in the shift-multiplexing recording. The optical information recording method of the present invention is suitably used for high-density storage media, as well as for relatively thin, flat holograms for recording two-dimensional information and for volume holograms for recording much three-dimensional information such as stereoimages. In either case, the optical information recording method of the present invention can be suitably used for transmissive holograms or reflective holograms. In addition, the optical information recording method of the present invention can be widely used as a method for recording a variety of holograms—amplitude holograms, phase holograms, blazed holograms, complex amplitude holograms and so forth.

What is claimed is:

1. A method for recording optical information on an optical information recording medium, comprising:
applying a fixing beam onto at least a portion of an exposed region of a recording layer of the optical information recording medium, the recording layer recording information by holography, at an exposure level T (mJ/cm$^2$) that satisfies the condition H<(S+T)<2H (where S is an integrated exposure level (mJ/cm$^2$), which is the total of the exposure level in each predetermined region that constitutes the exposed region where an interference image has been recorded by irradiating the recording layer with an information beam and a reference beam, and H is a minimum fixing exposure level (mJ/cm$^2$) required to fix the interference image).

2. The recording method according to claim 1, wherein the fixing beam is applied onto at least the portion of the exposed region at an exposure level that satisfies the condition H<(S+T)<1.5H.

3. The recording method according to claim 1, wherein the minimum fixing exposure level H is 10 mJ/cm$^2$ to 1,000,000 mJ/cm$^2$.

4. The recording method according to claim 1, wherein recording on the recording layer is conducted by means of shift-multiplexing recording in which interference images are multiply overlaid on one another while shifting the information beam and reference beam and the recording layer in the planar direction of the recording layer in a relative manner.

5. The recording method according to claim 1, wherein the wavelength of the fixing beam is 350 nm to 850 nm.

6. The recording method according to claim 1, wherein the fixing beam is applied on almost the same region where the information beam and reference beam are applied for the recording of information, or on the region in question including a region within 1 μm of the periphery thereof.

7. The recording method according to claim 1, wherein the fixing beam is applied within 100,000 s after the application of the information beam and reference beam.

8. The recording method according to claim 1, wherein the irradiation time of the fixing beam is 1 ns to 100 ms.

9. The recording method according to claim 1, wherein the angle formed by the normal of the surface of the recording layer and the fixing beam is 0° to 60°.

10. The recording method according to claim 1, wherein the recording layer comprises a photosensitive resin and a binder,
wherein the content of the binder in the solid components of the recording layer is 10% by mass to 95% by mass.

11. The recording method according to claim 1, wherein the optical information recording medium comprises a first substrate, the recording layer disposed on the first substrate, a filter layer disposed on the recording layer, and a second substrate disposed on the filter layer.

12. The recording method according to claim 1, wherein the optical information recording medium is a reflective hologram.

13. The recording method according to claim 1, wherein the application of the information beam and reference beam is performed with the optical axis of the information beam being collinear with the optical axis of the reference beam.

14. An optical information recording apparatus for an optical information recording medium, comprising:
a fixing beam application unit configured to apply a fixing beam onto at least a portion of an exposed region of a recording layer of the optical information recording medium, the recording layer recording information by holography, at an exposure level T (mJ/cm$^2$) that satisfies the condition H<(S+T)<2H (where S is an integrated exposure level (mJ/cm$^2$), which is the total of the exposure level in each predetermined region that constitutes the exposed region where an interference image has been recorded by irradiating the recording layer with an information beam and a reference beam, and H is a minimum fixing exposure level (mJ/cm$^2$) required to fix the interference image).

15. An optical information recording medium, comprising:
an interference image recorded by means of a method for recording optical information on an optical information recording,
wherein the method comprises:
applying a fixing beam onto at least a portion of an exposed region of a recording layer of the optical information recording medium, the recording layer recording information by holography, at an exposure level T (mJ/cm$^2$) that satisfies the condition H<(S+T)<2H (where S is an integrated exposure level (mJ/cm$^2$), which is the total of the exposure level in each predetermined region that constitutes the exposed region where an interference image has been recorded by irradiating the recording layer with an information beam and a reference beam, and H is a minimum fixing exposure level (mJ/cm$^2$) required to fix the interference image).

16. A method for reproducing optical information, comprising:
applying a reference beam onto an interference image to reproduce recorded information corresponding to the interference image,
wherein the interference image is formed in a recording layer by means of a method for recording optical information on an optical information recording medium having a recording layer recording information by holography,
wherein the method comprises:
applying a fixing beam onto at least a portion of an exposed region of the recording layer at an exposure level T (mJ/cm$^2$) that satisfies the condition H<(S+T)<2H (where S is an integrated exposure level (mJ/cm$^2$), which is the total of the exposure level in each predetermined region that constitutes the exposed region where an interference image has been recorded by irradiating the recording layer with an information beam and a reference beam, and H is a minimum fixing exposure level (mJ/cm$^2$) required to fix the interference image).

17. The method for reproducing optical information according to claim 16, wherein the reference beam is applied onto the interference image at the same angle as the reference beam used for the recording of the interference image on an optical information recording medium to thereby reproduce recorded information.

* * * * *